(12) United States Patent
Hisamoto et al.

(10) Patent No.: US 8,030,668 B2
(45) Date of Patent: Oct. 4, 2011

(54) SEMICONDUCTOR LED, OPTO-ELECTRONIC INTEGRATED CIRCUITS (OEIC), AND METHOD OF FABRICATING OEIC

(75) Inventors: Digh Hisamoto, Kokubunji (JP); Shinichi Saito, Kawasaki (JP); Shinichiro Kimura, Kunitachi (JP)

(73) Assignee: Hitachi, Ltd., Tokyo (JP)

( * ) Notice: Subject to any disclaimer, the term of this patent is extended or adjusted under 35 U.S.C. 154(b) by 784 days.

(21) Appl. No.: 11/935,904

(22) Filed: Nov. 6, 2007

(65) Prior Publication Data

US 2008/0197362 A1   Aug. 21, 2008

(30) Foreign Application Priority Data

Feb. 16, 2007   (JP) ................................. 2007-036328

(51) Int. Cl.
*H01L 27/15* (2006.01)
(52) U.S. Cl. ............... 257/86; 257/E27.12; 257/E33.005
(58) Field of Classification Search .................... 257/86, 257/E27.12, E33.005
See application file for complete search history.

(56) References Cited

U.S. PATENT DOCUMENTS 5,466,948 A * 11/1995 Worley .............................. 257/3
6,295,390 B1 * 9/2001 Kobayashi et al. ............ 382/313
6,868,214 B1   3/2005 Sakata et al.

OTHER PUBLICATIONS

"Visible Electro-luminesence from Porous NP Heterojunction Diodes", Namavar et al., Applied Physics Letters, vol. 60, No. 20, May 1992.*
R. Chan et al., "Collector current map of gain and stimulated recombination on the base quantum well transitions of a transistor laser, Applied Physics Letters," vol. 88, 2006, pp. 143508-1 to 143508-3.
L. T. Canham, "Silicon quantum wire array fabrication by electrochemical and chemical dissolution of wafers," Applied Physics Letters, vol. 57, 1990, pp. 1046-1048.
S. Coffa et al., "High efficiency and fast modulation of Er-doped light emitting Si diodes," Applied Physics Letters, vol. 69, 1996, pp. 2077-2079.
F. Iacona et al, "Silicon nanocrystals and $Er^{3+}$ ions in an optical microcavity," Journal of Applied Physics, vol. 89, 2001, pp. 8354-8356.
S. Coffa, "Light from Silicon, IEEE Spectrum," Oct. 2005, pp. 44-49.

* cited by examiner

*Primary Examiner* — Matthew Landau
*Assistant Examiner* — Sonya McCall Shepard
(74) *Attorney, Agent, or Firm* — Miles & Stockbridge P.C.

(57) ABSTRACT

A light emitting diode demonstrating high luminescence efficiency and comprising a Group IV semiconductor such as silicon or germanium equivalent thereto as a basic component formed on a silicon substrate by a prior art silicon process, and a fabricating method of waveguide thereof are provided. The light emitting diode of the invention comprises a first electrode for implanting electrons, a second electrode for implanting holes, and a light emitting section electrically connected to the first and the second electrode, wherein the light emitting section is made out of single crystalline silicon and has a first surface and a second surface facing the first surface, wherein with respect to plane orientation (100) of the first and second surfaces, the light emitting section crossing at right angles to the first and second surfaces is made thinner, and wherein a material having a high refractive index is arranged around the thin film section.

13 Claims, 83 Drawing Sheets

FIG.6D-a
FIG.6D-b
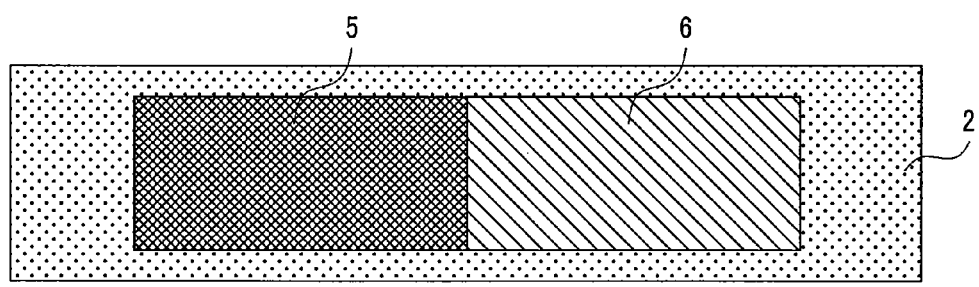
FIG.6E
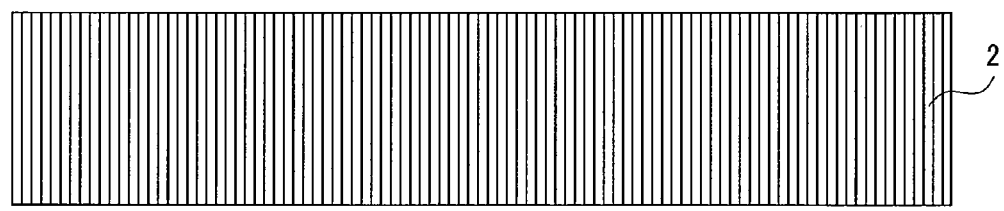
FIG.6F
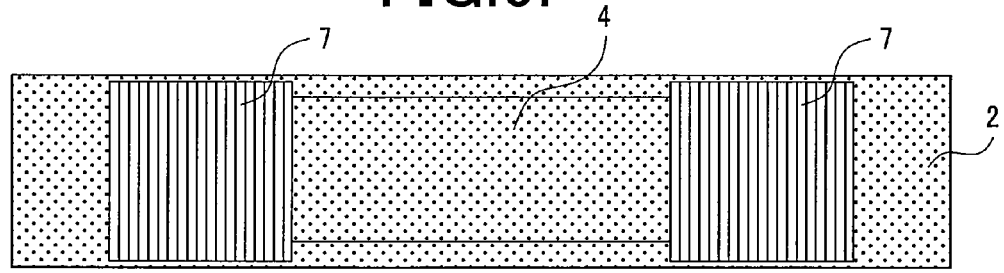

SEMICONDUCTOR LED, OPTO-ELECTRONIC INTEGRATED CIRCUITS (OEIC), AND METHOD OF FABRICATING OEIC

CLAIM OF PRIORITY

The present application claims priority from Japanese application JP2007-036328, filed on Feb. 16, 2007, the content of which is hereby incorporated by reference into this application.

BACKGROUND OF THE INVENTION

1. Field of the Invention

The present invention relates to a semiconductor light emitting diode (LED), an opto-electronic integrated circuit (OEIC), and a method of fabricating the OEIC; and, more particularly, to an integrated semiconductor, which is in a mixed arrangement with a semiconductor integrated circuit performing an electric signal processing and which integrates a high-brightness LED, a phototransistor capable of controlling optical output power/wavelength with a gate voltage, a silicon laser element, a light receiving element, and a waveguide, and methods of fabricating them.

2. Description of the Related Arts

Optical communications are used in broadband networks supporting the Internet industry. Optical transmission and receiving in the optical communications are made possible by employing Group III-V or Group II-VI compound semiconductor lasers.

Although diverse structures have been suggested for compound semiconductor lasers, a double hetero structure is mostly used. In the double hetero structure, two different kinds of compound semiconductors are joined together by fitting a compound semiconductor with a small band gap into a compound semiconductor with a large band gap. In order to form the double hetero structure, a conductive n-type compound semiconductor, a non-doped i-type compound semiconductor, and a p-type compound semiconductor are sequentially epitaxially grown and laminated in a vertical direction on a substrate. It is then necessary to notice a band structure of the non-doped i-type compound semiconductor sandwiched in between the other two compound semiconductors as it is important that the i-type compound semiconductor has a smaller band gap than the n-type and p-type compound semiconductors, a lower conduction band level than the n-type, and a higher valence band level than the p-type. That is, electrons and holes are confined together in the i-type region. Because electrons and holes are likely to be in the same region, it is highly possible that electrons and holes collide with each other and cause pair annihilation, thereby increasing luminescence efficiency. Moreover, because refractive index tends to increase as the band gap gets smaller, light can also be confined within the i-type compound semiconductor by selecting a material having a refractive index of the i-type compound semiconductor lower than a refractive index of the n-type or p-type compound semiconductor. This confined light efficiently induces or promotes recombination of electrons and holes causing a population inversion, which in turn leads to laser oscillation.

With enhancements in optical communications using an efficient light-emitting compound semiconductor, long distance instantaneous information communications are realized in large quantities. Namely, information processing or saving is carried out on an LSI having a silicon backbone, and information transmission is carried out by a laser having a compound semiconductor used as the backbone.

If silicon can be illuminated at high efficiency, then it is very industrially worthwhile because an electronic device and an LED can be integrated together on a silicon chip. To keep abreast with it, researches on the illumination of silicon have expanded and are in progress.

However, it is difficult to illuminate silicon at high efficiency because silicon has an indirect transition type band structure. In the indirect transition type band structure, either a value of momentum at the lowest conduction band energy or a value of momentum at the lowest valence band energy is not zero. In case of silicon, the lowest energy point of the valence band is a point G where a value of momentum is 0, while the lowest energy point of the conduction band is not the point G but exists between the points G and X. To be more specific, suppose $k_0=0.85*p/a$, where 'a' is a lattice constant. Then, it degenerates to 6 points of $(0,0,\pm k_0)$, $(0,\pm k_0,0)$, $(\pm k_0,0,0)$, as shown in FIG. 1A.

Meanwhile, most of compound semiconductors are called direct transition type semiconductors because the conduction band and the valence band respectively have the lowest energy at the point G.

Next, the following will explain why luminescence efficiency is bad in an indirect transition type semiconductor and why luminescence efficiency is good in a direct transition type semiconductor.

As described earlier, in order to illuminate a semiconductor element, electrons and holes collide with each other and are annihilated, and an energy difference of both has to be emitted as a photon or light. At this time, both the energy conservation law and the momentum conservation law must be satisfied. An electron has energy levels within the conduction band, while a hole has energy levels for electronless regions within the valence band. A difference between them becomes light energy. As the wavelengths of light vary depending on energy, an energy difference between the conduction band and the valence band, i.e., the band gap size, determines the wavelength of light, i.e., color. Viewed in this light, there is not much difficulty in the law of energy conservation being satisfied.

Meanwhile, since a collision between electrons and holes is involved in light emission, it is also crucial that momentum is conserved. According to the quantum mechanics that rules the microscopic world, electrons, holes, and photons are not only wavelengths but also elastically scattering particles, so the law of momentum conversation is satisfied. Momentum is a physical quantity which measures how much force is input to make particles fly away from the site of collision. From the perspective of the dispersion relation of light ($\omega=ck$, where $\omega$ is an angular frequency, c is a high velocity, and k is momentum of a photon) or the light energy, one can guess that the momentum of a photon during crystallization is almost zero. This means that light collisions may cause a substance to fly away, their impact on the scattering of the substance is very little, which perfectly coincides with our instincts.

On the other hand, a hole has nearly no momentum because its lowest energy point is also at the point G. However, in case of silicon which is an indirect transition type semiconductor, electrons hardly exist at the point G but at the lowest energy point around X. Thus, silicon has a momentum as large as $k_0=0.85*p/a$.

To be short, as far as silicon is concerned, it is impossible to satisfy the momentum conservation law as well as the energy conservation law simply during the electron-hole collisions. Therefore, a phonon which is an oscillating quantum of a photon in crystals was absorbed or emitted to convert only electron-hole pairs into light, trying to satisfy both the momentum and energy conservation laws by any means. Although we are not to imply this mechanism or process does not exist physically, its probability of occurrence is still slim because electrons, holes, photons, and phonons in silicon exhibit a high-dimensional scattering where they collide with each other at the same time. This is primarily why silicon, the indirect transition type semiconductor, is reported to show very poor luminescence efficiency.

On the contrary, a lowest energy point of the conduction band and a lowest energy point of the valence band for most direct transition type compound semiconductors are found at the point G, so the law of momentum conservation and the law of energy conservation are satisfied at the same time. Therefore, luminescence efficiency in compound semiconductors is high indeed.

There has been reported about a transistor laser diode which drives laser in use of a compound semiconductor with a high luminescence efficiency by a bipolar transistor made out of a compound semiconductor (see R. Chan, M. Feng, N. Holonyak, Jr., A. James, and G. Walter, "Applied Physics Letters", vol. 88, pp. 143508-1-143508-3, 2006).

As mentioned before, even though silicon in the bulk state shows very poor luminescence efficiency, it is also known that the luminescence efficiency increases if silicon is made to a porous state or to nano-sized particles. For example, there is a report that when silicon having been anodized in a hydrofluoric acid solution becomes porous, it emits light at room temperature and in the visible wavelength band (see L. T. Canham, "Applied Physics Letters", vol. 57, pp. 1046-1048, 1990). The mechanism involved here is not perfectly explained, but many acknowledge the possible importance of the quantum size effect to allow porous silicon to be trapped in a narrow region. Generally, inside a small size silicon, electrons are confined in their regions and do not have a definite amount of momentum, according to the uncertainty principle in quantum mechanics. It is considered that this causes electrons and holes to recombine very easily.

As another way of using silicon, light emitting diode acting as a luminescent element can be fabricated by implanting Er ions during pn junction formed on a Si substrate (see, for example, S. Coffa, G. Franzo, and Priolo, "Applied Physics Letters", vol. 69, pp. 2077-2079, 1996). When Er ions are implanted into the Si substrate, it creates an impurity orbit which is a spatially localized state. Therefore, if electrons within the conduction band of Si are captured into the impurity orbit, it is possible that their momentums practically become zero and recombine with holes within the valence band to emit light. Since the light emission in result of Er-ion implantation is of a 1.54 μm wavelength, light is likely to propagate without being adsorbed by surrounding silicon. Moreover, this also is a wavelength featuring a low energy loss when a prior art optical fiber is utilized. Therefore, even when technical advances in future may bring a new age of Si-based LEDs using Er ions, many suspect that investment in large-scale facilities will not be necessary because any existing optical network can be employed as it is.

Still another way of using silicon is combining the quantum size effect and the idea of Er-ion for implantation of Er ions into silicon nano-particles, so as to be able to increase luminescence efficiency (see, for example, F.Iacona, G. Franzo, E. C., Moreira, and F. Priolo, "Journal of Applied Physics", vol. 89, pp. 8354-8356, 2001, or S. Coffa, "IEEE Spectrum", pp. 44-49, October 2005).

It was a customarily accepted belief about a prior art technique for illuminating silicon that silicon should be put in the porous state or made in nano-size particles according to the quantum size effect, in order to change the structure of a silicon conduction band to the bulk band structure and to lower the momentum from the point $k_0$ according to the uncertainty principle. However, there is a problem that the surface of a nano-sized silicon particle for example is much more likely to be oxidized and silicon dioxide is produced on the surface. As silicon oxide is an insulator with a very large band gap, the silicon dioxide film formed on the surface consequently makes it difficult to efficiently implant electrons or holes. Therefore, although the prior art silicon light emitting diode may be very high in photoluminescence intensity, it certainly is very low in electroluminescence efficiency. In addition, crystallinity of material used for an emissive layer becomes important for light emission, but unlike single crystalline silicon, silicon nano particles obtained by chemical vapor deposition (CVD) or porous silicon having plural irregular pores formed on the surface due to anode oxidation might suffer deterioration in crystallinity. In effect, poor crystallinity may cause light emission through a defect level. However, the light emission using a defect shows poor efficiency, consequently making it unable to fabricate any device that can put itself to a practical use like information communications.

As mentioned before, a variety of approaches have been made to illuminate silicon by porous silicon or nano-size silicon particles or Er doping, but luminescence efficiency has not yet reached a level for practical applications.

In the meantime, as inventors we came to discover that a light emitting diode featuring high luminescence efficiency can easily be formed, through a prior art silicon process, over a Si substrate, the light emitting diode comprising a first electrode for electrons, a second electrode for holes, and a light emitting section electrically connected to the first and the second electrode, wherein the light emitting section is made out of single crystalline silicon and has a first surface (upper surface) and a second surface (lower surface) facing the first surface, and wherein with respect to (100) plane of the first and second surfaces, the light emitting section crossing at right angles to the first and second surfaces is made thinner. First of all, illumination principles and verification results thereof are provided, followed by objects of the present invention for practical applications.

A principle for efficiently illuminating a Group IV semiconductor such as silicon or germanium equivalent thereto will be explained with reference to accompanying drawings.

Wave function $\psi(r)$ indicating electronic states in crystals of silicon and the like can be expressed in the following equation 1 as a best approximation.

$$\psi(r)=\Phi_{k_0}(r)\xi(r) \quad \text{Equation 1}$$

Here, $k_0$ is a momentum that gives a band valley in a conduction band, $r=(x,y,z)$ indicates a position in space, $\Phi_{k_0}(r)$ gives Bloch's relation in a band valley of the conduction band, and $\xi(r)$ is an envelope function. Further, $\Phi_{k_0}(r)$ can be expressed in Equation 2 in terms of a periodic function $u_{k_0}(r+a)=u_{k_0}(r)$ reflecting periodicity against a unit lattice vector (a) in crystals.

$$\Phi_{k_0}(r)=u_{k_0}(r)e^{ik_0 \cdot r} \quad \text{Equation 2}$$

As is evident, it is an atom-scale distance function, highly oscillating. Meanwhile, the envelope function $\xi(r)$ describes slowly-varying components in atom scale, and indicates a response to the physical configuration of a semiconductor or externally applied electric fields. Assuming, including the case of $\psi(r)$ as a wave function in semiconductor structures not necessarily having bulk crystals but finite sizes, a satisfactory formulation of ξ(r) can be induced as follows Equation 3.

$$[\epsilon(k_0 - i\nabla) + V(r)]\xi(r) = E\xi(r)$$ Equation 3

Here, $\epsilon = \epsilon(k)$ indicates a band structure in a bulk of conduction band electrons having the momentum k, in which a sum of a differential operator $-i\nabla$ and a momentum $k_0$ are substituted for the momentum k, i.e., $\epsilon(k_0 - i\nabla)$. In addition, $V=V(r)$ indicates a potential an electron feels. For instance, if an insulator or a different kind of semiconductor comes in contact with the boundary of a given semiconductor, a potential barrier is made and an electric field is applied by external electric field effects to control a value of $V=V(r)$. For simplicity of description, only changes in z-direction of V are discussed.

For a better understanding, suppose that there is a silicon film formed on a designated plane 100 for a semiconductor. As described before, in a bulk it has a band structure similar to one shown in FIG. 1A, so the valley in a conduction band existing in $k_z$ direction $(0,0,\pm k_0)$ is approximate to Equation 4.

$$\varepsilon(k) = \frac{\hbar^2}{2m_t^*}(k_x^2 + k_y^2) + \frac{\hbar^2}{2m_l^*}(k_z \mp k_0)^2$$ Equation 4

Here, $m^*_t$ and $m^*_l$ are effective masses in silicon crystals obtained respectively from a curvature in a direction of the long axis and the short axis for a conduction band valley having a rotary ellipse shape.

Also, Equation 3 may be substituted into Equation 4 to get Equation 5.

$$\left[-\frac{\hbar^2}{2m_t^*}(\partial_x^2 + \partial_y^2) - \frac{\hbar^2}{2m_l^*}\partial_z^2 + V(r)\right]\xi(r) = E\xi(r)$$ Equation 5

By applying the envelope function to Equation 6, Equation 5 can be written in the form Equation 7, provided that (x,y) denotes a direction parallel to the (100) plane, W is a width, and L is a length.

$$\xi(r) = \frac{e^{i(k_x x + k_x y)}}{\sqrt{LW}}\chi(z)$$ Equation 6

$$\left[-\frac{\hbar^2}{2m_l^*}\partial_z^2 + V(z)\right]\chi(z) = \Delta E \chi(z)$$ Equation 7

Here, $\Delta E$ is energy in the z-direction, and all electron energies measured from the bottom of a conduction band can be expressed in Equation 8.

$$E = \frac{\hbar^2 k_x^2}{2m_t^*} + \frac{\hbar^2 k_y^2}{2m_t^*} + \Delta E$$ Equation 8

First of all, it is confirmed that Equation 7 reproduces bulk electronic states. To this end, an answer in continuous state when V(r)=0 may be obtained. This can be confirmed in that with a thickness t as the z-direction, an envelope wave function is then written as shown in Equation 9, and $\Delta E$ is as expressed in Equation 10.

$$\chi(z) = \frac{1}{\sqrt{t}} e^{ik_z z}$$ Equation 9

$$\Delta E = \frac{\hbar^2 (k_z \mp k_0)^2}{2m_l^*}$$ Equation 10

That is, the wave function oscillates severely in a continuously spread state over the entire bulk crystals. At this time, a quantum mechanical expected value of the momentum in the z-direction naturally becomes Equation 11, $k_z$ being a momentum operator in the z-direction.

$$\langle \hat{k}_z \rangle = \int d^3 r \psi^*(r)(-i\partial_z)\psi(r)$$
$$= k_z \pm k_0$$ Equation 11

As is clear from the equation, in an indirect transition type semiconductor such as silicon, the probability of electrons being far away from the point G in momentum space is overwhelmingly high, which means that electrons move with great momentum.

The present invention is based on facts that if an ultra-thin film having a thickness 't' in the z-direction, the fact that a direct transition type semiconductor in a bulk changes practically into a direct transition type semiconductor by quantum confined effects is used as a basic principle. More details are followed.

For a better understanding, suppose that silicon has a very small thickness 't' in the z-direction and an insulator made out of $SiO_2$ for example with a large band gap is nearby on the top and bottom along the z-direction to be in contact with vacuum of a great energy barrier or the air. The same effects can be expected by trapping electrons in a narrow area under the influence of the electric field effect for example. In these cases, the wave function of electrons in silicon becomes zero on a vertical interface of the z-direction. Although technically there is always a possibility that effusion of the quantum mechanic wave function exists, because a large energy barrier reduces the effusion exponentially with respect to the distance in the z-direction, the assumption that wave function of electrons in silicon becomes zero on the interface is almost correct in the strict sense. Therefore, even if an externally applied potential is V(r)=0, protons in the envelop function are completely different from a case where 't' is large. In effect, an envelope wave function for quantum-confined electrons and holes can be explained in Equation 12 if n indicating an exponent indicating a discrete energy level is an even number (n=0,2,4, . . . ), while expressed in Equation 14 if n is an odd number (n=1,3, 5 . . . ) regardless of whether the value of an energy level is an even number of an add number.

$$\chi_n(z) = \sqrt{\frac{2}{t}} \cos\left(\pi\frac{z}{t}(n+1)\right)$$ Equation 12

$$\chi_n(z) = \sqrt{\frac{2}{t}} \sin\left(\pi\frac{z}{t}(n+1)\right)$$ Equation 13

$$\Delta E = \frac{\hbar^2}{2m_l^*}\frac{\pi^2}{t^2}(n+1)^2$$ Equation 14

Needless to say, the energy level is the lowest when n=0. To plot an envelope wave function, the origin of the z-axis was set up as a center of thin film silicon and it was assumed that there existed an interface having an energy barrier of z=±t/2. Before getting into further details, the nature of the envelope wave function $X_n(z)$ will be explained first. In case n is zero or an even number, the wave function becomes symmetric with respect to symbol changes in z, i.e., $X_n(z)=X_n(-z)$. In this example, it is said that the parity is even. On the other hand, in case n is an odd number, the wave function behaves as $X_n(z)= -X_n(-z)$. In this example, it is said that the parity is odd.

Because of this symmetric structure, the evaluation of the envelope wave function's contribution to momentum yields Equation 15 below.

$$\langle \chi_n | \hat{k}_z | \chi_n \rangle = \int dz \chi_n^*(z)(-i\partial_z)\chi_n(z) = 0 \qquad \text{Equation 15}$$

This shows a well-known nature that if $X_n(z)$ is differentiated with respect to the z-direction, the original parity of $X_n(z)$ is changed, so it becomes zero when integrated with respect to the z-direction. After all, since electrons are strongly trapped along the z-direction, the envelope wave function becomes a standing wave where electrons do not move at all. This is totally contradictory to Equation 9 where the envelope wave function is an exponential function in the silicon bulk state and electrons move the entire bulk crystals with great momentum. One thing to be careful, though, is that all wave functions having taken Bloch functions into consideration are built up by substituting Equation 2, Equation 6 and Equation 13 or Equation 14 into Equation 1, so quantum mechanical expected values of momentum in the z-direction yield Equation 16.

$$\langle \hat{k}_z \rangle = \int d^3 r \psi^*(r)(-i\partial_z)\psi(r) = \pm k_0 \qquad \text{Equation 16}$$

Namely, if an original semiconductor material is in bulk, the valley of a conduction band is not found at the point G but as $(0,0,\pm k_0)$, so the wave function overall reflects this nature. That is, although electrons seem to be able to move with momentum $\pm k_0$ even in a thin-film semiconductor material, one should be careful to draw hasty conclusions. For example, in case a material is inversely symmetric in crystals like silicon, the valley $(0,0,+k_0)$ and the valley $(0,0,-k_0)$ are energically equivalent and degenerated. As in this example, when a quantum mechanical state having a degenerated energy level in general is confined to the spatially same area, hybridization occurs between these states. In other words, if there is an energy bond connecting the valley $(0,0,+k_0)$ and the valley $(0,0,-k_0)$ even for an instant, two discrete levels form a bound orbit and a non-bound orbit. For example, the Coulomb interaction between electrons (this has not been much included in band calculation) works rather strongly between electrons trapped in a narrow area. The interactions between electrons are called an electron correlation and known to cause serious problems including many transit metal oxides such as a high-temperature superconductor. However, this reflects that, in the bulk silicon, sp orbit of an original silicon atom is big, and this fortunately has not caused any serious problems so far. However, when electrons are trapped in a very narrow area where quantum mechanic effects play a crucial role, the Coulomb interaction becomes so strong that it cannot be ignored. Meanwhile, if elements of a Hamiltonian matrix are to be calculated taking the Coulomb interaction into consideration, hybridization occurs in connection between the valley $(0,0,+k_0)$ and the valley $(0,0,-k_0)$. And, diagonalization of the Hamiltonian matrix exhibits the formation of split orbits, i.e., a bound orbit and a non-bound orbit. This is similar to a H-atom formation process from two adjacent hydrogen atoms, and evaluation methods on this have been available for about 70 years since the quantum mechanics was established by Heitler-London. In the meantime, we first discovered the formation of a bound state understood by Heitler-London is also important for intervalley bonding especially when Group IV semiconductors such as silicon are confined in a narrow area. Moreover, even though no such energy bond existed at all, it was still possible to produce, through a unitary conversion between two states, a standing wave where electrons do not move in the z-axis direction. The following will provide more details on this.

A Bloch state has a property of $U_{-k0}(r)=U_{k0}(r)$ due to inversely symmetric crystals, so the Bloch wave function for the valley $(0,0,+k_0)$ and the valley $(0,0,-k_0)$ can be expressed as $\Phi_{k0}(r)=u_{k0}(r)e^{ik0z}$ and $\Phi-k_0(r)=uk_0(r)e^{-ik0z}$, respectively. Therefore, the $e^{\pm ik0z}$ is a part that is going to require attention. For the formation of a new base state using the sum and difference of those wave functions, conversion to Equation 17 preferably takes place based on the unitary conversion U.

$$U\begin{pmatrix} e^{ik_0z} \\ e^{-ik_0z} \end{pmatrix} = \frac{1}{\sqrt{2}}\begin{pmatrix} 1 & 1 \\ -i & i \end{pmatrix}\begin{pmatrix} e^{ik_0z} \\ e^{-ik_0z} \end{pmatrix} \qquad \text{Equation 17}$$

$$= \sqrt{2}\begin{pmatrix} \cos(k_0z) \\ \sin(k_0z) \end{pmatrix}$$

Thus, one may learn that a change in the wave function for atomic levels can be expressed in terms of a wave function of two standing waves, i.e., $2^{1/2}u_{k0}(r)\cos(k_0z)$ and $2^{1/2}u_{k0}(r)\sin(k_0z)$. And, the entire wave function can be arranged as follows:

$$\psi(r)=\sqrt{2}u_{k_0}(r)\cos(k_0z)\xi(z) \qquad \text{Equation 18}$$

$$\psi(r)=\sqrt{2}u_{k_0}(r)\sin(k_0z)\xi(z)| \qquad \text{Equation 19}$$

Reflecting a fact that an expected value of momentum in the z-axis direction is a standing value yields another equation below.

$$\langle \hat{k}_2 \rangle = \int d\,z\psi^*(z)(-i\partial_z)\psi(r) = 0 \qquad \text{Equation 20}$$

Therefore, it is clear that electrons do not move towards the z-axis direction at all. Meanwhile, one should be careful not to misunderstand that an expected value of momentum seems to vary simply by changing the base. In fact, base wave functions like Equation 18 and Equation 19 do not necessarily show intrinsic momentum. That is, matrix elements of a momentum operator may be rearranged as in Equation 21 out of Equation 18 and Equation 19, in which diagonal matrix elements become zero and non-diagonal matrix elements are pure imaginary numbers.

$$U\begin{pmatrix} k_0 & 0 \\ 0 & -k_0 \end{pmatrix} U^{-1} = \begin{pmatrix} 0 & ik_0 \\ -ik_0 & 0 \end{pmatrix}\bigg| \quad \text{Equation 21}$$

Whether it is physically appropriate for taking such a base is determined entirely depending on the properties of a target material. Although we assume a very thin single crystalline silicon film which is hardly translation symmetric in the z-axis direction, it is better to take the form of standing waves such as $v2u_{k0}(r)\cos(k_0 z)$ or $v2u_{k0}(r)\sin(k_0 z)$, instead of taking the intrinsic state of momentum such as $uk_0(r)e^{\pm ik0z}$. When bulk silicon is involved, however, $uk_0(r)e^{\pm ik0z}$ is preferably taken because the bulk silicon is translation symmetric. Moreover, in the bulk state, electrons having momentum $\pm k_0$ move very actively inside crystals. At this time, the electrons are strongly scattered by phonons which are oscillating quantum of photons in crystals, and phase of the wave function changes dynamically, so one cannot possibly expect to form the momentum $+k_0$ and the momentum $-k_0$ in a coherent state. On the contrary, a wave function that is sufficiently determined even at room temperature can form a standing wave with fixed phase if a very thin single crystalline silicon film for example where electrons are trapped in an extremely narrow area even thinner than a mean free path 1 controlling a scattering length is employed. In a quantitative sense, it means that a standing wave with a perfect matching or compatible size with the narrow area can be formed while an electron wave moves forwards and backwards at high speed in that narrow area.

As explained so far with reference to simple equations, if electrons are confined in an extremely narrow area as in a very thin single crystalline silicon film, electrons in the bulk state or electrons contained in a material, e.g., silicon, having no electrons of a conduction band at the point G do not move in the vertical direction of the thin film. Again, in the quantitative sense, this means that there is no vertical direction for the thin film, so it is rather natural that the vertical motion of electrons on the thin film is absent. In short, although electrons may have been moving at high speed inside crystals in the bulk state, they come to stop on the thin film because there is eventually going to be no direction for them to move along.

This phenomenon is depicted in a band diagram shown in FIG. 1B. Because no movement can be made towards the z-axis direction, the band structure of bulk shown in FIG. 1A is projected on the plane $k_2=0$, while a band structure shown in FIG. 1B is formed by the application of a thin film or electric field effects. The band structure similar to one shown in FIG. 1B is essential for designing a field effect transistor in use of silicon and a basis of device physics. This two-dimensionally trapped material is called a two-dimensional electric or magnetic field. Further, a one-dimensional electric or magnetic field can also be generated if a cell structure, not the thin film, is employed.

Assuming that the band structure shown in FIG. 1B is used, bulk electrons having been at the valley $(0,0,\pm k_0)$ of FIG. 1A are now found at the point G in FIG. 1B. Therefore, electrons in this state do not move in the z-axis direction.

Returning to the basic of device physics, the inventors reached a concept that electrons existing at the point G in FIG. 1B recombine with holes efficiently and can be used as a light emitting diode. Therefore, since confined electrons are not free to move around, when they collide with small holes with low momentum existing at the point G, light with low momentum are emitted, without violating both the energy conservation law and the momentum conservation law. As mentioned before, momentum is a measure of how much impact is required for scattering a particle upon a particle colliding with another particle. As inventors, we entrapped electrons into a narrow area to immobilize them and observed that the electrons lose momentum in such state. When the momentum of an electron decreases, the momentum conservation law during scattering is satisfied (this was difficult to achieve by prior art techniques), enabling even Group IV such as silicon semiconductors to efficiently emit light.

Based on this concept, a very thin Si film cut into 1 cm×1 cm size was actually formed on a portion of a substrate, and its photoluminescence measurement results are shown in FIGS. 2, 3 and 4B. Particularly, FIG. 2 and FIG. 4B show luminescence intensities as a result of photoluminescence. As is seen from the results, a very strong enhancement in the luminescence intensity is observed in the very thin Si film. This intensity, compared with the luminescence by an indirect transition type bulk silicon semiconductor, is higher by several figures. From this, we came to believe that those trapped electrons in a narrow area make Group IV such as silicon semiconductors change into a direct transition type. FIG. 3 shows a peak wavelength of the spectrum obtained by this experiment. This confirms that a bigger wavelength is obtained as much as an energy level being displayed in form of silicon band gap (Equation 4). This implies that the more energy scatters, the greater the band gap, conforming to the principle of the quantum confined effect explained above. Changes in wavelength excitation in result of increased band gaps are shown in FIG. 4A. As described above, silicon can be illuminated at high efficiency by using the plane 100 as a surface, making the silicon film thinner, and practically setting the point G as a valley of energy.

Next, we performed verification experiments on electroluminescence by fabricating a light emitting diode based on the structure described above.

FIG. 5A-FIG. 5H show cross sectional structures of a light emitting diode in order of fabricating process. In addition, FIG. 6A-FIG. 6H are diagrams showing the fabricating process, seen from the top of an SOI substrate. Here, FIGS. 5A-5H are horizontal cross-sectional views of FIGS. 6A-6H, respectively. For example, FIG. 5H shows a cross-sectional structure of FIG. 6H(a) cut along a plane 13. Moreover, FIG. 7 is a diagram showing a cross-sectional structure of FIG. 6H(a) cut along a plane 14. A complete form of the device is shown in FIGS. 5H, 6H(a) and (b), and 7.

The following sequentially explains a fabricating process.

As shown in FIG. 5A, an SOI (Silicon On Insulator) substrate used as a support base plate is first prepared by sequentially laminating a silicon substrate 1, a buried oxide (hereinafter referred to as BOX) 2, and an SOI layer 3 from the bottom to up. When seen from the top of the substrate, only the SOI layer 3 is seen as shown in FIG. 6A. In fact, if the SOI substrate is substantially thin, one may be able to see through to the bottom substrate during the test. A substrate having a plane orientation 100 is used as the SOI layer 3 made out of single crystalline silicon. An initial film thickness of the tested SOI layer 3 prior to the process was 55 nm. In addition, BOX 2 had a film thickness of about 150 nm.

Next, a resist is coated and exposed by a mask through photolithography, leaving out only a desired region of the resist. An anisotropic dry etching is performed to obtain the mesa-shaped SOI layer 3 as shown in FIG. 5B and FIG. 6B. For simplicity of description, only one element is shown in the drawings, but it would be needless to say that a large number of elements are actually formed over a substrate, and many elements can be integrated at high productivity through the silicon process.

Although not shown in the drawings, the anisotropic dry etching is carried out further to make corners of the mesa-shaped SOI layer 3 round. By rounding the corners, a subsequent oxidation process can be performed entirely including the etched portion where a tensile stress is easily gathered, interfering with the oxidation. If the corners are not removed or rounded, more current flows into this SOI layer 3 because of its relatively greater thickness than other parts and as a result, luminescence efficiency is deteriorated.

In order to protect the surface, the surface of the SOI layer 3 is then oxidized by about 15 nm to form a silicon dioxide film 4 as shown in FIG. 5C and FIG. 6C. The silicon dioxide film 4 not only reduces damages on the substrate caused by ion implantation in the following process, but also controls impurities escaping into the air as a result of activation annealing.

Thereafter, resist patterning is carried out by using photolithography to leave the resist only in a desired region, and $BF_2$ ions are implanted with energy 15 keV and a dose of $1\times10^{15}/cm^2$ to form a P-type impurity implantation region 5 in the SOI layer 3.

After the resist is removed, resist patterning is carried out again by using photolithography to leave the resist only in a desired region, and P ions are implanted with energy 10 keV and a dose of $1\times10^{15}/cm^2$ to form an N-type impurity implantation region 6 in the SOI layer 3. This state is shown in FIG. 5D. The top view of FIG. 5D is provided in FIG. 6D(a). Meanwhile, the ion implanted state is found in FIG. 6D(b) showing the bottom of the silicon dioxide film 4. In effect, when examined through an optical microscope during the fabrication, the silicon dioxide film 4 made out of glass looks clear, while an impurity implanted region as shown in FIG. 6D(b) looks in a slightly different color.

In the ion plantation process, an ion implanted portion on the SOI layer 3 becomes amorphous and is poorly crystallized. Therefore, although not shown in the drawings, it is important to make only the surface of the SOI layer 3 be amorphized and let crystalline silicon remain in an interfacial area between the SOI layer 3 and the BOX 2. Meanwhile, if acceleration voltage for the ion implantation is set too high, all the ion implanted region on the SOI layer 3 is amorphized, so that the single crystallinity may not be restored even under a subsequent annealing process and the SOI layer 3 is polycrystallized. Therefore, after the ion implantation, crystallinity should be restored by activation annealing and the like. As discussed before, having good single crystallinity is a crucial factor for improving luminescence efficiency.

FIGS. 5D and 6D(b) show that the N-type impurity implantation region 6 is formed next to the P-type impurity implantation region 5, but it is not mandatory to put them close by. When the photolithography using a mask is included in the fabricating process, the two regions may be dislocated. In such case, the P-type impurity implantation region 5 and the N-type impurity implantation region 6 are either separated or overlapped with each other. In this example, a mask pattern is carefully selected to purposely leave a non-ion implanted SOI layer 3 between the P-type impurity implantation region 5 and the N-type impurity implantation region 6 at the same time. A diode having such a non-ion implanted region (i-region) is known as a pin diode. A pn diode and a pin diode, each comprising an ultra-thin silicon layer, are fabricated at the same time for an experiment.

Thereafter, the activation annealing is customarily carried out to active impurities and at the same time, the single crystallinity of the damaged region of the SOI layer 3 due to the ion implantation process may be restored. To reduce the number of processes, however, the activation annealing is not included for the fabricating process in this example, so the impurities are activated at the same time with an oxidation treatment. The reduced number of processes also opens up possibilities for reducing the fabricating cost. Here, the activation and annealing for restoring the single crystallinity may be included as well.

Next, a silicon nitride film 7 is deposited on the front face to a thickness of 100 nm, leading to a state shown in FIGS. 5E and 6E.

Then, resist patterning is carried out by using photolithography to leave the resist only in a desired region. The silicon nitride film 7 is then processed by anisotropic dry etching, leading to a state shown in FIGS. 5F and 6F.

A cleansing process is carried out, followed by an oxidation treatment to make a desired region of the SOI layer 3 as thin as possible. Here, conditions for oxidation are very important. As inventors, we learned that under a prior art oxidation treatment at a temperature of 1000° C. or below, which is often used as the silicon process, the thickness of a silicon dioxide film formed on the P-type impurity implantation region 5 differs by up to twice the thickness of a silicon dioxide film formed on the N-type impurity implantation region 6. As explained above, the SOI layer 3 needs to be even thinner than the mean free path 1 to enhance luminescence efficiency. For example, the mean free path 1 of silicon is about 10 nm at room temperature. Therefore, the film thickness of the SOI layer 3 has to be 10 nm or less, preferably 5 nm or less. In order to produce a thin, evenly spread film, using impurity ions having different oxidation rates by conductive regions are not allowed. With different oxidation rates, if a conductive region on one side is 5 nm thick, a conductive region on the other side may become too thick or all of it may be oxidized and destroyed. In the meantime, we discovered that even when a 100 nm thick oxide needs to be formed under dry oxidation treatment at an oxidation temperature of 1000° C., a difference between the thickness of the silicon dioxide film formed on the P-type impurity implantation and the thickness of the silicon dioxide film formed on the N-type impurity implantation region 6 may be reduced as small as 1 nm or so.

In this example, an approximately 90 nm-thick silicon dioxide film 8 was formed by the dry oxidation treatment at 1100° C. Consequently, it was possible to reduce the film thickness of an ultra-thin silicon layer to about 5 nm. Moreover, the difference between the film thickness of the N-type doped region and the film thickness of the P-type doped region could be suppressed to 1 nm or less. During the oxidation treatment, one has to watch the film thickness of an ultra-thin silicon layer through a spectrum ellipsometry with an ultra-precision of 1 nm or less, while carefully checking the film thickness of the other silicon layer. For mass production, it is preferred that an oxidation device has a built-in ellipsometry. Moreover, a wafer to be fabricated may preferably have a pre-set pattern for use in film thickness testing. As the luminous region of FIGS. 2 and 3 shows, a pattern for about 1 $cm^2$-size testing is provided within a wafer, so as to thoroughly check a film thickness distribution in the wafer surface, while carrying out the oxidation treatment at the same time. In addition, since 1100° C. is high enough to activate ions, impurities that are introduced through ion implantation by this oxidation treatment are readily activated to form a P-type SOI region 9, an N-type SOI region 10, a P-type ultra-thin silicon region 11, and an N-type ultra-thin silicon region 12. This state is shown in FIGS. 5G and 6G, respectively.

Thereafter, the silicon nitride layer 7 is removed by a cleaning process and by wet etching with hot phosphoric acid. Then, the hydrogen annealing treatment is carried out at a temperature of 400° C., and any bonds produced during the process are H-terminated. FIG. 5H depicts a full cross-sectional view of a finished light emitting diode product. FIG. 6H(1) is a top view of FIG. 5H, and FIG. 6H(b) is a bottom view of the silicon dioxide layer 8 to show an implantation pattern. FIG. 7 is a diagram showing the light emitting diode cut along the plane 14. In detail, FIG. 7 illustrates the formation of the silicon dioxide layer 8 as a result of oxidation of side walls adjacent to the N-type ultra-thin silicon region 12.

Finally, a desired wiring is carried out to complete the formation of a high-efficiency silicon light emitting diode on the silicon substrate 1.

FIG. 8 diagrammatically shows how to measure LED properties having the structure described above. A probe 15 is connected to the P-type SOI region 9, while a probe 16 is connected to the N-type SOI region 10. Diode properties can be obtained by flowing current between the probe 15 and the probe 16. A threshold value of the current-voltage characteristics reflects an increment of the band gap shown in FIG. 4A. A proportional dependence of band gap shown in FIG. 4A on the film thickness was observed even in film thicknesses of the P-type and N-type ultra-thin silicon regions 11 and 12 which are differently designed as 13.6 nm, 6.3 nm, 4.0 nm, and 1.3 nm. FIG. 4B shows a spectrum by photoluminescence. As is evident from the drawing, as the SOI film thickness in the ultra-thin silicon region decreases, the luminescence intensity sharply increases. And, luminescence 17 occurs, as shown in FIG. 8, in the P-type ultra-thin silicon region 11, the N-type ultra-thin silicon region 12, and an interface therebetween. For a better understanding, the luminescence 17 overlapped with an upper portion of the P-type ultra-thin silicon region 11 and an upper portion of the N-type ultra-thin silicon region 12 is not shown, but it is needless to say that luminescence 17 takes place on the upper portions as well. The luminescence 17 also proceeds in a direction parallel to the substrate, as illustrated in FIG. 8.

Next, FIGS. 9A-9F respectively shows a contrast luminescent image superimposed with an optical image of a device element being photographed at the same time, under forward bias conditions applying bias voltages of 0, 1, 2, 3, 4, and 5V to the PN junction, where the image is. Here, the element has a width W of 100 µm and an ultra-thin silicon film has a length L (sum of lengths of the P-type ultra-thin silicon region 11 and the N-type ultra-thin silicon region 12) of 10 µm. A grayish band portion in the vertical direction between the probe 1 and the probe 2 in FIG. 9A is an area where the P-type ultra-thin silicon region 11 and the n-type ultra-thin silicon region 12 are formed. Even though luminescence intensities are observed in many areas, the luminescence intensity from an area with the P-type ultra-thin silicon region 11 and the N-type ultra-thin silicon region 12 is definitely stronger, while the luminescence intensity from the relatively thin P-type or N-type SOI region 9 or 10 on the SOI layer is almost zero. These results coincide with the principle discussed earlier that bulk silicon has very week luminescence intensity and the luminescence intensity increases if an ultra-thin silicon layer is employed. In effect, when the number of CCD-observed photons excited from light emission was counted, the luminescence intensity from an ultra-thin silicon layer was definitely larger by several figures than that of a thick silicon layer. Moreover, when luminescence was spectroscopically analyzed by using an insert-filter, it turned out the luminescence intensity was highest around the 1000 nm wavelength and lowest around the 500 nm wavelength. This indicates that light emission in this case is the result of recombination due to the band gap in an ultra-thin silicon layer, not by radiation from a photoelectron and the like having a large kinetic energy, and verifies the principle discussed before is indeed correct.

Next, FIGS. 10A-10F respectively show an image photographed by a low magnification lens under forward bias conditions applying 0, 5, 10, 20, 30, and 40V. Again, it turned out that luminescence intensity was strong from the P-type ultra-thin silicon region 11 and the N-type ultra-thin silicon region 12, being spread onto a concentric circle.

By using this structure, it becomes possible to obtain a device demonstrating high luminescence efficiency and good productivity and having a Group IV semiconductor as a basic component formed over a silicon substrate for example.

SUMMARY OF THE INVENTION

As discussed earlier, although a light emitting diode is obtained in use of silicon, light needs to be propagated more efficiently as optical communications are taken into consideration. Unfortunately, no one succeeded in obtaining a silicon light emitting diode until now, and a structure for building a light emitting diode within one chip and causing light emission was something no one could imagine.

In view of the foregoing problems, it is, therefore, an object of the present invention to provide a light emitting diode demonstrating high luminescence efficiency and comprising a Group IV semiconductor such as silicon or germanium equivalent thereto as a basic component formed on a silicon substrate by a prior art silicon process, and a fabricating method of waveguide thereof.

It is another object of the present invention is to provide a device based on a Group IV semiconductor, capable of performing laser oscillation by using a waveguide laser cavity, and a fabricating method thereof.

Among many inventions disclosed here, a representative embodiment of the present invention will now be explained briefly as follows.

A light emitting diode according to the present invention comprises a first electrode for implanting electrons, a second electrode for implanting holes, and a light emitting section electrically connected to the first and the second electrode, wherein the light emitting section is made out of single crystalline silicon and has a first surface (upper surface) and a second surface (lower surface) facing the first surface, and wherein with respect to plane orientation (100) of the first and second surfaces, the light emitting section crossing at right angles to the first and second surfaces is made thinner. As such, a waveguide is formed by depositing a material with a high refractive index around a target thin film.

According to the present invention, a light emitting diode demonstrating high luminescence efficiency is easy to form over a silicon substrate for example by using a prior art silicon process, and a waveguide capable of guiding light at high efficiency.

Additional aspects and/or advantages of the invention will be set forth in part in the description which follows and, in part, will be obvious from the description, or may be learned by practice of the invention.

BRIEF DESCRIPTION OF THE DRAWINGS

These and other features, objects and advantages of the present invention will become more apparent from the following description when taken in conjunction with the accompanying drawings wherein:

FIGS. 6A through 6H are top views stepwisely showing the fabricating process of a light emitting diode for verifying the operating principle of a light emitting diode according to one embodiment of the present invention;

DETAILED DESCRIPTION OF THE PREFERRED EMBODIMENT

Figure 1A:
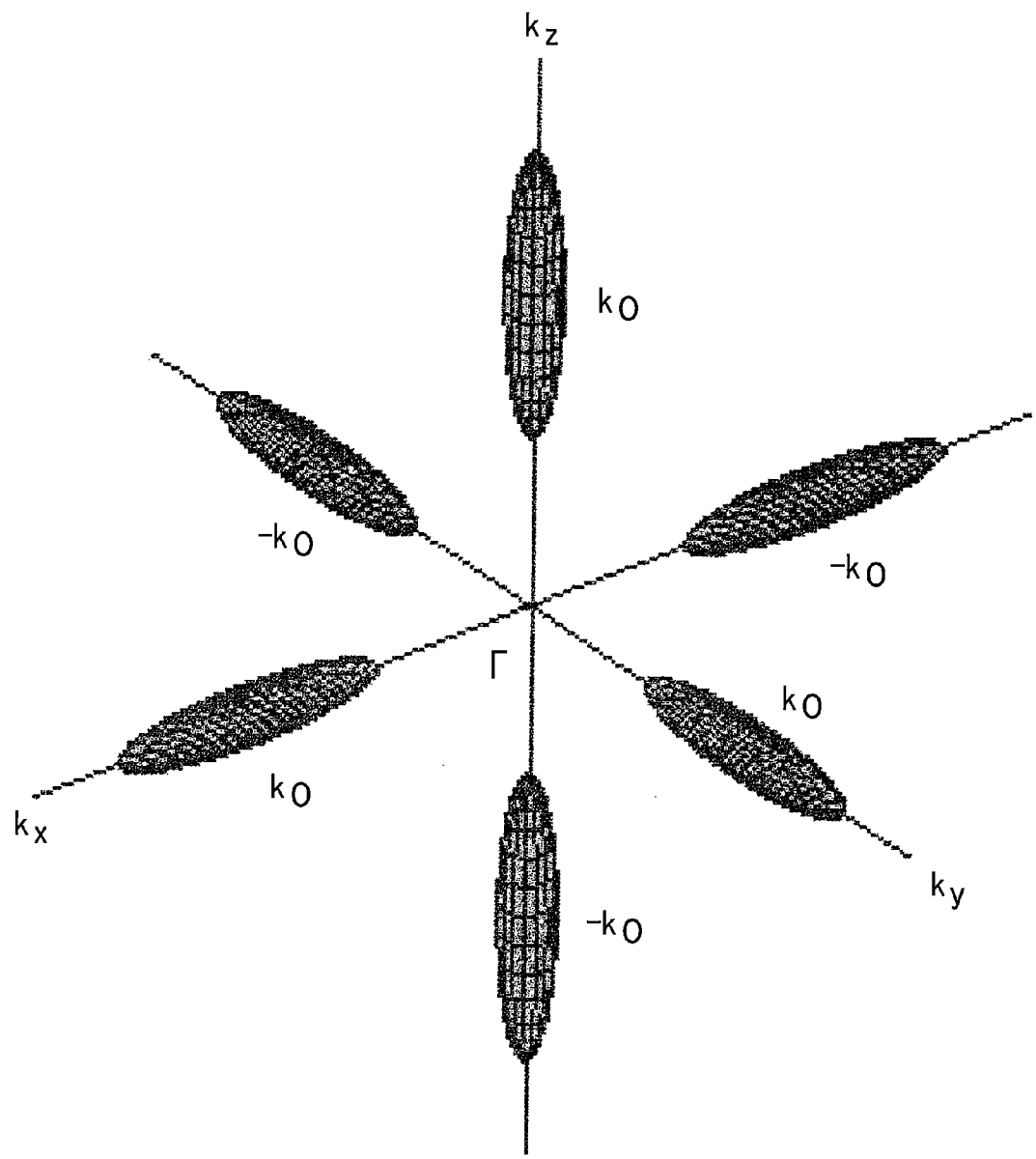
FIG. 1A shows a band structure in bulk silicon for explaining the operating principle of a light emitting diode according to one embodiment of the present invention.
Figure 1B:
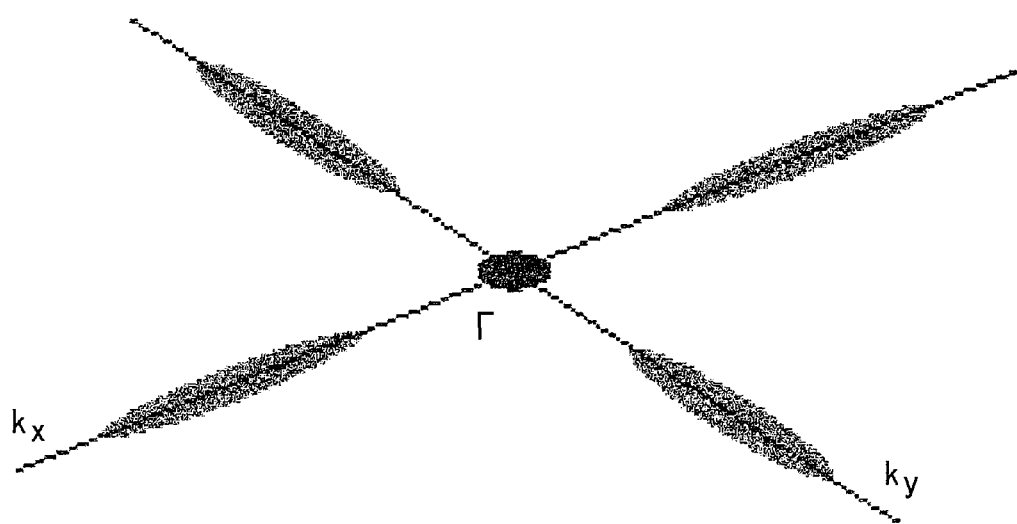
FIG. 1B shows a band structure in a silicon thin film or during the application of a gate electric field for explaining the operating principle of a light emitting diode according to one embodiment of the present invention.
Figure 2:
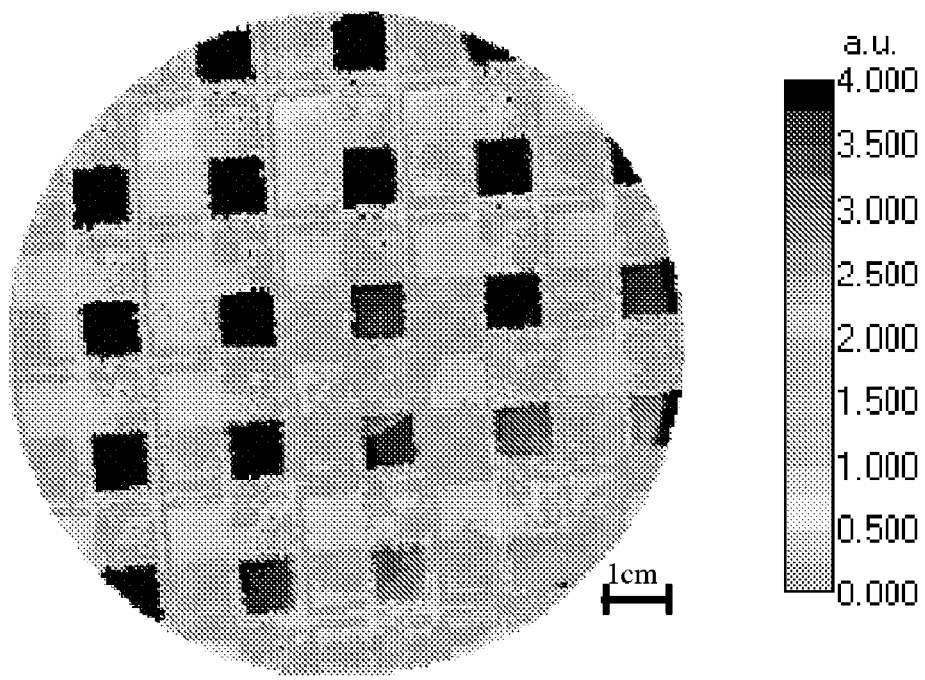
FIG. 2 shows luminescence intensity from an ultra-thin silicon layer as experimental data for verifying the operating principle of a light emitting diode according to one embodiment of the present invention.
Figure 3:
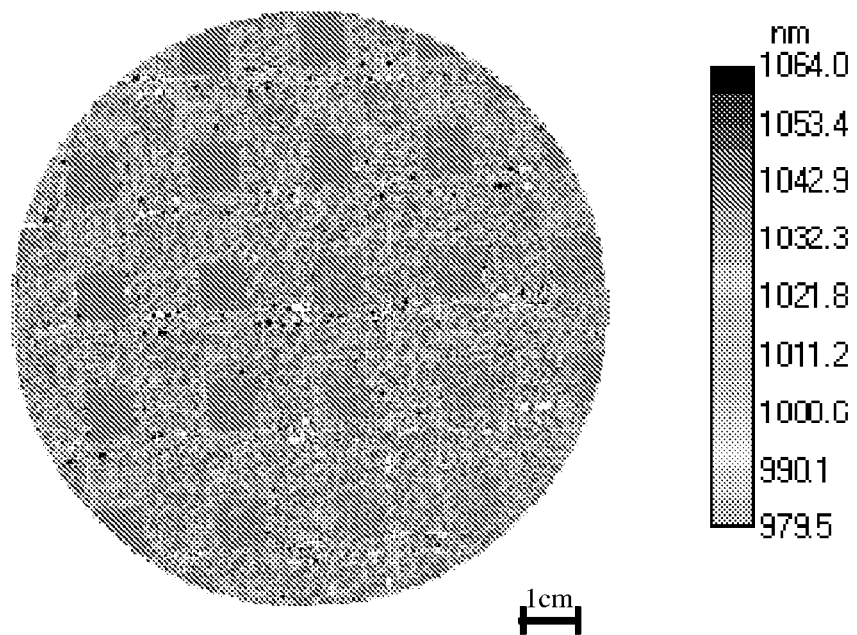
FIG. 3 shows a luminous wavelength from an ultra-thin silicon layer as experimental data for verifying the operating principle of a light emitting diode according to one embodiment of the present invention.
Figure 4A:
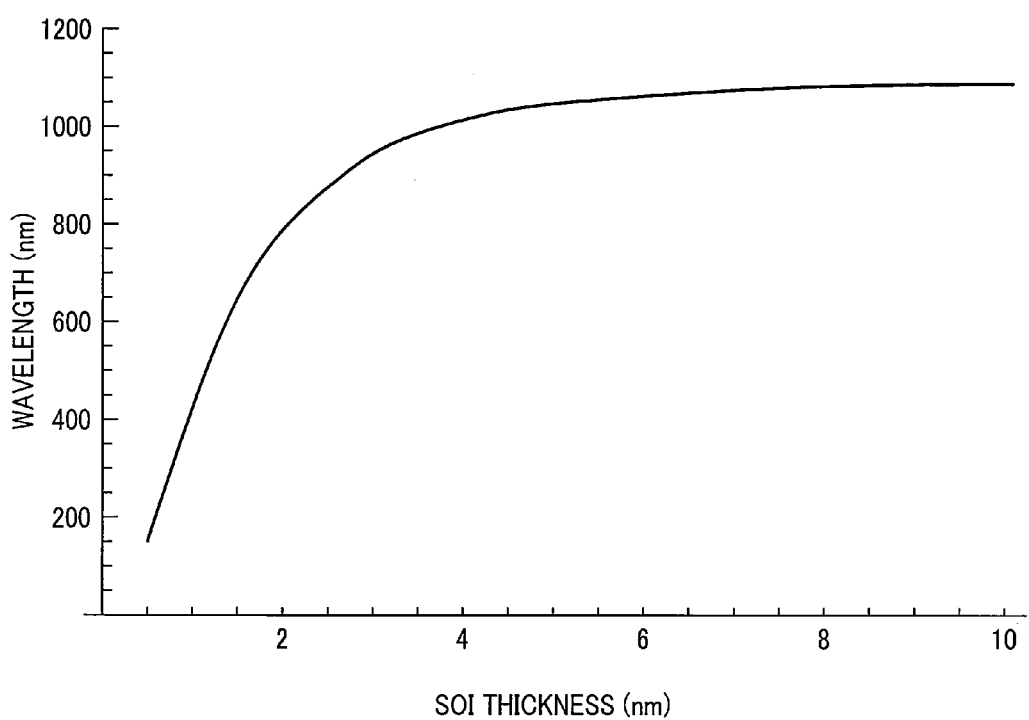
FIG. 4A shows the dependence of luminous wavelength on the film thickness of an ultra-thin silicon layer, based on the operating principle of a light emitting diode according to one embodiment of the present invention.
Figure 4B:
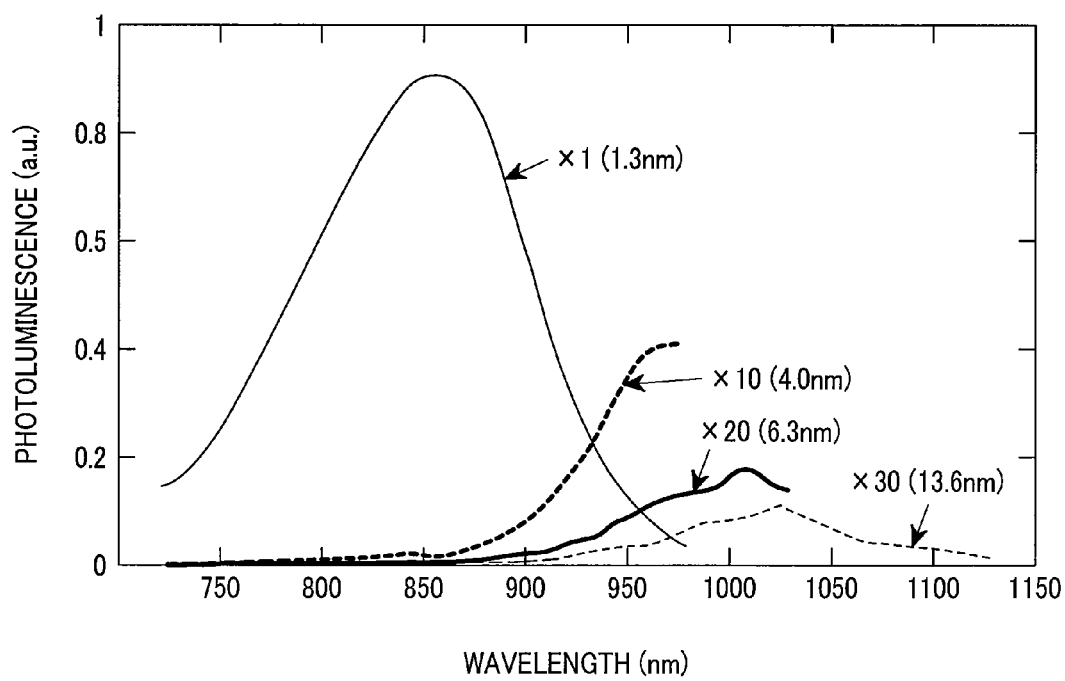
FIG. 4B shows the dependence of luminous wavelength/intensity on the film thickness of an ultra-thin silicon layer, based on the operating principle of a light emitting diode according to one embodiment of the present invention.
Figure 5A:
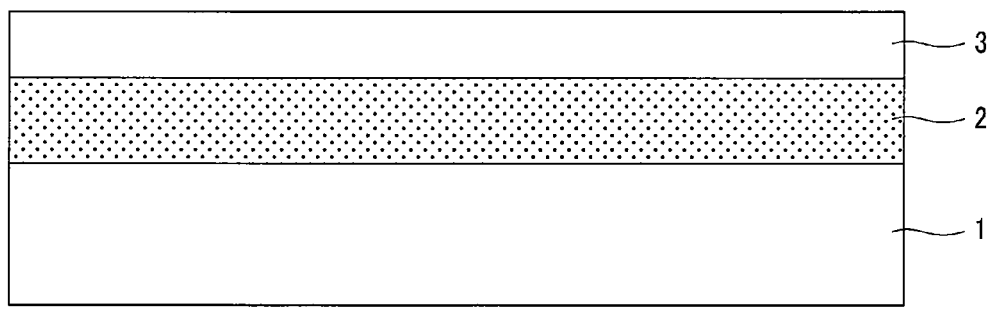
FIGS. 5A through 5H are cross-sectional views stepwisely showing the fabricating process of a light emitting diode for verifying the operating principle of a light emitting diode according to one embodiment of the present invention.
Figure 5B:
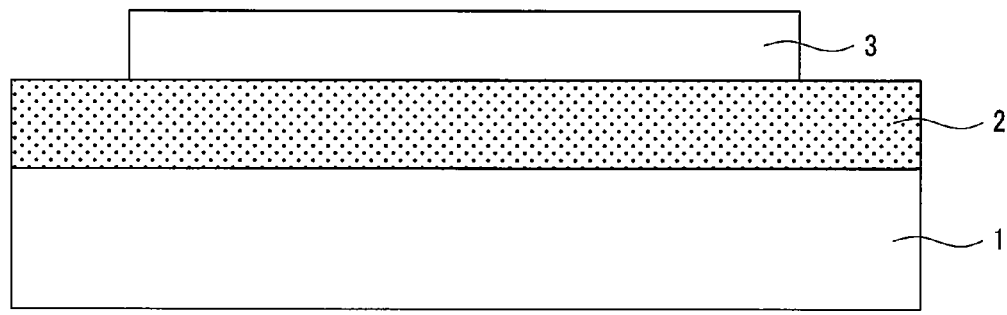
Figure 5C:
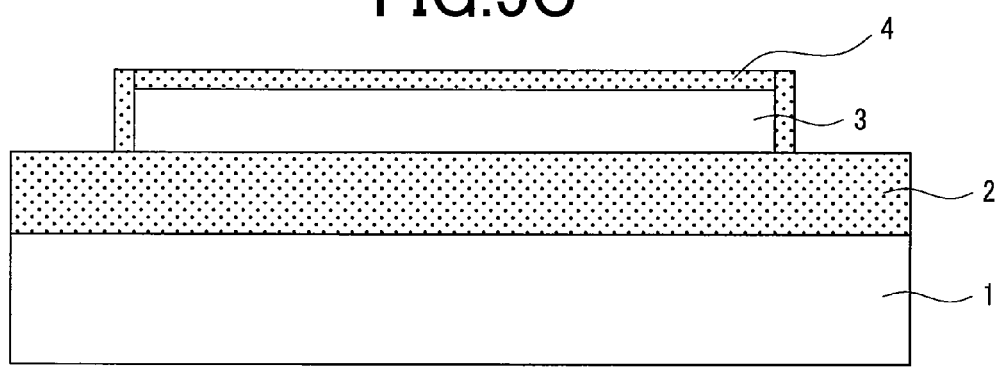
Figure 5D:
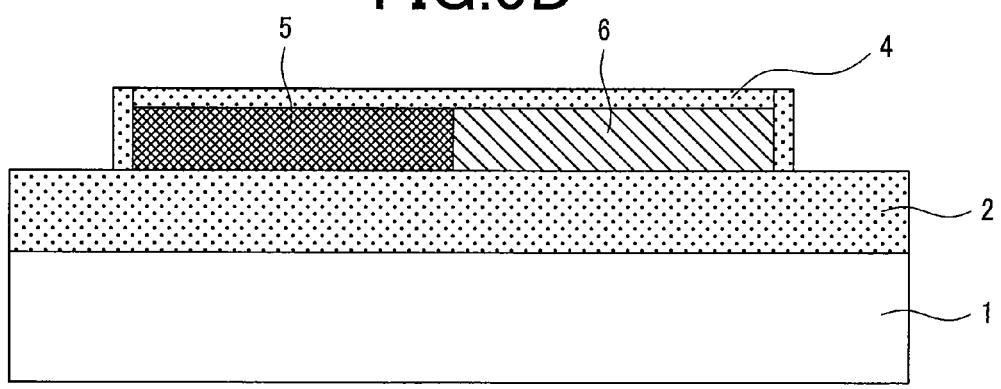
Figure 5E:
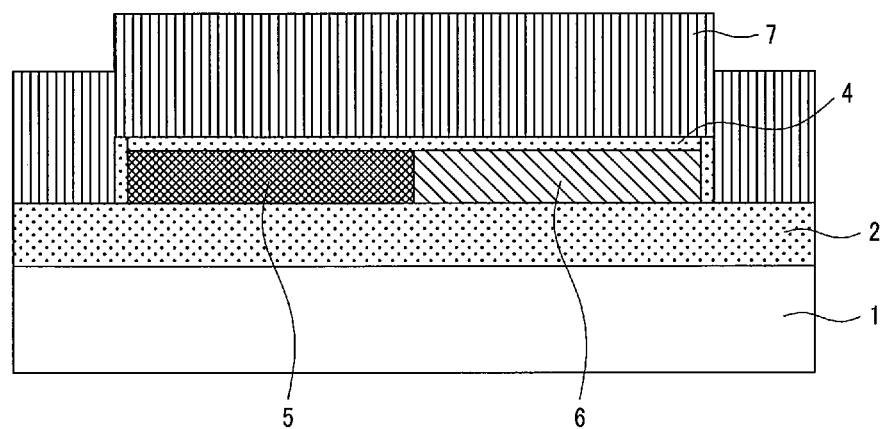
Figure 5F:
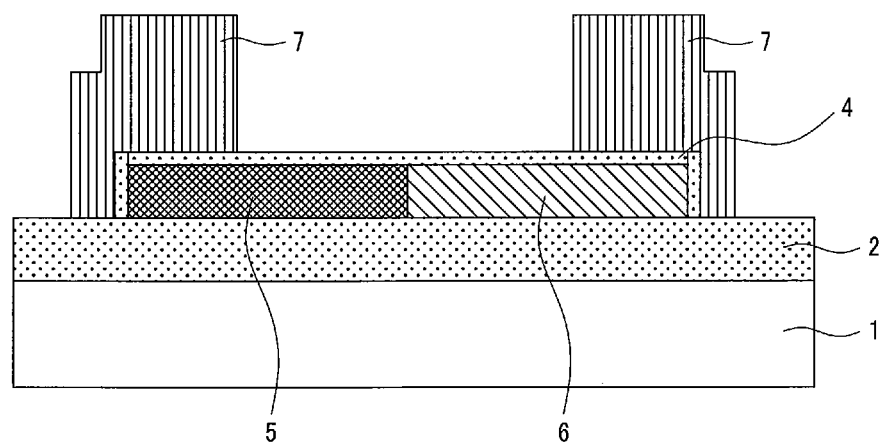
Figure 5G:
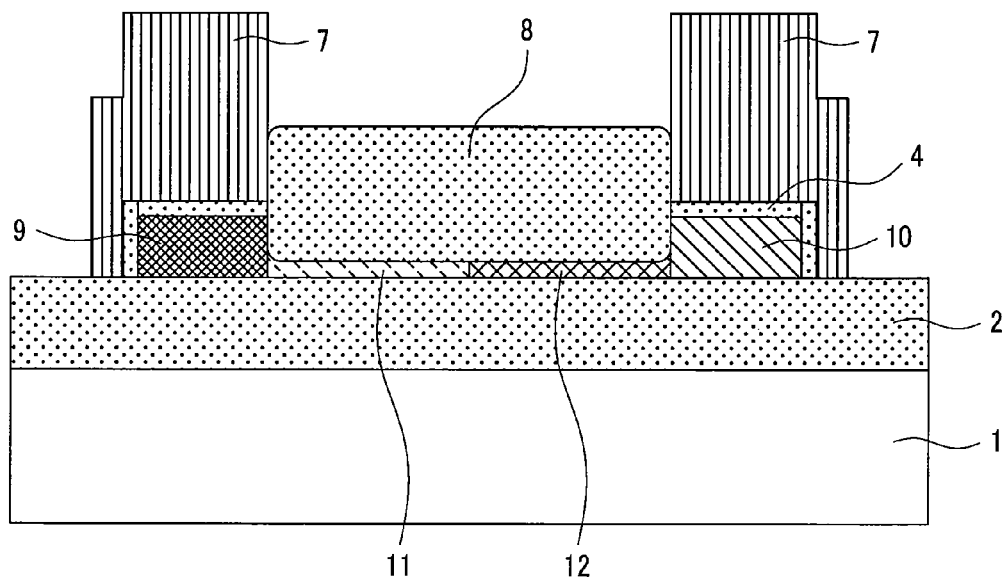
Figure 5H:
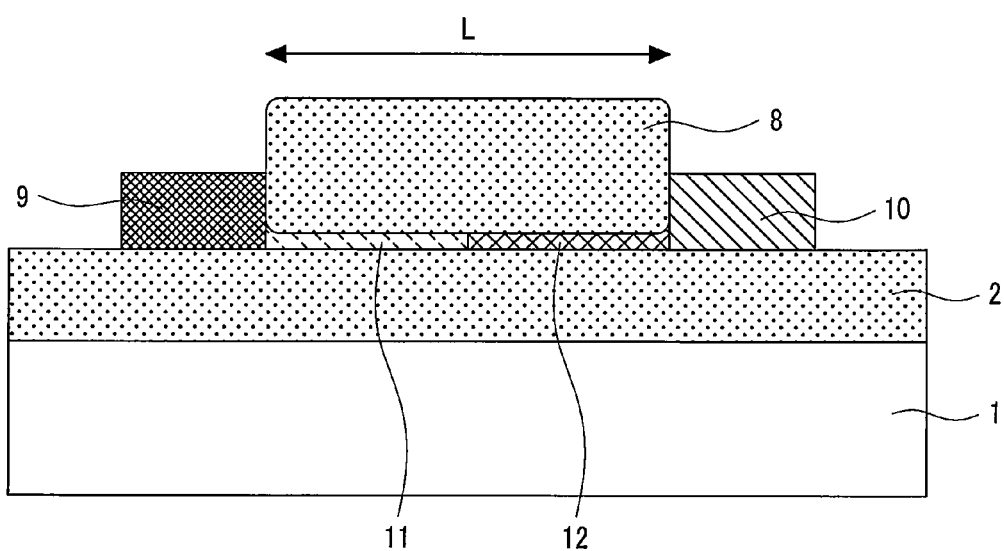
Figure 6A:
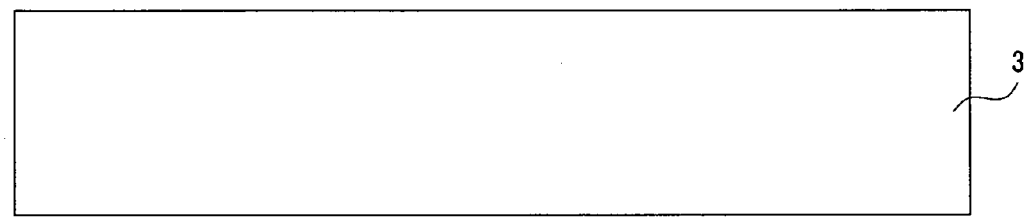
Figure 6B:
Figure 6C:
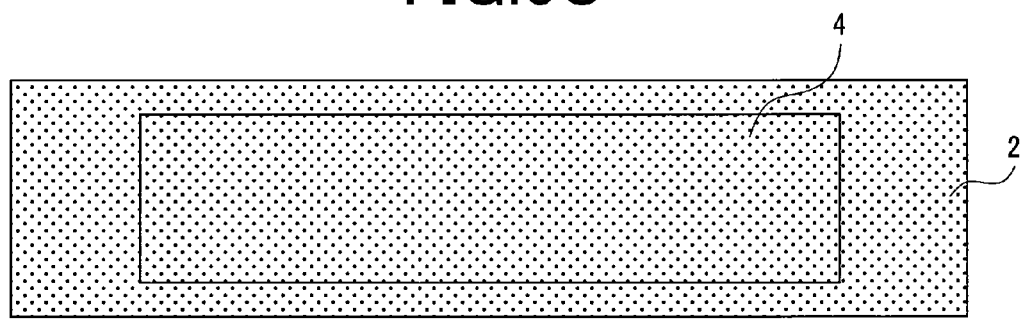
Figure 6G:
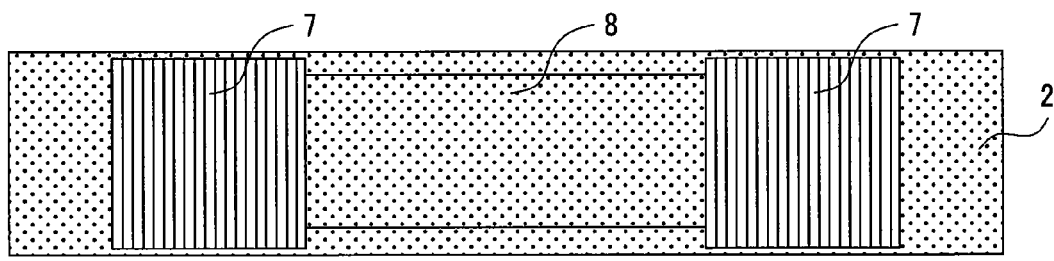
Figure 6G:
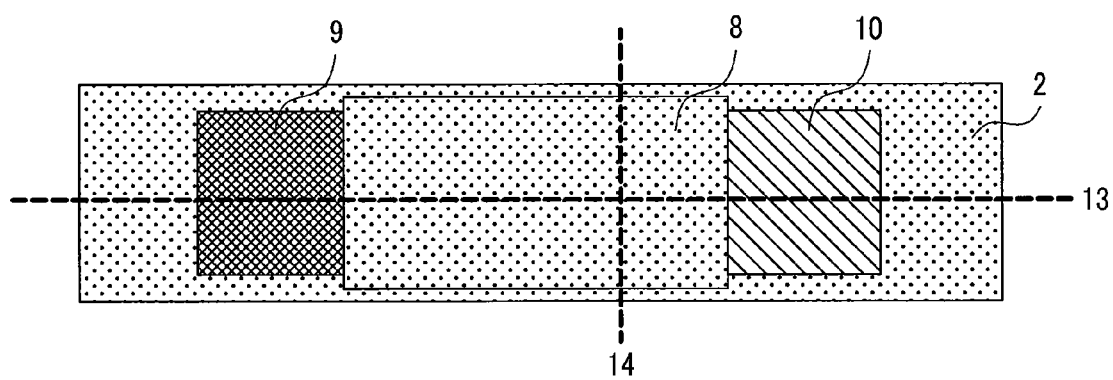
Figure 6G:
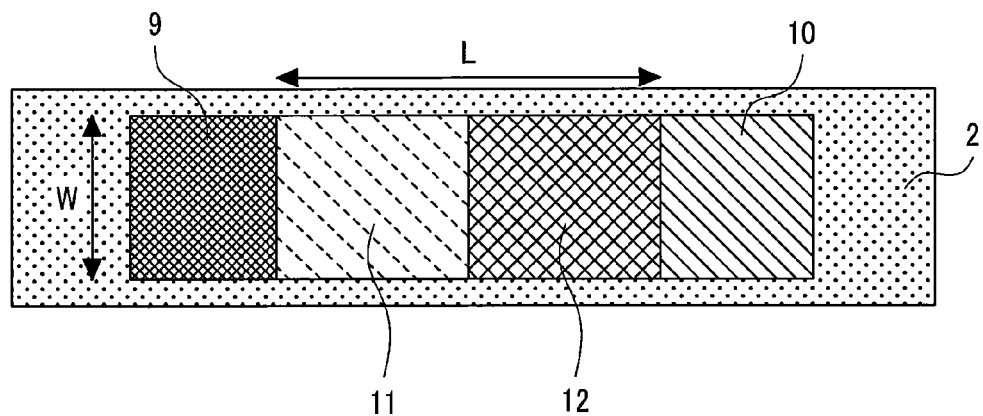
Figure 7:
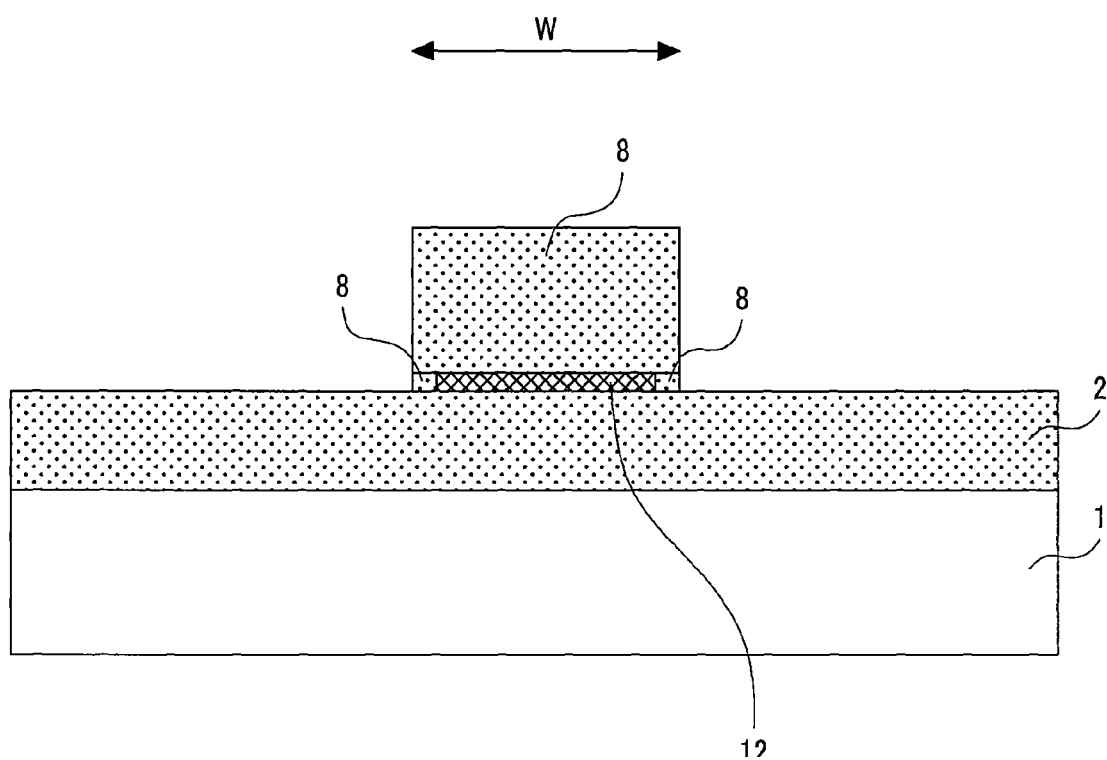
FIG. 7 is a cross-sectional view of a light emitting diode for verifying the operating principle of the light emitting diode according to one embodiment of the present invention.
Figure 8:
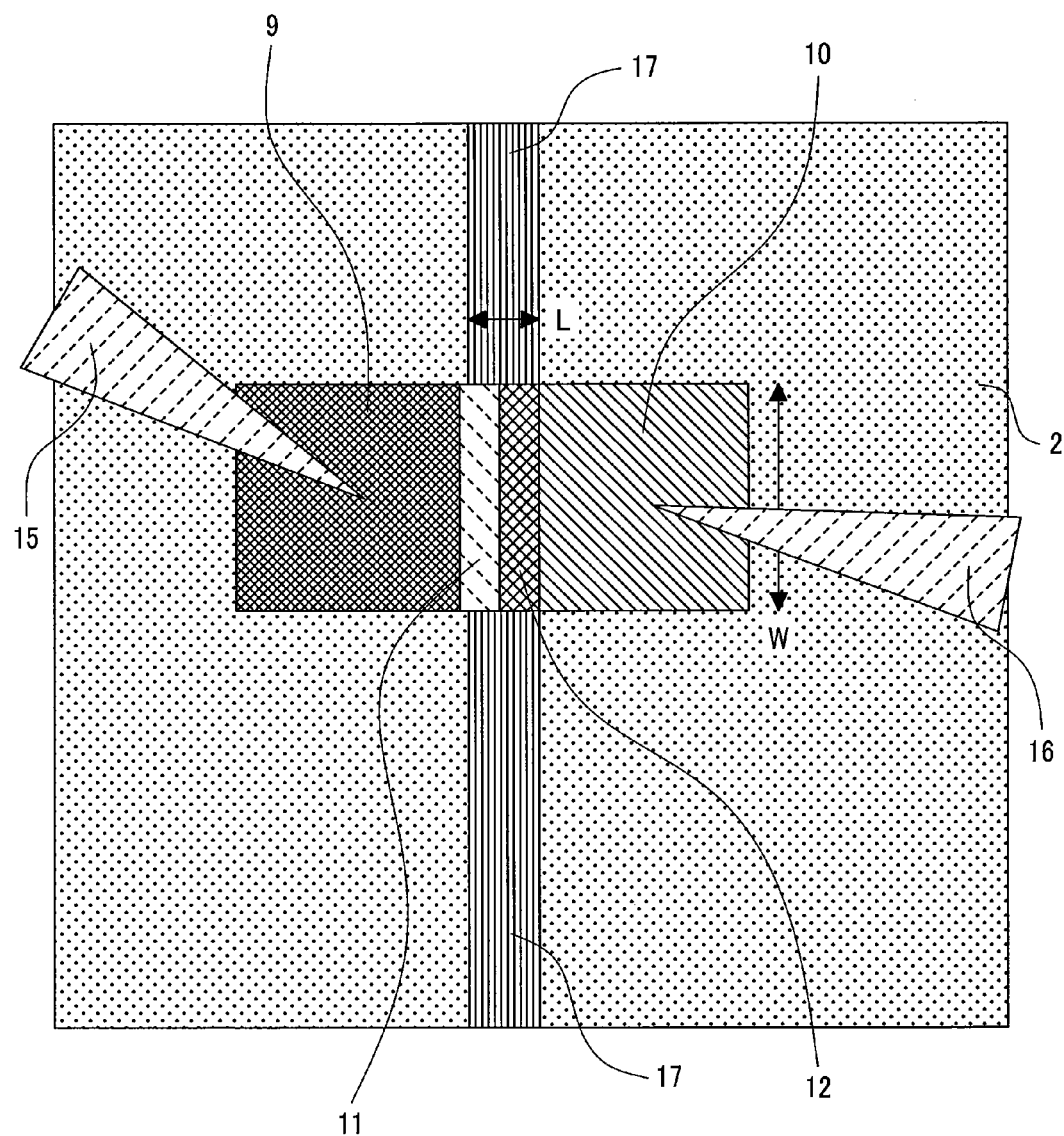
FIG. 8 is an explanatory view of a verification test for verifying the operating principle of the light emitting diode according to one embodiment of the present invention.
Figure 9A:
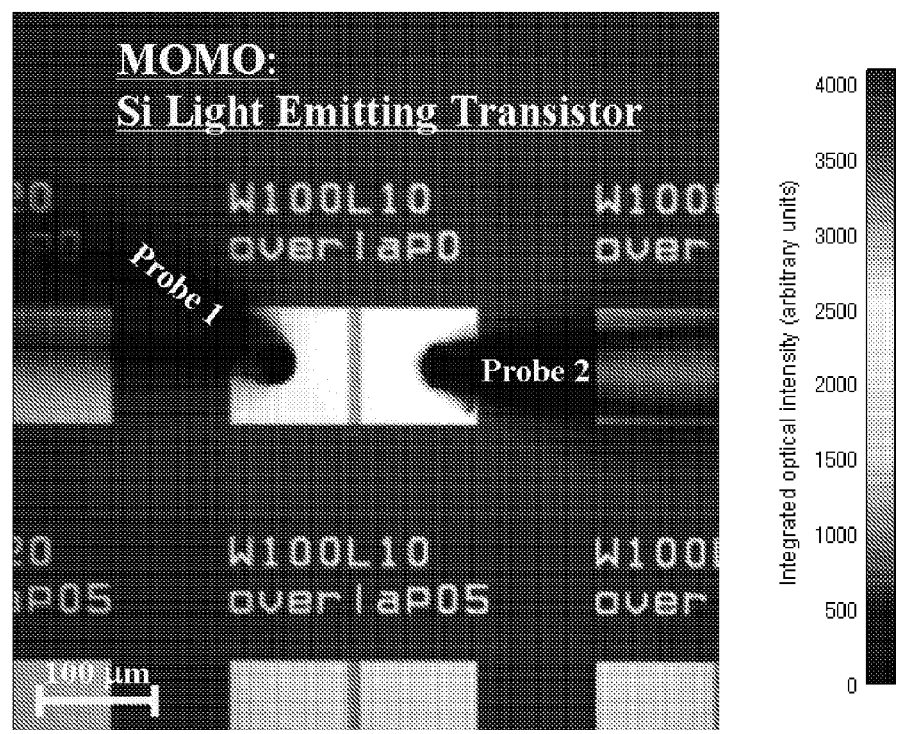
FIGS. 9A through 9F respectively shows a picture of a light emitting diode in luminescent state for verifying the operating principle of the light emitting diode according to one embodiment of the present invention.
Figure 9B:
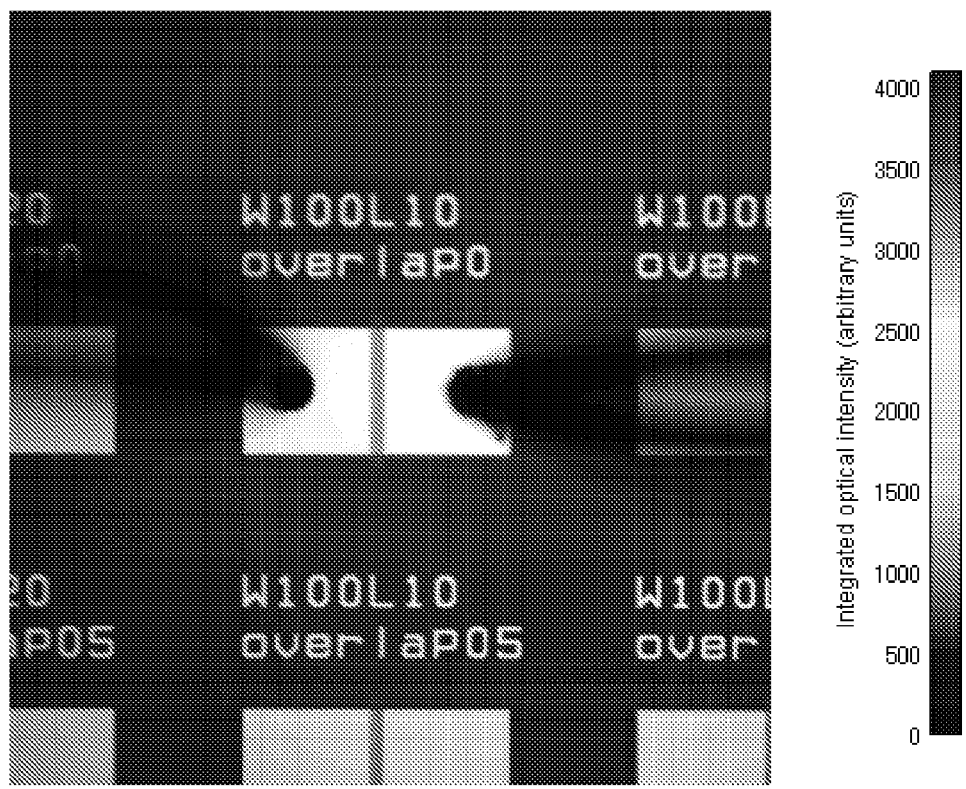
Figure 9C:
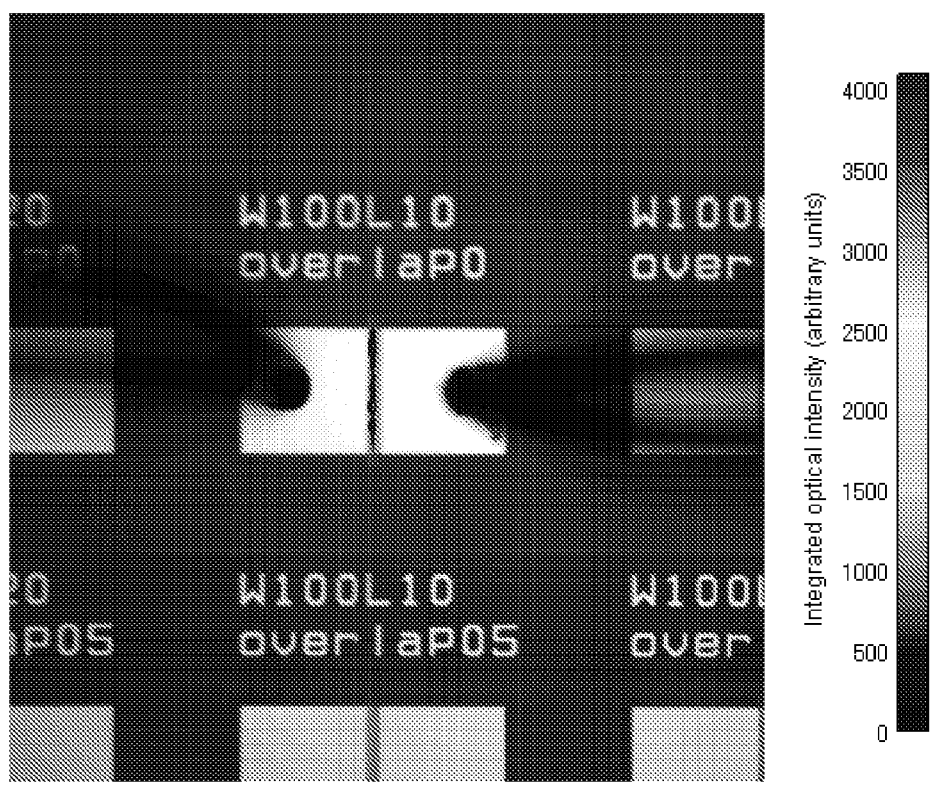
Figure 9D:
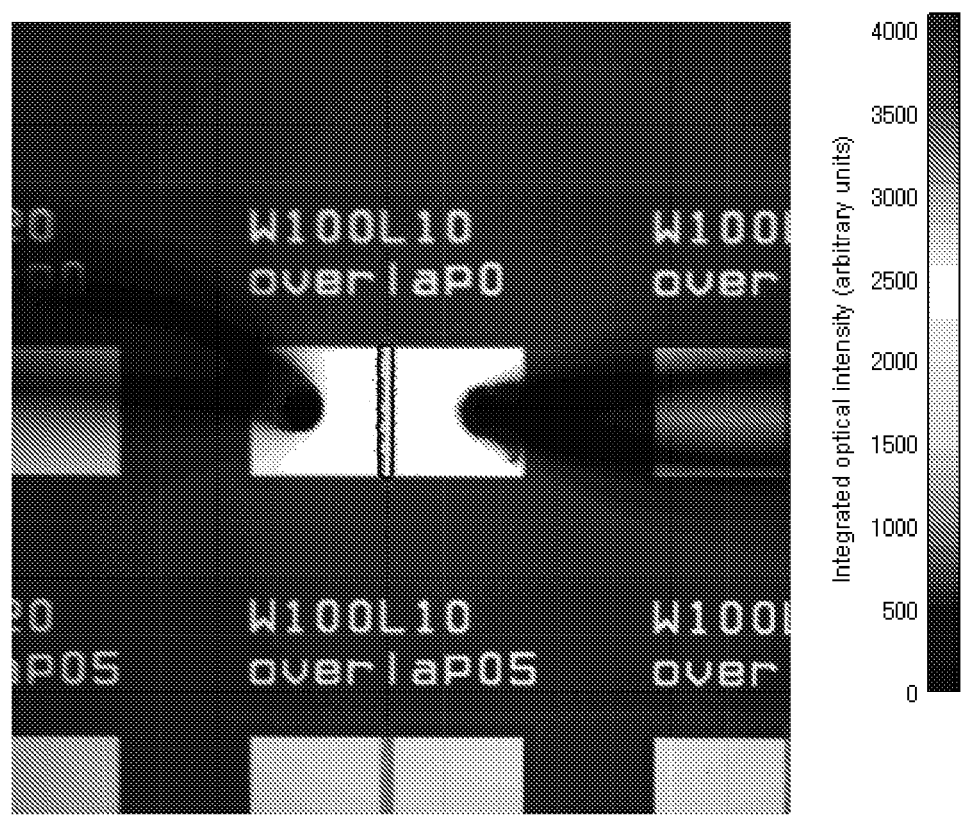
Figure 9E:
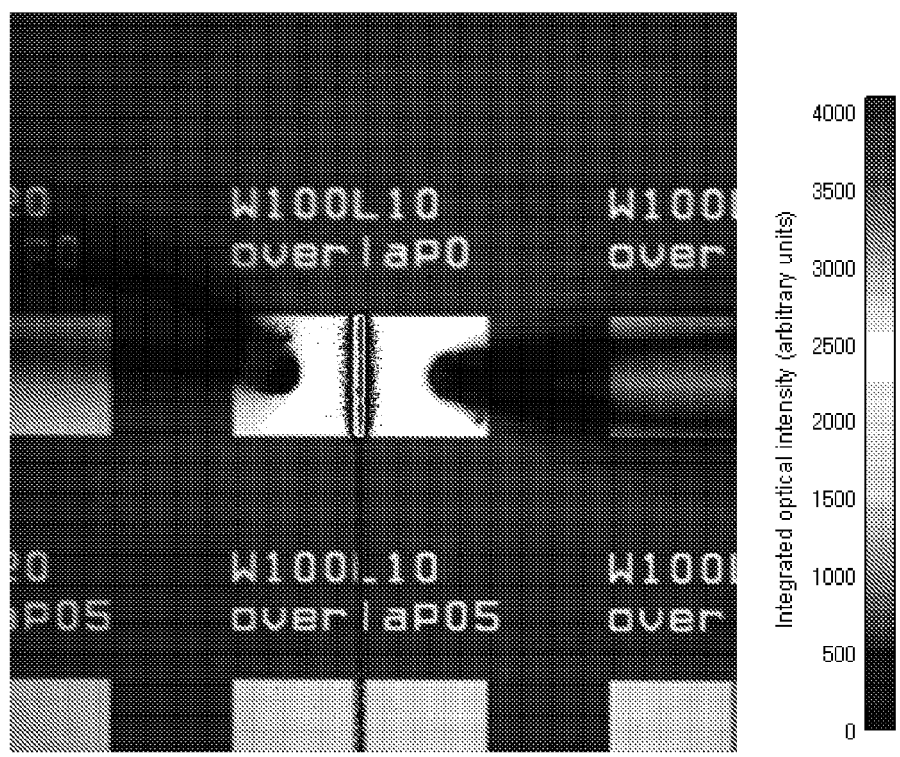
Figure 9F:
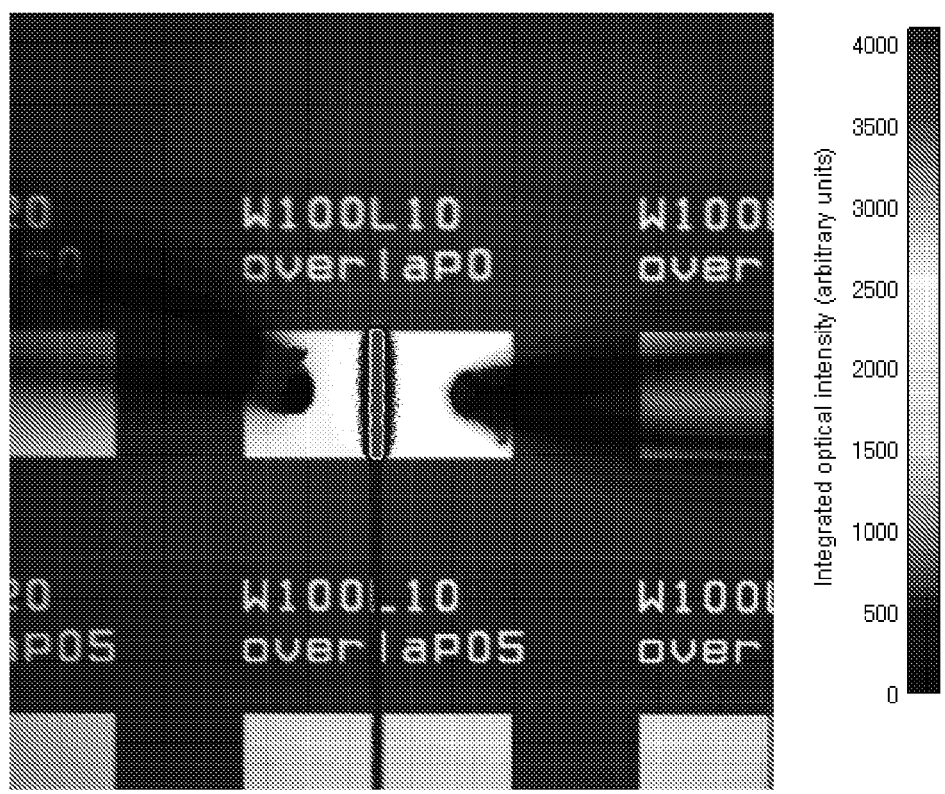
Figure 10A:
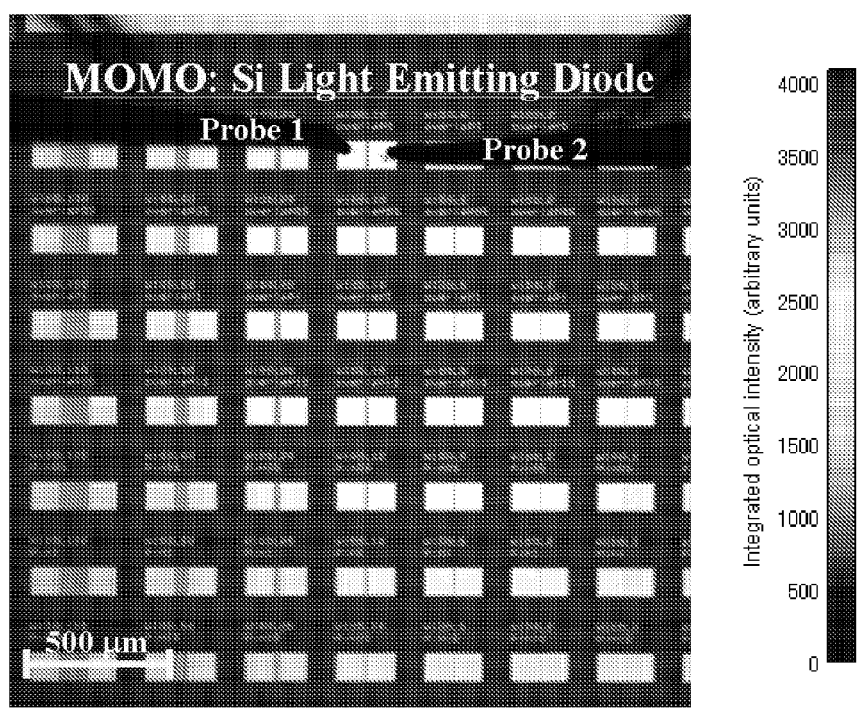
FIGS. 10A through 10F respectively shows a picture of a light emitting diode in luminescent state for verifying the operating principle of the light emitting diode according to one embodiment of the present invention.
Figure 10B:
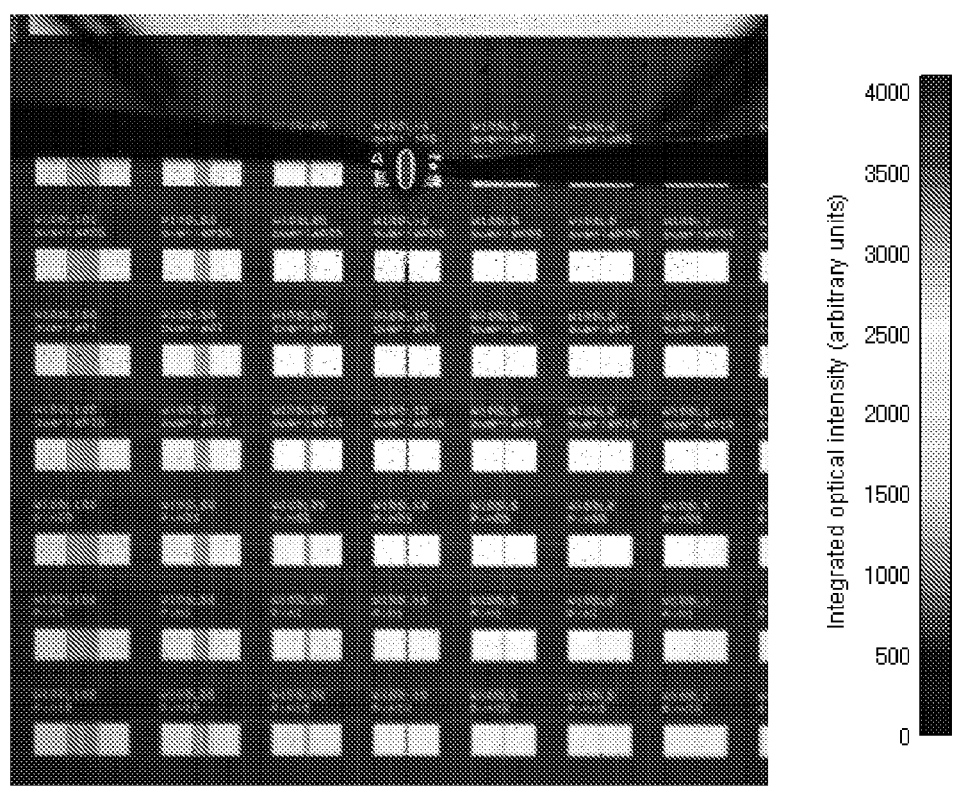
Figure 10C:
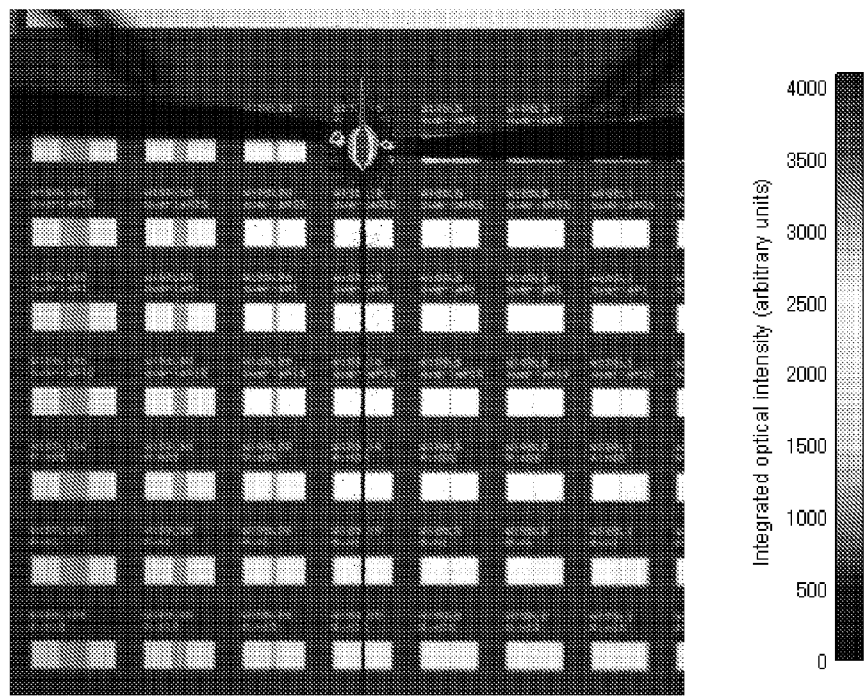
Figure 10D:
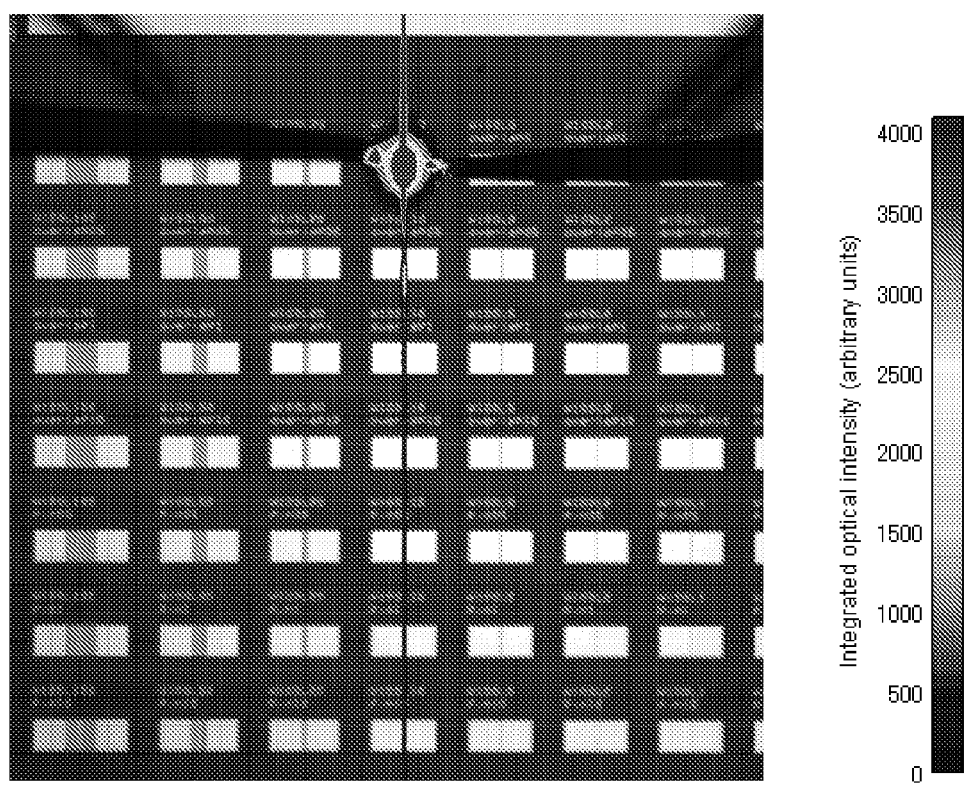
Figure 10E:
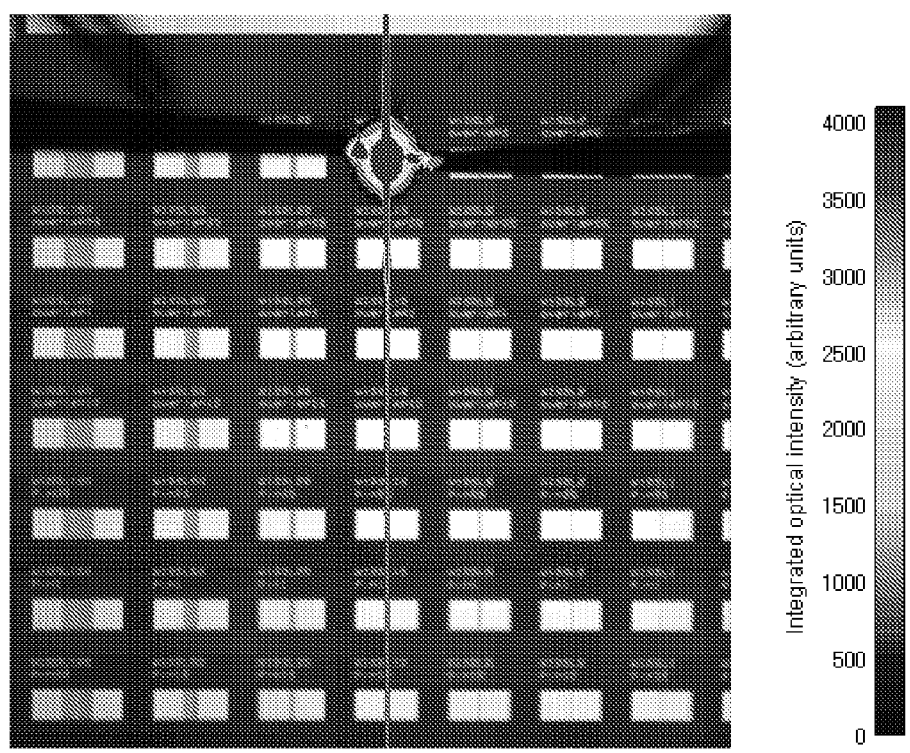
Figure 10F:
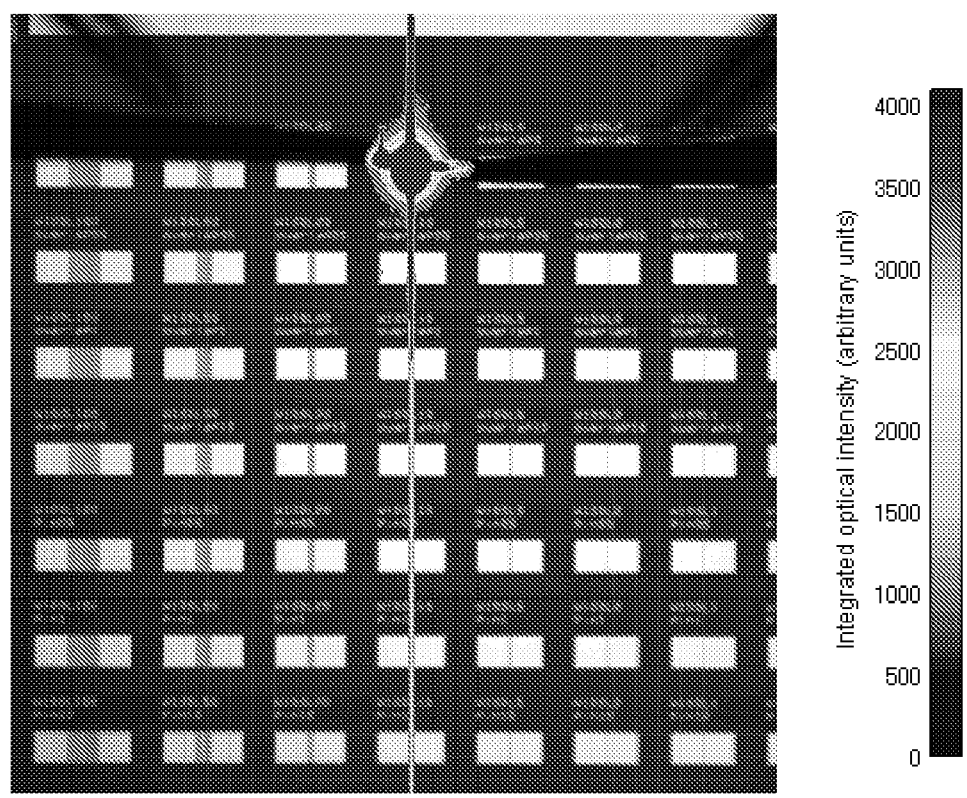

A preferred embodiment of the present invention will now be described with reference to the accompanying drawings. In the following description, same drawing reference numerals are used for the same elements even in different drawings. While the present invention has been described with respect to the specific embodiments, it will be apparent to those skilled in the art that various changes and modifications may be made without departing from the spirit and scope of the invention.

Embodiment 1

Figure 11:
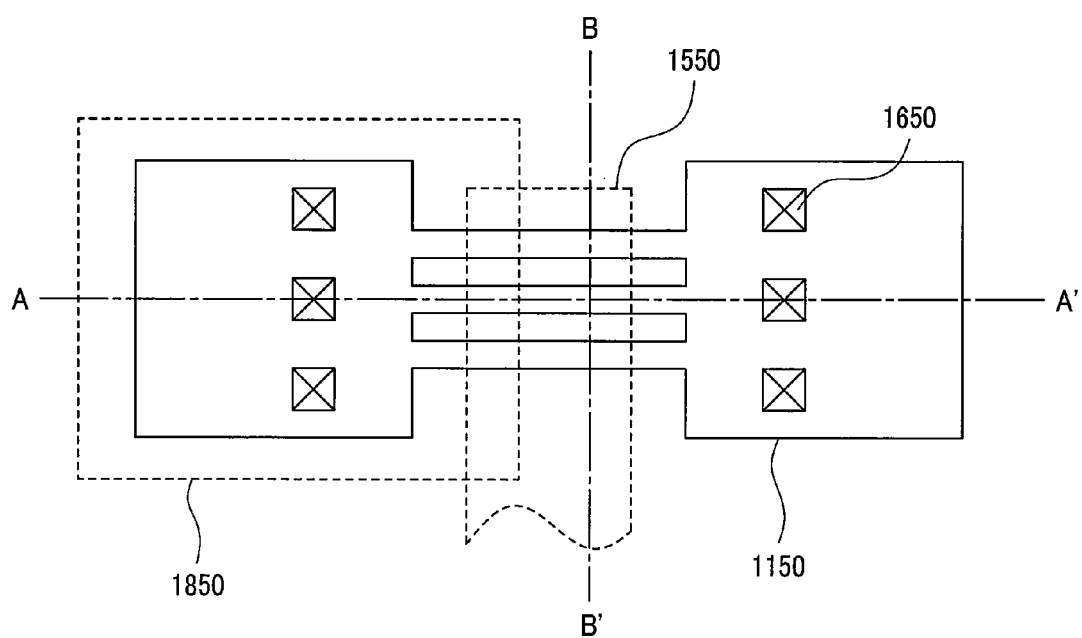
FIG. 11 is a planar layout for explaining an integrated light emitting diode according to the first embodiment of the present invention.
Figure 12:
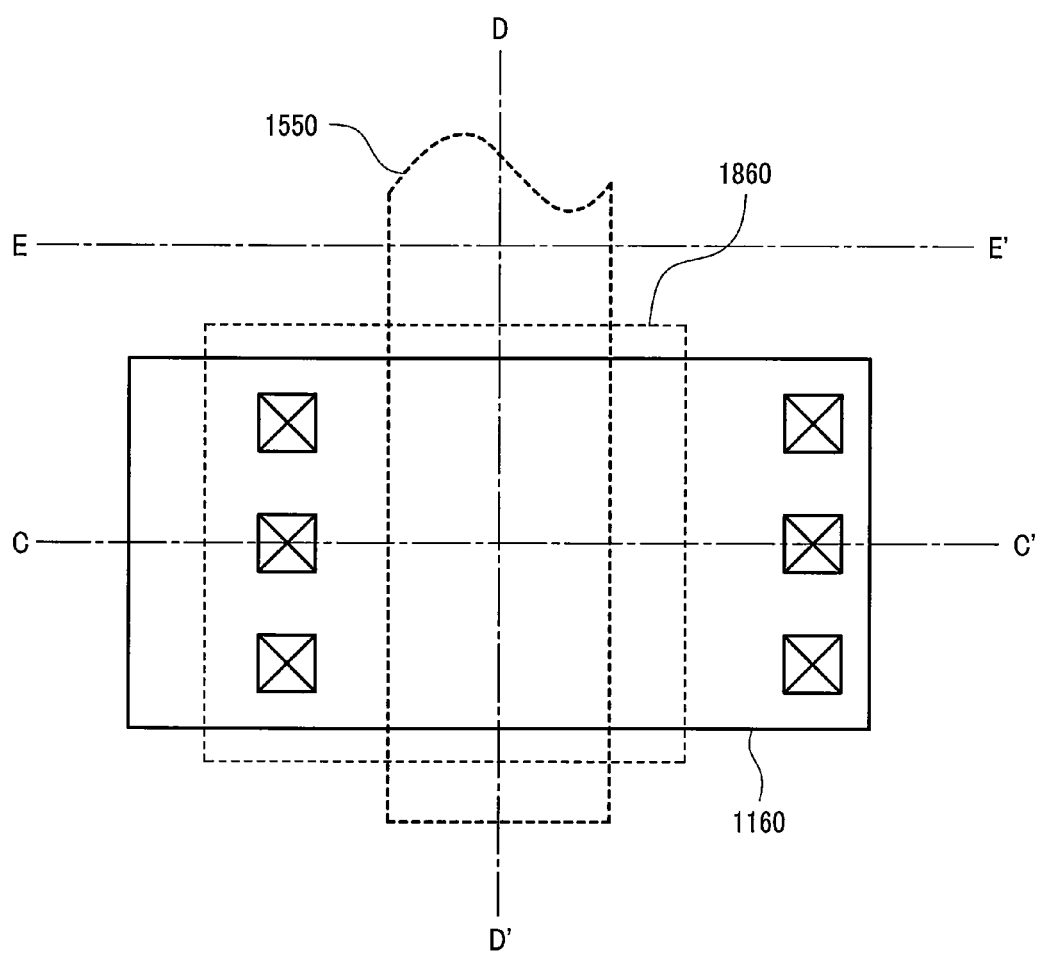
FIG. 12 is a planar layout for explaining a light receiving element according to the first embodiment of the present invention.

FIG. 11 is a planar layout for an integrated light emitting diode according to the present invention; FIG. 12 is a planar layout for a light receiving element according to the present invention; and FIGS. 13 through 18 are schematic cross-sectional views for stepwisely explaining the fabricating process of the integrated light emitting diode. In each of the drawings, a cross-sectional view taken along line A-A' of the planar layout (FIG. 11) is shown on the left hand side, and a cross-sectional view taken along line B-B' of the planar layout (FIG. 11) is shown on the right hand side.

Figure 13:
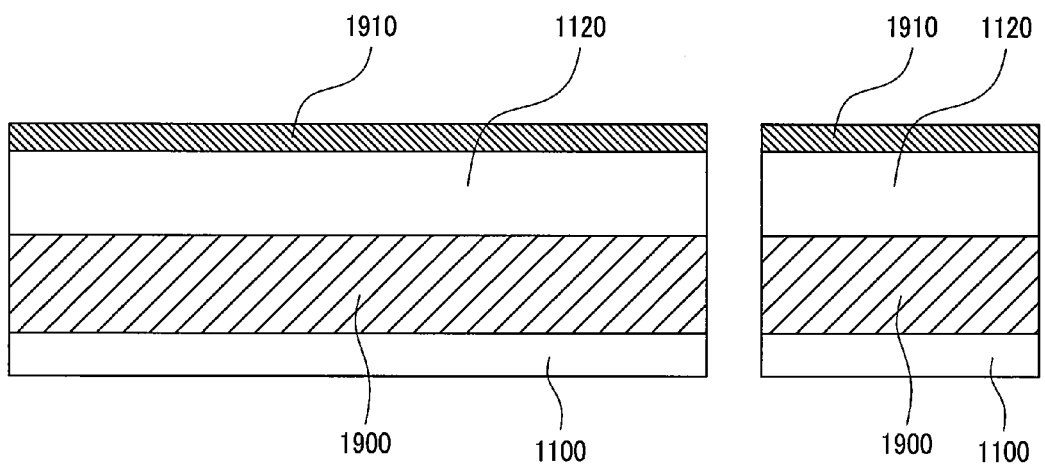
FIGS. 13 through 18 are schematic cross-sectional views of an integrated light emitting diode for explaining the fabricating process of the device according to the first embodiment of the present invention.
Figure 14:
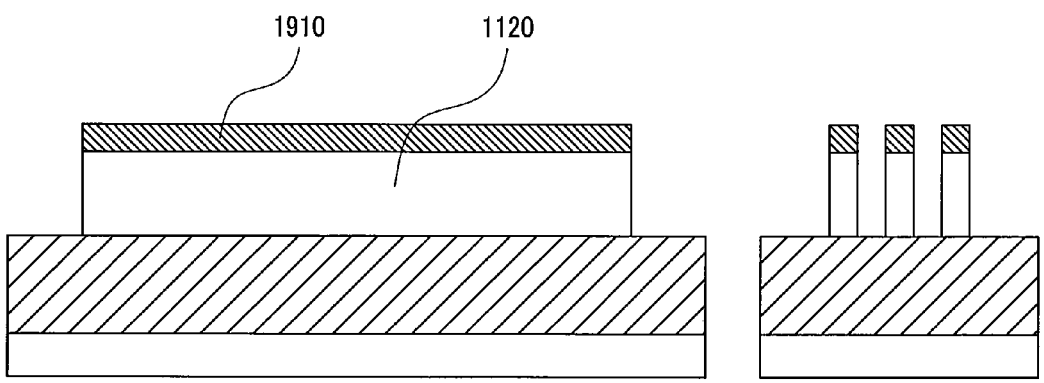
Figure 15:
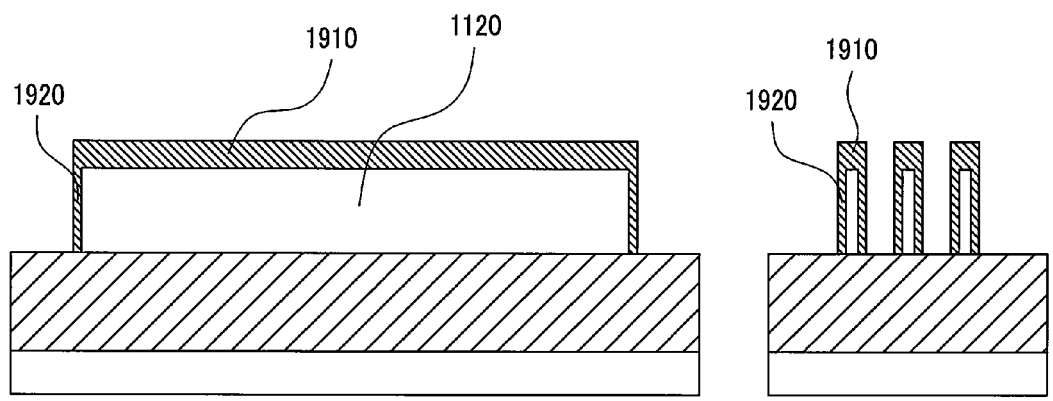
Figure 16:
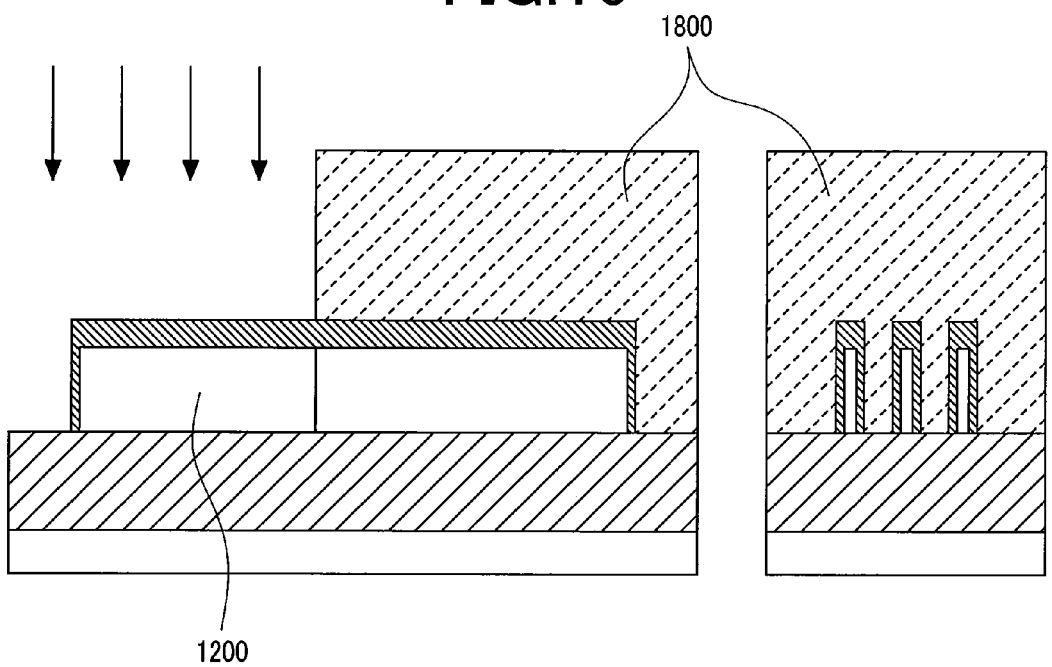

A 1 µm thick silicon oxide film 1900 is formed on a silicon support substrate 1100 and an SOI wafer having a 100 nm thick single crystalline silicon layer 1120 is thermally oxidized on the silicon oxide film, to form a 20 nm oxide film (FIG. 13). A silicon thin film formation region (fin) and a contact region are formed (FIG. 14) by using an active region pattern 1150 shown in FIG. 11. Hereinafter, a thin film-shaped, single crystalline region formed in perpendicular to the substrate is called a fin. A silicon surface exposed towards the side of the fin is thermally oxidized (1920) to set the silicon width formed by the fin to a predetermined thickness (5 nm). At this time, the crystal orientation of the SOI wafer is set to make the exposed silicon surface become a plane 100 (FIG. 15). A resist mask 1800 is formed by a hole pattern 1850 of FIG. 11, and arsenic is doped by ion implantation method with energy 25 keV and $2 \times 10^{15}$ cm$^{-3}$ to form an N-type impurity diffusion layer 1200 (FIG. 16). Next, although not shown, a resist mask formed by inverting the pattern 1850 is formed, and boron is doped by ion implantation method with energy 5 keV and $2 \times 10^{15}$ cm$^{-3}$ to form a P-type impurity diffusion layer 1300. In this way, a diode having a PN junction is formed. In order to set a desired electric field, a P-N distance may be adjusted to form an i-region between P and N wells, instead of using the inverted mask as in this embodiment.

Figure 17:
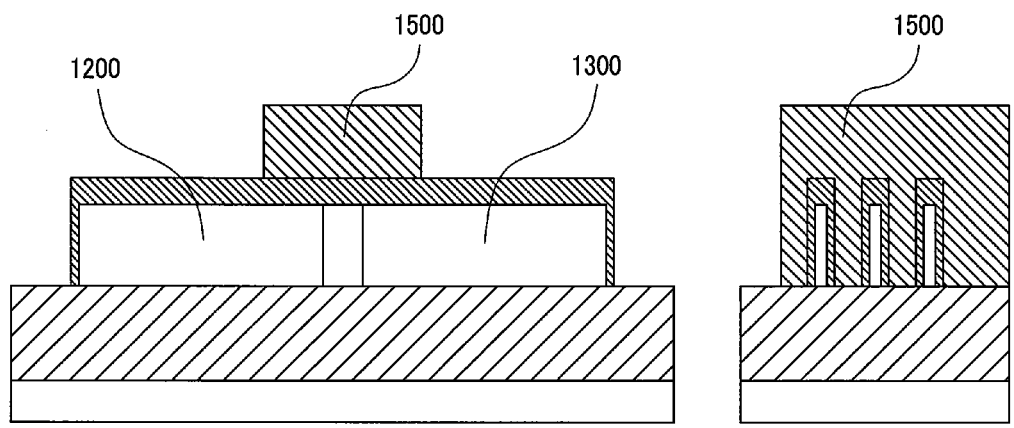
Figure 18:
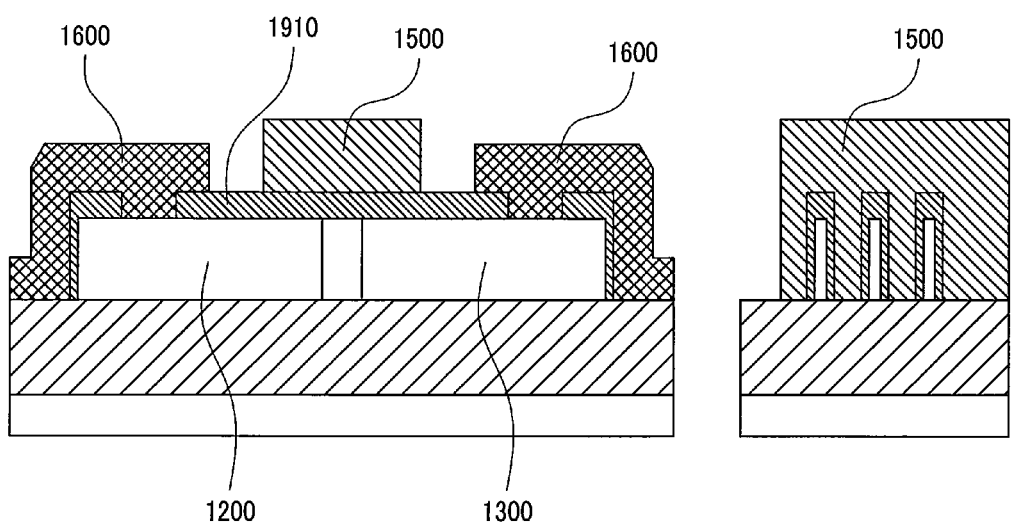

A 300 nm silicon nitride film is deposited by CVD method, and a waveguide 1500 is processed by using a waveguide pattern 1550 of FIG. 11. In this configuration, parallely arranged fins are coated with the waveguide 1500. Here, the term 'waveguide' is not limited to a single wavelength, but used as a light path in a broad sense (FIG. 17).

A contact hole 1650 (FIG. 11) is formed in the oxide film 1910 to form a metal wiring 1600 (not shown in FIG. 11).

With wiring in the P and N regions, a forward bias can be applied to the PN junction. This enables to obtain the luminescence at a junction inside the parallely arranged fins. In case of arranging a plurality of fins, they are spaced away from each other by a half wavelength to more effectively increase luminescence. Moreover, this structure may be covered with a reflection film (to be described) for laser oscillation.

Figure 19:
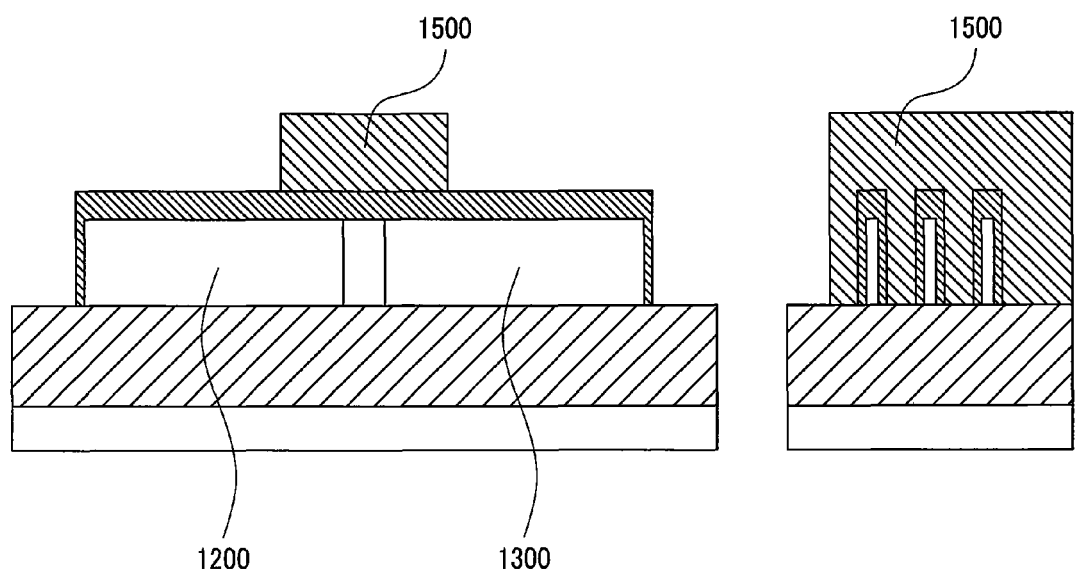
FIGS. 19 through 22 are schematic cross-sectional views of an integrated light emitting diode for explaining other exemplary fabricating processes of the device according to the first embodiment of the present invention.
Figure 24:
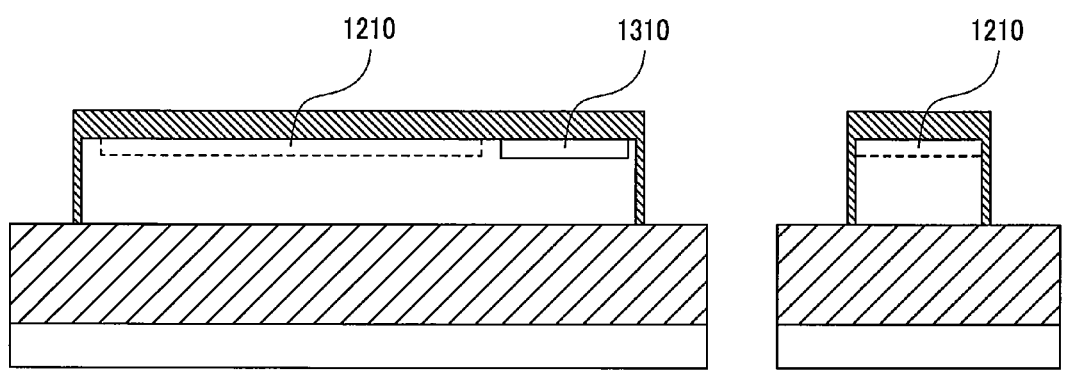
Figure 25:
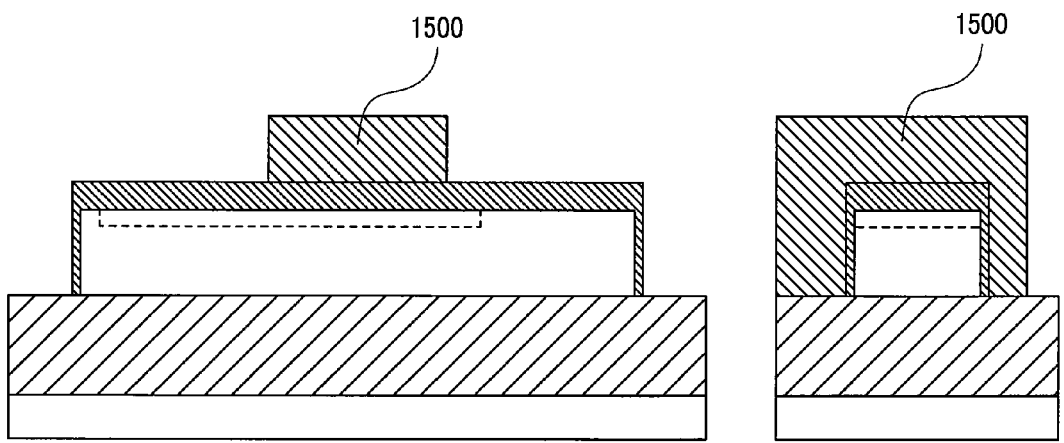
Figure 26:
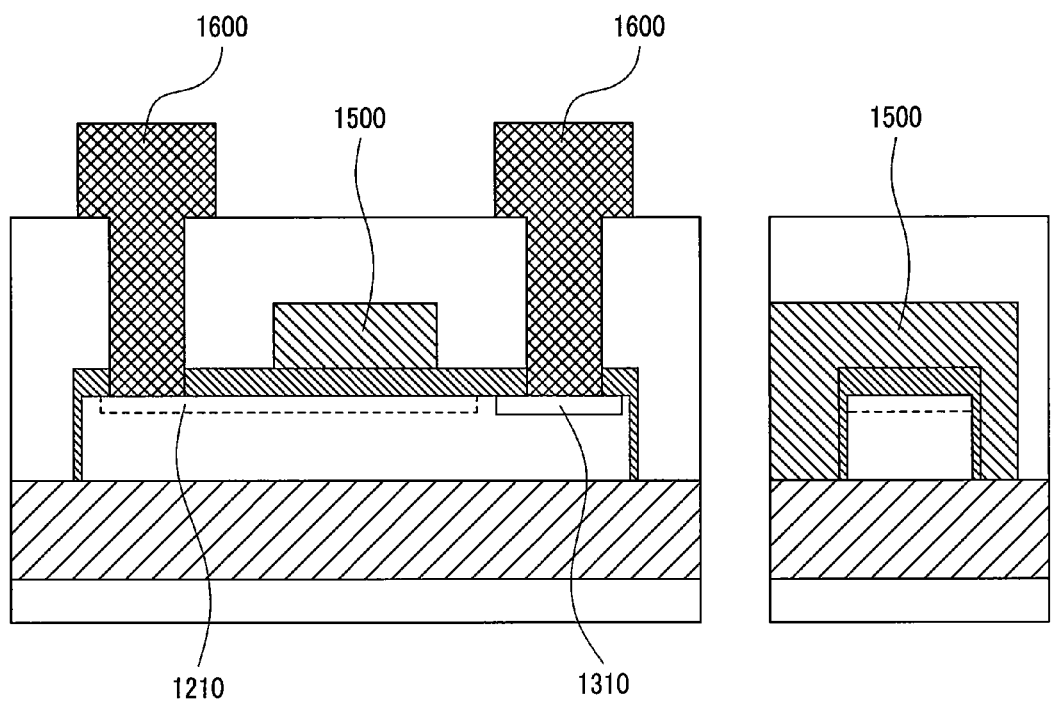

In this embodiment, the waveguide was put in the air, and a difference in refractive index between the silicon nitride film and the air was utilized to be able to confine light in the waveguide. However, a widely used method in ULSI is sealing a multilayer metal wiring or a chip in a package. To be compatible with this, a method shown in FIG. 19 and FIG. 110 may be used. FIG. 24 shows the results obtained in the process of FIG. 17. Thereafter, a silicon oxide film 1930 is deposited to 1 µm and polishing by CMP is carried out to planarize it. At this time, since the waveguide is made out of a silicon nitride film, the silicon oxide film having a relatively lower refractive index than the nitride film can act as a reflection coating. A contact hole is perforated into a corresponding oxide film to form a metal wiring 1600. In this manner, an integrated light emitting diode and a waveguide compatible with the prior art ULSI may be formed.

Figure 21:
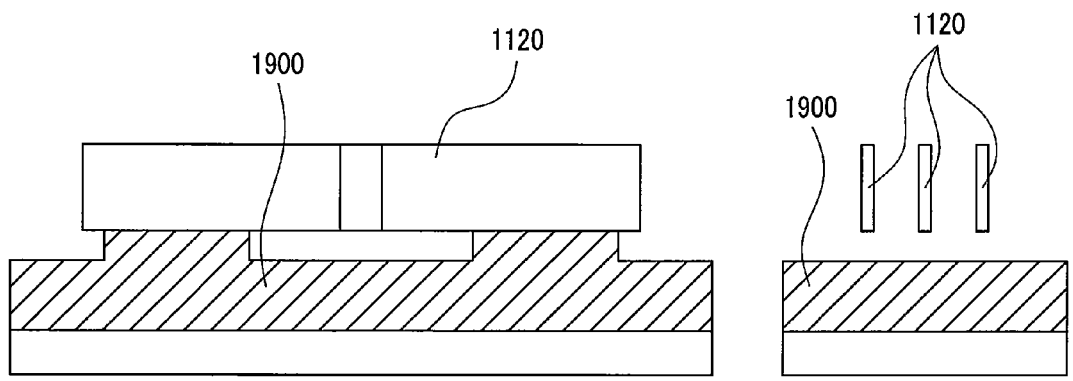
Figure 22:
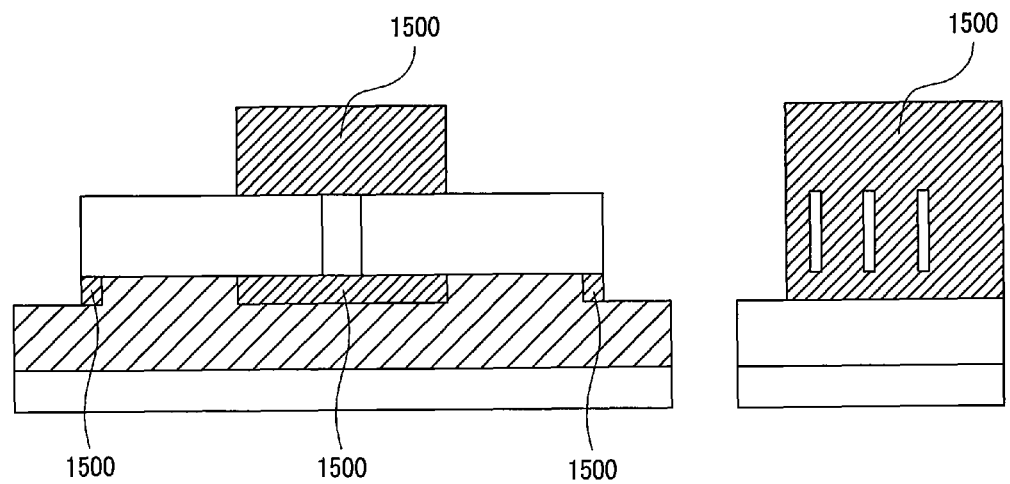
Figure 23:
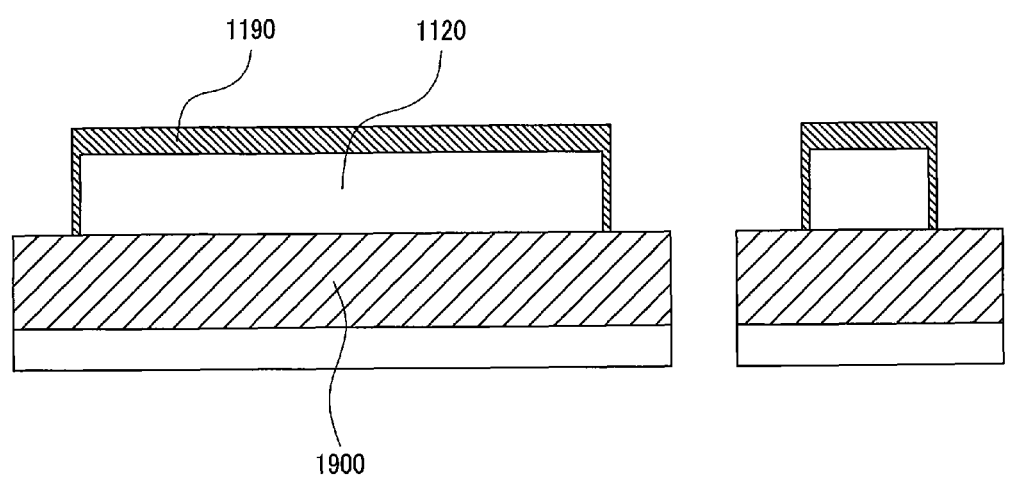
FIGS. 23 through 27 are schematic cross-sectional views of a light receiving element for explaining the fabricating process of the device according to the first embodiment of the present invention.

FIGS. 21 and 22 show other waveguide connecting configurations. Following the process shown in FIG. 16, the silicon oxide film 1910 is removed by wet etching in hydrofluoric acid and the BOX 1900 is etched at the same time to remove an oxide film below the fins. At this time, the fin section is separated from the oxide film as shown in the drawing on the right hand side (FIG. 21). As described before, the silicon nitride film is deposited to cover the entire fin section with the waveguide 1500 (FIG. 22).

An example of light receiving element is shown. The light receiving element has been used until now. FIG. 12 shows a planar layout of the light receiving element. FIGS. 23 through 26 show the fabricating process in reference to its cross-sectional structure. Because the light emitting diode explained earlier and the light receiving element being explained here are integrated on the same wafer, they are originally formed at the same time. They are separately described for convenience in explaining the structure of the integrated light emitting diode. A P-type doped SOI layer 1120 is processed by using an active region pattern 1160 of FIG. 12. This process (FIG. 23) corresponds to the SOI layer processing illustrated in FIG. 14. Hereinafter, reference numerals of corresponding processes will be referred in the following description.

Figure 20:
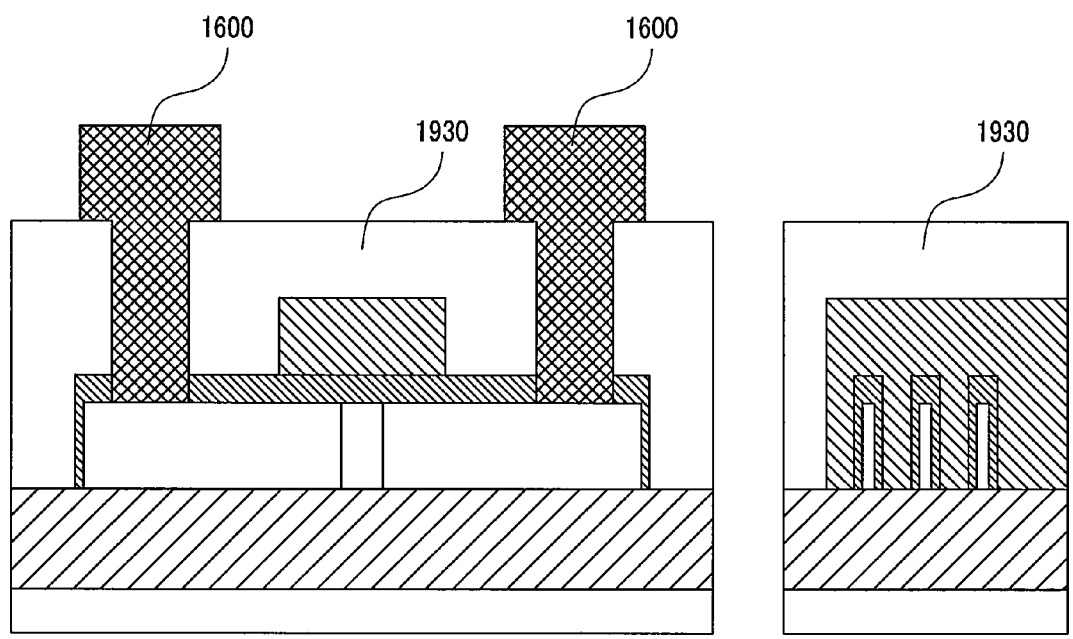
Figure 27:
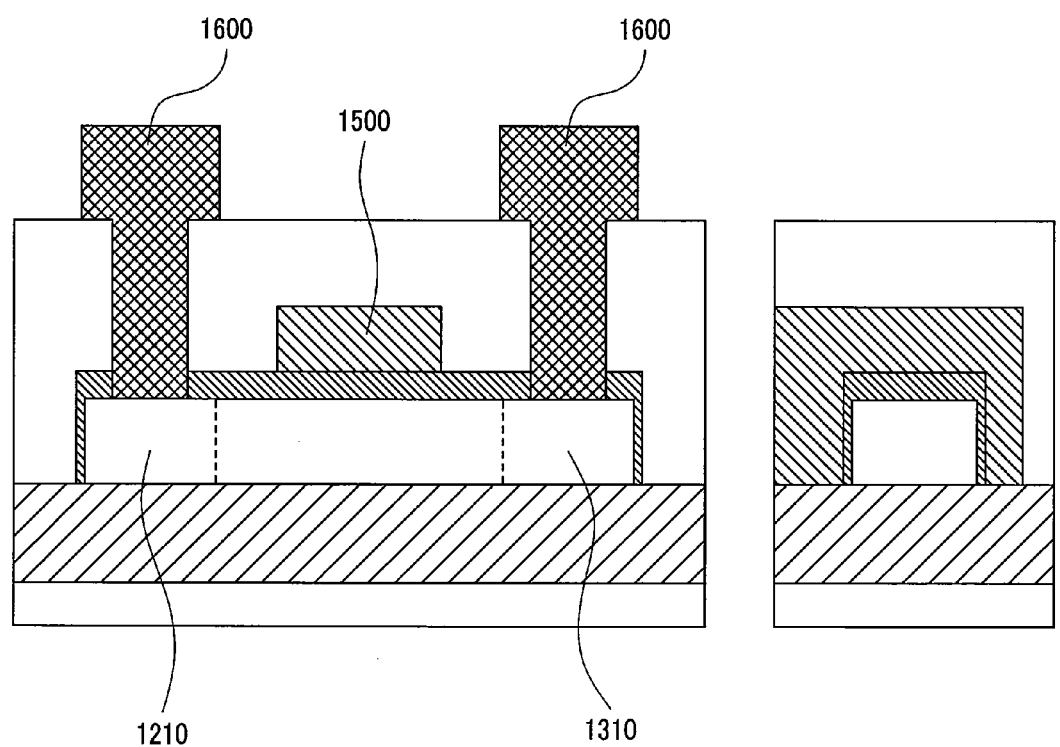

An N-type diffusion region 1210 is formed by using a pattern 1860 in FIG. 12. In addition, a P-type high concentration impurity region 1310 is formed (FIG. 24). A silicon nitride film 1500 waveguide is formed (see FIG. 25 and FIG. 17). A light receiving element is obtained by forming a metal wiring on an electrode layer (see FIG. 26 and FIG. 20). A PN diode of the light receiving element can be arranged in a horizontal direction (FIG. 27). Meanwhile, if the PN diode is arranged in a vertical direction, an electric field region by the PN junction can be great whereas the width of the electric field by the PN junction is limited depending on the film thickness of the SOI layer.

Figure 28:
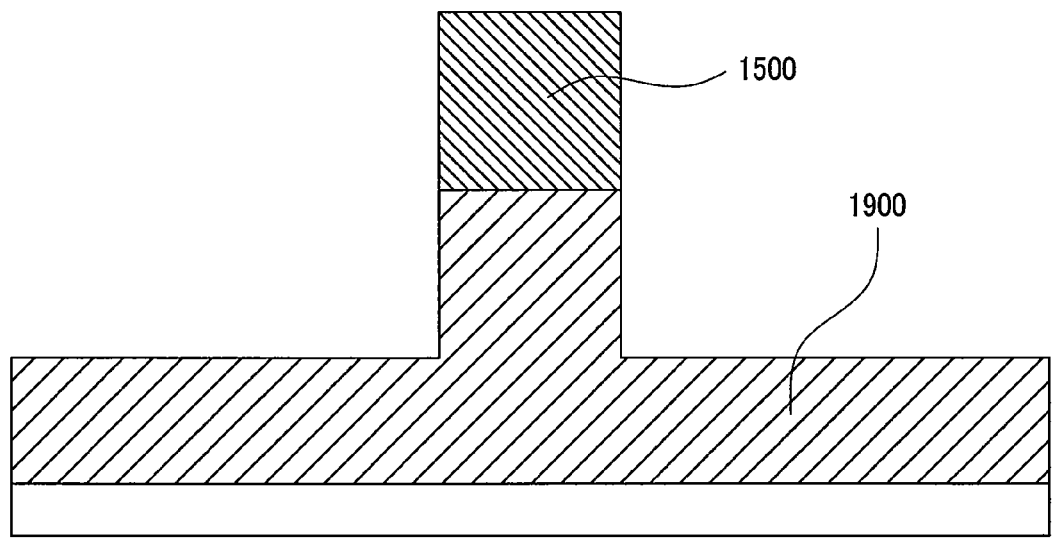
FIGS. 28 and 29 are schematic cross-sectional views for explaining the fabricating process of a waveguide according to the first embodiment of the present invention.
Figure 29:
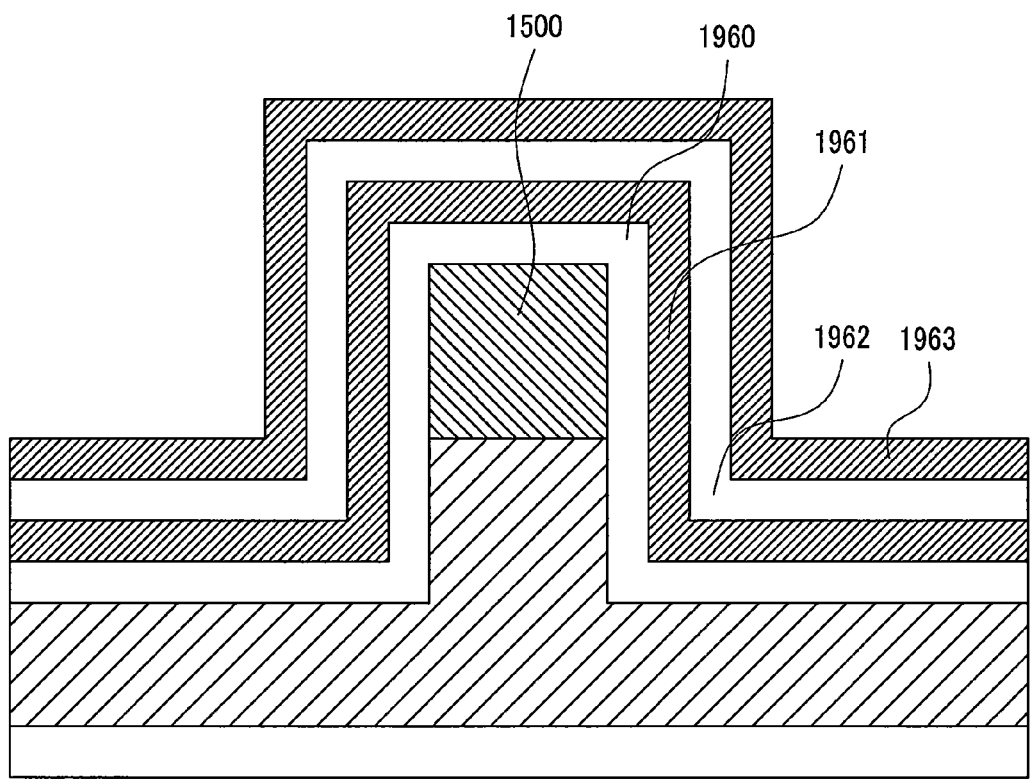

The structure using the SOI wafer explained here is characterized by having a sufficiently thick BOX 1900. Therefore, this oxide film may be utilized even for the formation of the waveguide 1500. As shown in FIG. 28, the BOX 1900 is processed concurrently with the processing of the waveguide 1500 to obtain a convex shape. A silicon oxide film 1960, a silicon nitride film 1961, a silicon oxide film 1962, and a silicon nitride film 1963 are laminated by CVD to form a high reflection film (HR film), and a clad having the waveguide 1500 as a core layer is formed (FIG. 29). In this way, it becomes possible to trap light in the waveguide 1500 more efficiently. In this case, a well-known HR formation method can also be utilized, wherein the film thickness of a laminate forming the HR is set to ¼ of the wavelength. For example, in case of a 1 µm wavelength, the film thickness of the laminate becomes about 100-200 nm for the silicon nitride film and the silicon oxide film because of refractive index. Since this is done in similar order to the interlayer insulation film used for a prior art LSI wiring process, it is rather convenient to apply the prior art formation process. Moreover, stacking a laminate with different refractive index for increasing the reflection efficiency can be done repeatedly without difficulty.

Figure 30:
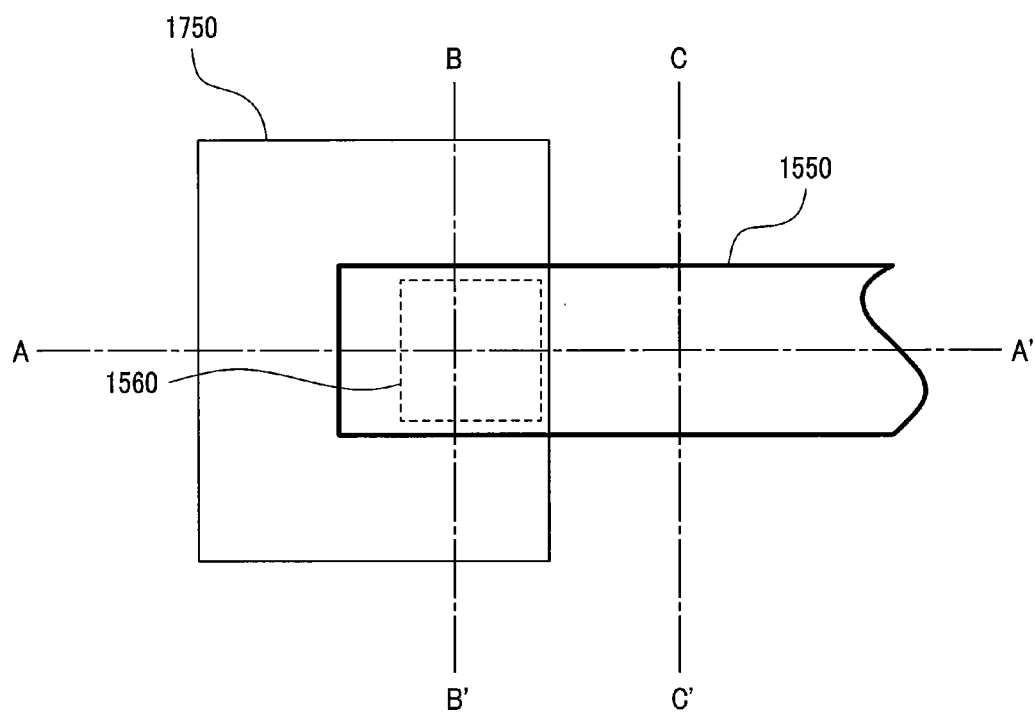
FIG. 30 is a planar layout for explaining other exemplary fabricating processes of the waveguide according to the first embodiment of the present invention.
Figure 31:
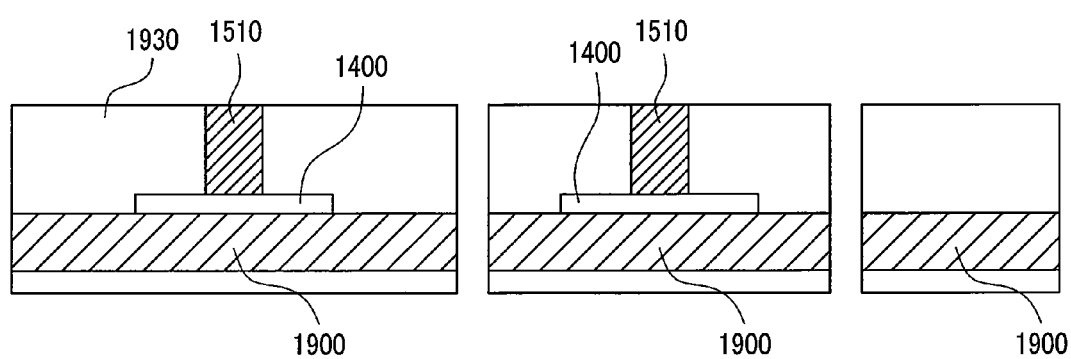
FIGS. 31 through 36 are schematic cross-sectional views for explaining other exemplary fabricating processes of the waveguide according to the first embodiment of the present invention.
Figure 32:
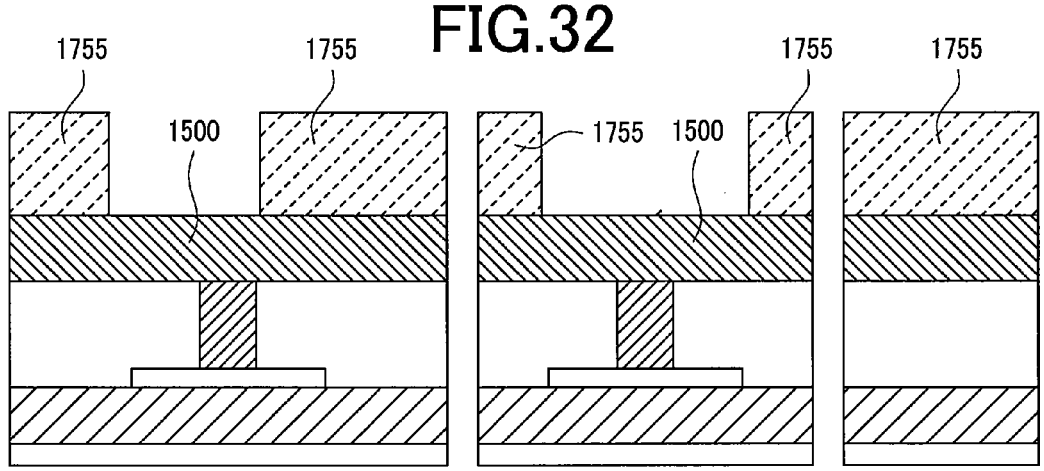
Figure 33:
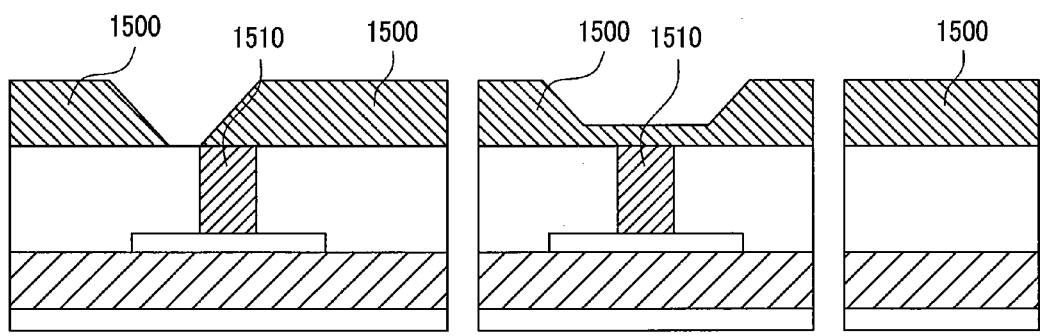
Figure 34:
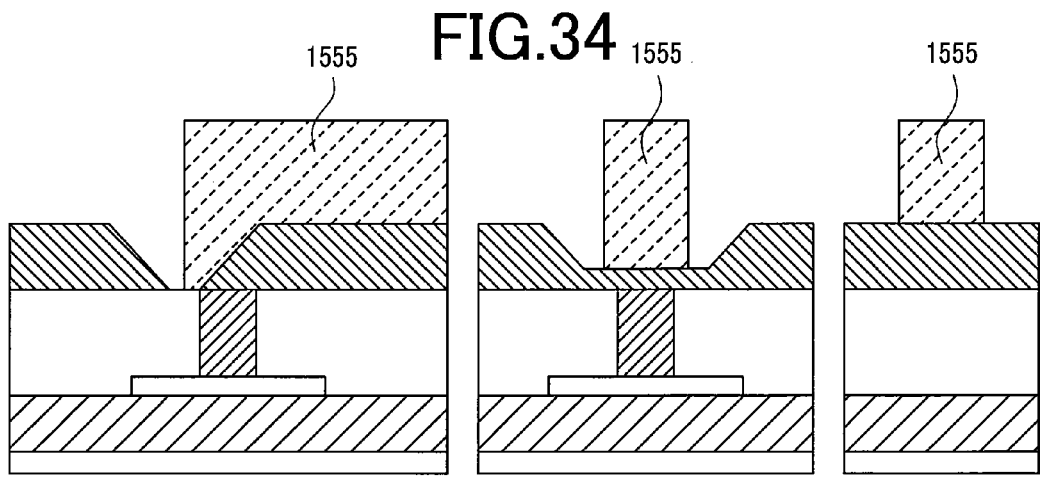

Sometimes light traveling direction needs to be changed especially when a light emitting diode and a light receiving element are integrated and signal transfer by light is carried out via waveguide. As a representative example, in case that a waveguide is taken out of the integrated light emitting diode in the perpendicular direction to the substrate plane and then pulled in parallel to the substrate plane, the connection part is raised. This structure can equally be applied to the light receiving element. FIG. 30 shows a planar layout of an exemplary withdrawal portion, and FIGS. 31 through 41 stepwisely show the fabricating process in reference to the cross-sectional structures taken along lines A-A', B-B', and C-C' in FIG. 30. In the drawings, A-A' is shown on the left, B-B' is shown on the center, and C-C' is shown on the right. In the cross-sectional structure, the integrated light emitting diode region or the light receiving element region is shown diagrammatically with reference numeral 1400. FIG. 31 shows the formation of a nitride film plug, wherein a light emitting element is formed, and the silicon oxide film 1930 is deposited, planarized by CMP, and perforated by a waveguide withdrawal pattern 1560 of FIG. 30. Finally, the silicon nitride film 1510 is deposited and etched back. It is also possible to utilize the CMP method instead of an etch back technique for this process. The silicon nitride film functioning as a waveguide is deposited by CVD, and a resist pattern 1700 of FIG. 32 is formed by using 1750 shown in FIG. 30. A nitride film 1500 is then dry etched by using the resist pattern. At this time, etching conditions are selected to create a deposition atmosphere for the reaction product, to thereby make the processed side in an inclined form (FIG. 33).

Figure 35:
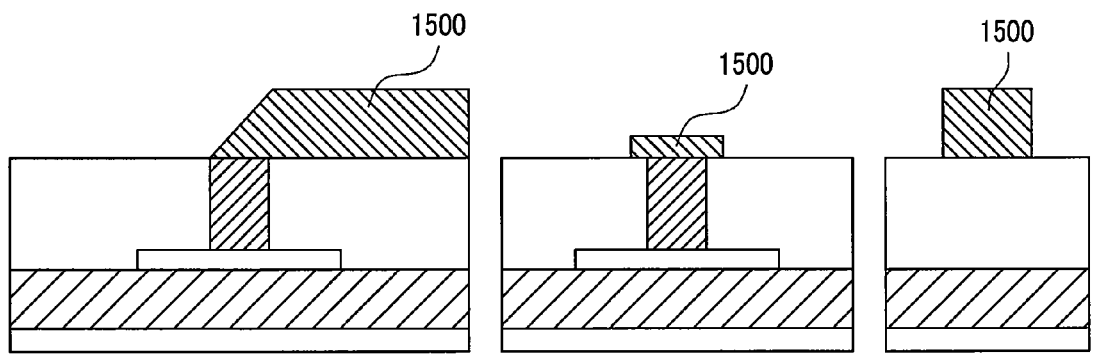
Figure 36:
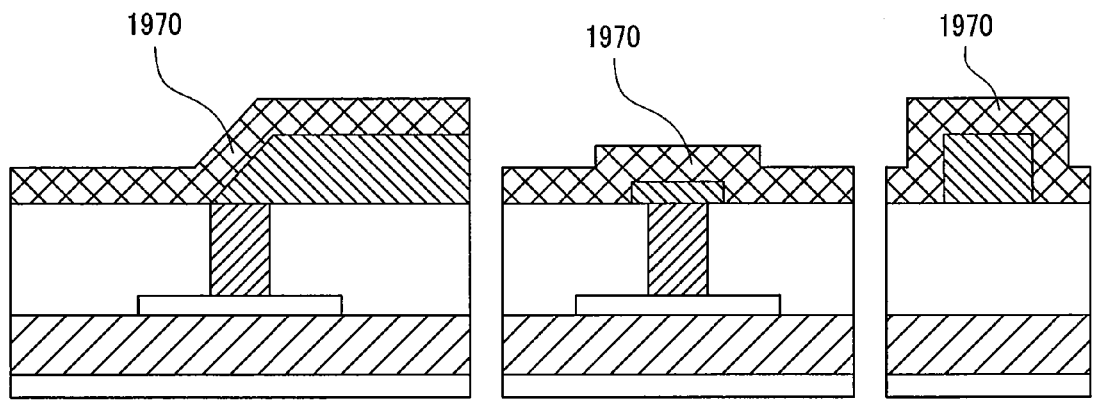

A resist 1555 is formed (FIG. 34) by the waveguide pattern 1550 of FIG. 30. The silicon nitride film 1500 is processed by using the resist 1555 as a mask (FIG. 35). The high reflection film 1970 which is a laminate of the silicon oxide film and the silicon nitride film is deposited to cover the waveguide 1500. Here, the silicon oxide film and the silicon nitride film have refractive index of about 1.5 and 2, respectively. Moreover, by employing silicon oxy-nitride (SiON) whose composition contains nitrogen in the silicon oxide film, refractive index from the silicon oxide film to the silicon nitride film can be designed. As such, a horizontal waveguide 1500 placed over the vertical waveguide 1510 and the oxide film 1930 is connected at an angle, i.e., with a 45-degree reflective plane. A light that is propagated in the normal direction from the integrated light emitting diode to the substrate plane can travel in a different direction, such as, in the direction parallel to the substrate plane. Although this embodiment illustrated the connection from the integrated light emitting diode, the same structure may also be formed in the light receiving element section.

Figure 37:
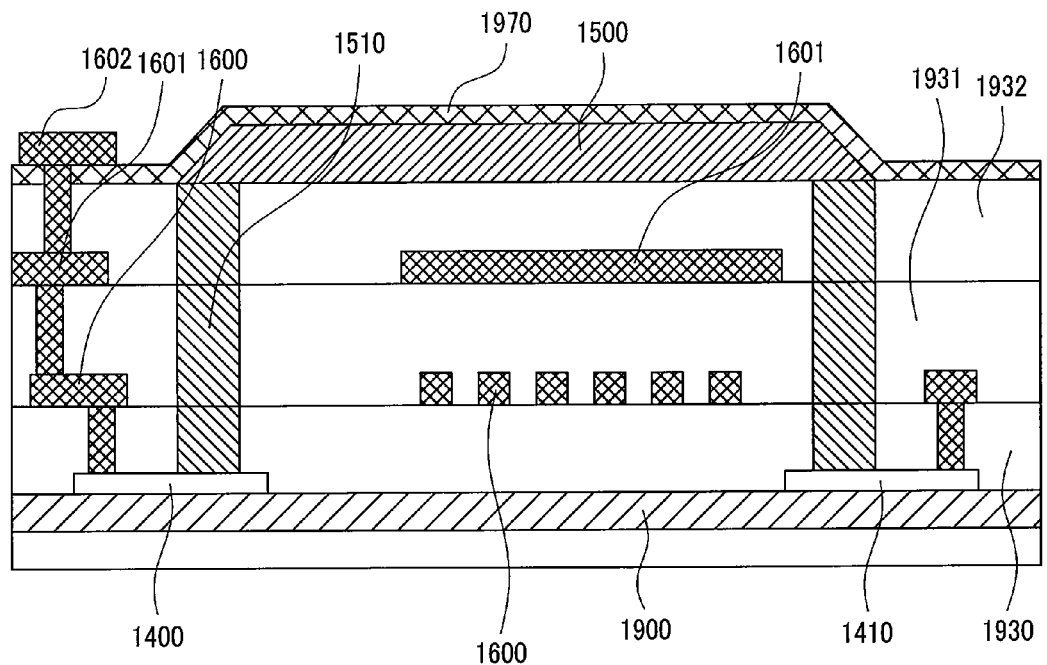
FIGS. 37 and 38 are schematic cross-sectional views for explaining the integration of an integrated light emitting diode, a waveguide, and a light receiving element according to the first embodiment of the present invention with a prior art multilayer wiring.

This waveguide formation process is characterized in that it can adopt the ULSI wiring process as it is. This is shown in FIG. 37 by using the cross-sectional structure, which diagrammatically shows a ULSI wiring with a wide metal multilayer wire. The drawing also shows an integrated light emitting diode 1400 and a light receiving element 1410 formed on the BOX 1900, respectively. As an example of a multi-layer wire, three metal layers 1600, 1601, and 1603 are shown. Each of the interlayer insulation films is denoted by reference numerals 1930, 1931, and 1932. Insulation films of the silicon oxide and silicon nitride are used as materials for the waveguide formation process, and they are actually major ingredients during the wiring process up to now. Therefore, they can be introduced to the multi-layer wiring structure of up to now. After the interlayer 1930 is planarized, the vertical waveguide 1510 is formed, similar to the formation of a contact in the metal wiring. This is repeated for every layer of the multi-layer wiring to form a vertical direction waveguide. Needless to say, this can be performed separately from the formation of contact in the metal wiring. Thus, the hole as in the vertical waveguide can be perforated en bloc after the formation of double or multi-layer interlayer film. Because the laminate high reflection layer 1970 can also function as an interlayer insulation film, as shown in the drawing, the metal wiring 1602 can be put on the clad 1970.

Figure 38:
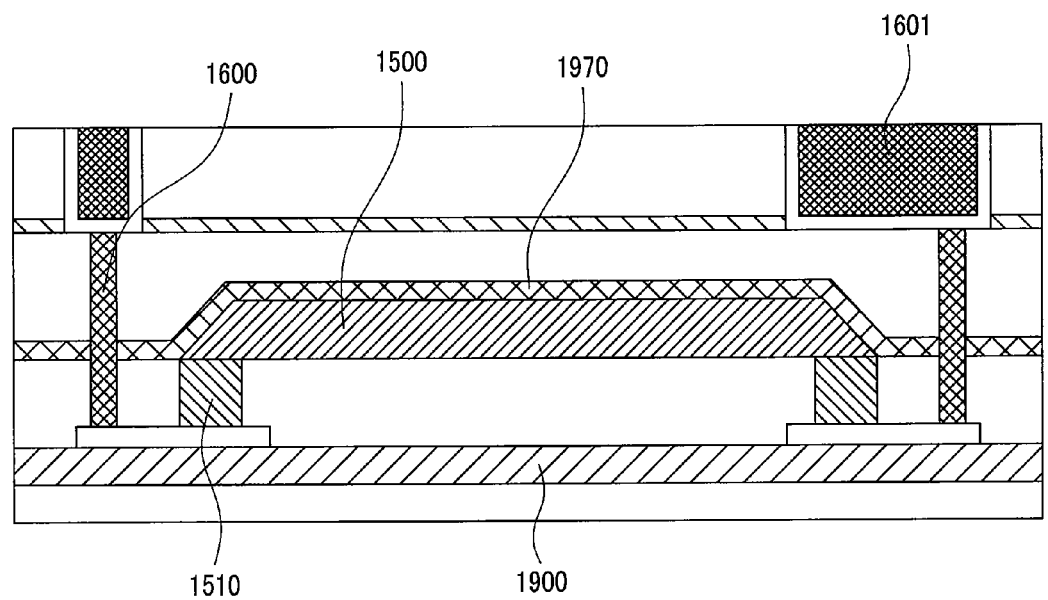
Figure 39:
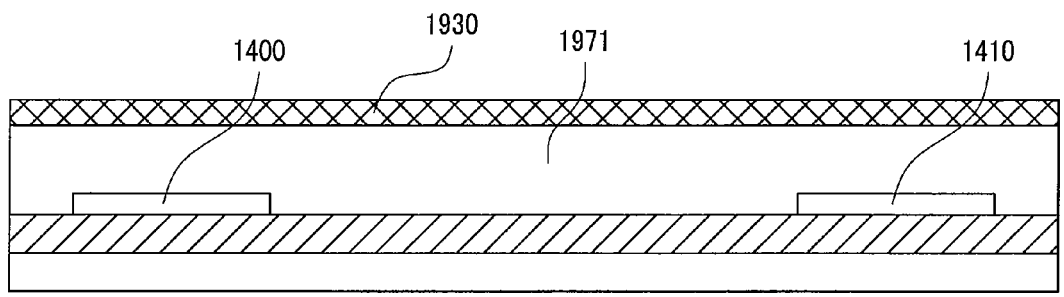
FIGS. 39 through 42 are schematic cross-sectional views for explaining the fabricating process that involves the integration of an integrated light emitting diode, a waveguide, and a light receiving element according to the first embodiment of the present invention with a prior art multilayer wiring.

FIG. 38 illustrates a case where a waveguide is formed below the metal wiring. In the drawing, 1600 denotes a metal plug layer, and 1601 is a metal wiring layer formed by a so-called damascene process. When the waveguide is formed, the metal wiring layer is not yet formed. Thus, a high-temperature deposition technique can be applied to deposit the silicon nitride film used as a waveguide, and the refractive index is easily set.

Figure 40:
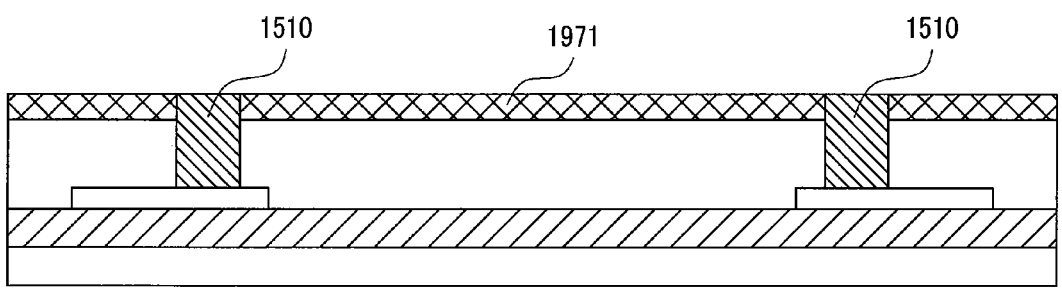
Figure 41:
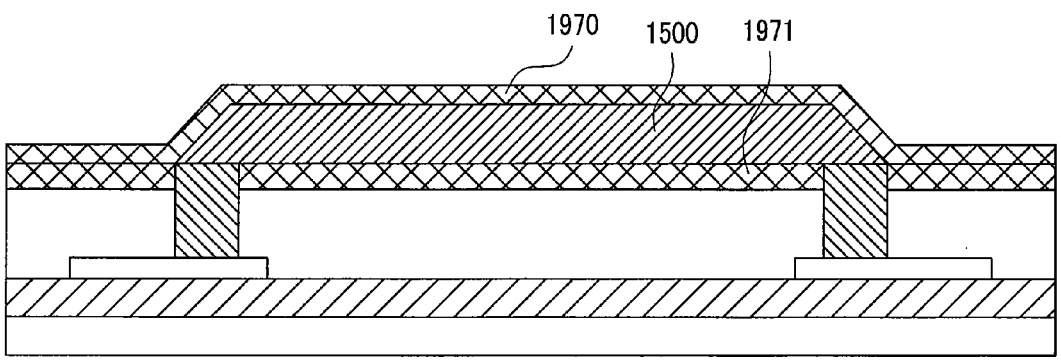
Figure 42:
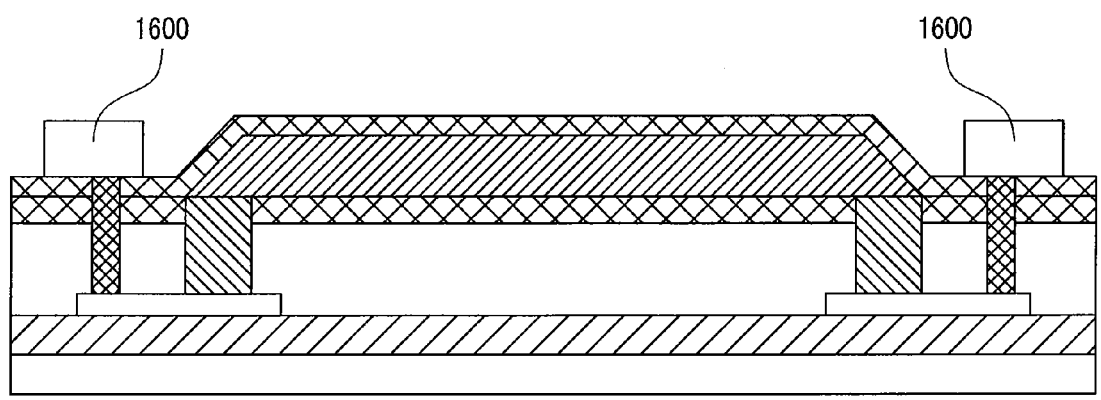
Figure 47:
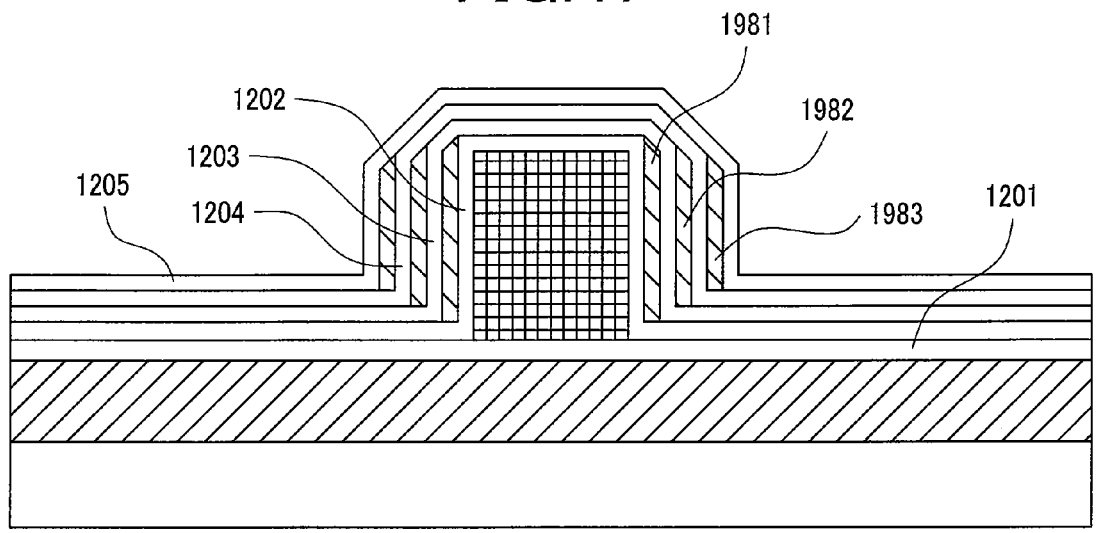

Because the waveguide and the reflection film used here consists of only an insulating matter employed in the prior art silicon process, they can be integrated with the ULSI of up to now. This new structure does not damage electric properties of the ULSI but improves the waveguide properties. FIGS. 39 through 42 stepwisely show the formation of a structure where a waveguide is covered with a high reflection film. An integrated light emitting diode 1400 and a light receiving element 1410 are formed, and a laminate high reflection film 1971 combining an insulating film 1930, a silicon oxide film, and a silicon nitride film (FIG. 39) is formed. A vertical waveguide 1510 is formed (FIG. 40). By using the waveguide formation process illustrated earlier (see FIGS. 31 through 36), a clad 1970 having the waveguide 1500 as a core layer is formed (FIG. 41). FIG. 47 depicts the formation of the metal wiring 1600 in each diode. As the entire area can be covered by the high reflection films 1970 and 1971, it becomes possible to trap light in the waveguide 1500 more efficiently.

Embodiment 2

Figure 43:
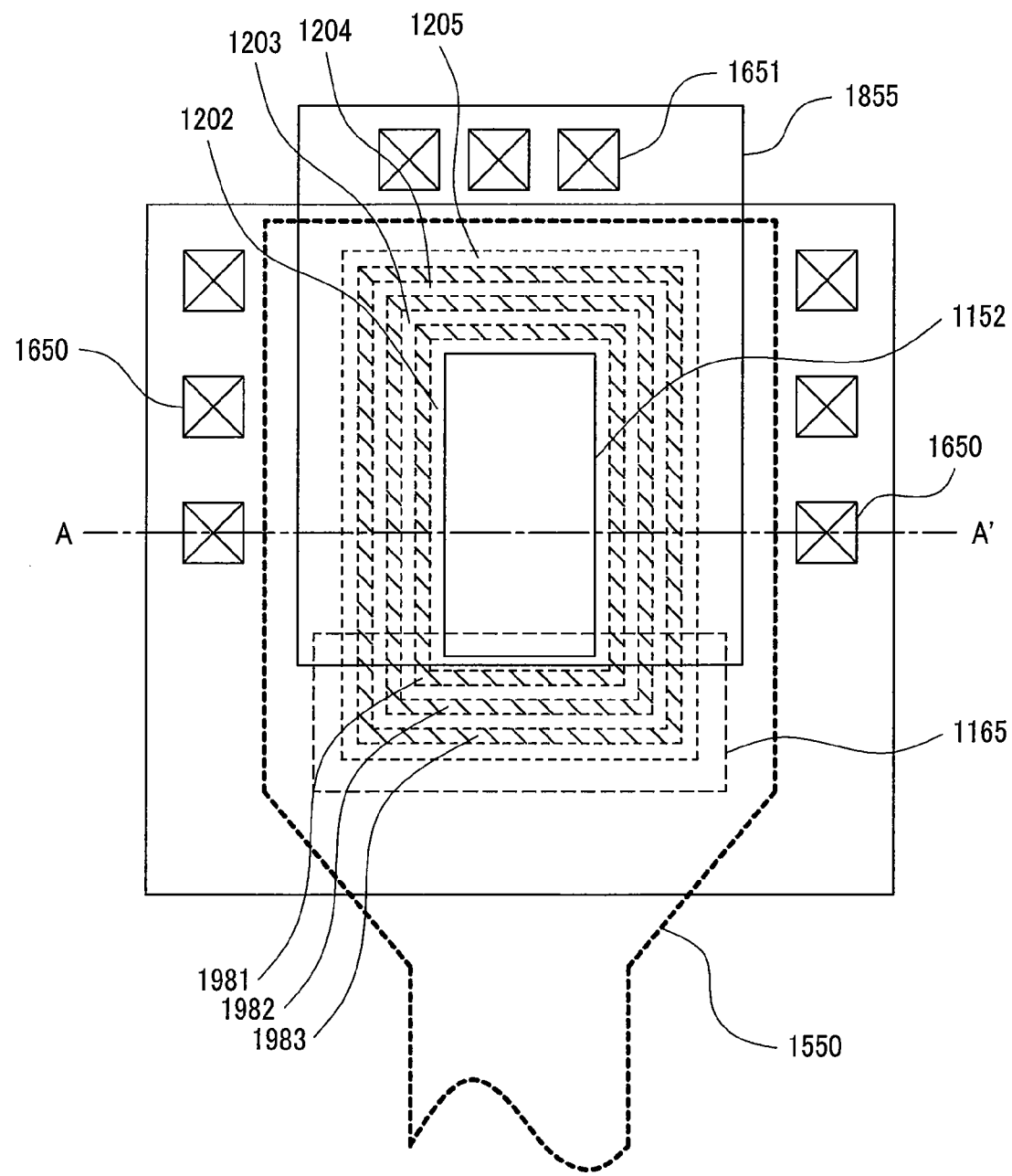
FIGS. 43 and 44 are planar layouts for explaining other exemplary integrated light emitting diodes according to the first embodiment of the present invention.
Figure 44:
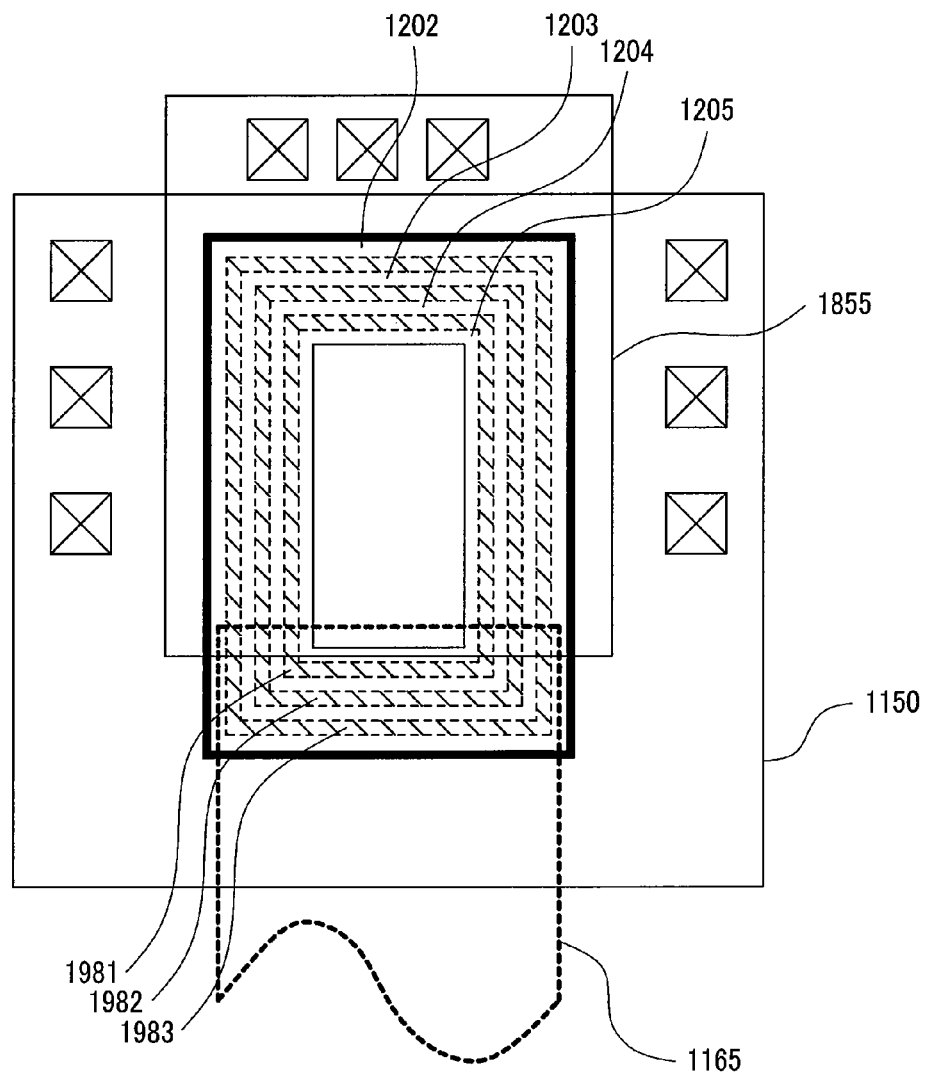

In this embodiment, a plurality of fins are employed as an integrated light emitting diode. The fins can be formed, independently of the patterning. A so-called spacer process is employed as follows. FIG. 43 shows an exemplary planar layout, and FIGS. 45 through 60 stepwisely show the fabricating process by using cross-sectional views (A-A' cross section of FIG. 43). This method is based on a dummy pattern 1152, but the dummy pattern can be arranged in two different forms, i.e., a convex pattern or a hole pattern. FIG. 43 shows a convex pattern, and FIG. 44 shows a hole pattern. According to the fabricating process of this embodiment, after the dummy pattern 1152 of FIG. 43 and FIG. 44 is formed, fins are self-aligned with respect to the dummy pattern. In general, because of the self-alignment, spacers 1202, 1203, 1204, 1205, 1981, 1982, and 1983 used for fin formation are not necessarily found in a photo mask, but they are indicated at pattern positions of the layout after the formation in order to show the arrangement relation.

Figure 45:
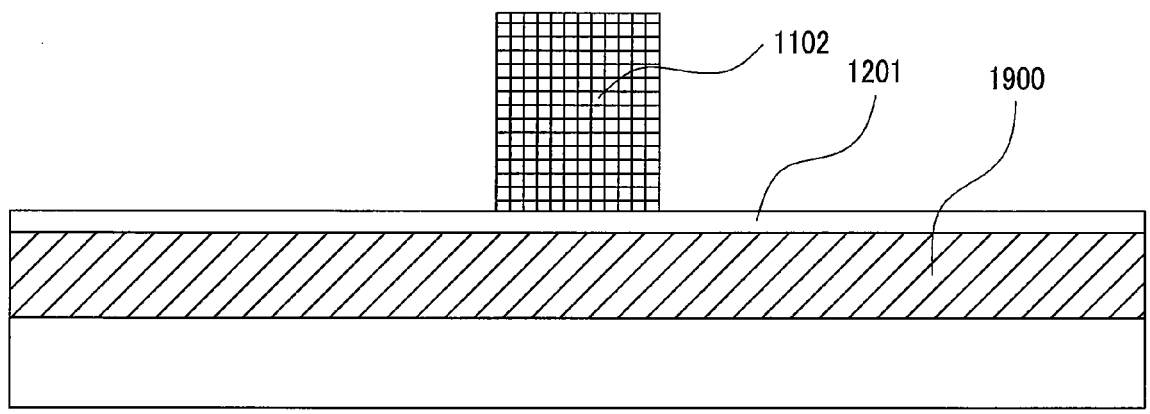
FIGS. 45 through 57 are schematic cross-sectional views for explaining other exemplary fabricating processes of an integrated light emitting diode according to the first embodiment of the present invention.

Referring now to FIG. 45, a 300 nm silicon nitride film is deposited on a 50 nm thick SOI 1201, and a convex shape pattern is formed by the hole pattern 1152 shown in FIG. 43. Here, the convex shape looks like a projected shape 1102 formed on the plane in the cross-sectional view. Meanwhile, if the hole pattern 1152 of FIG. 44 is used, a concave shape is formed instead of the convex shape. Although the process described hereinafter is provided, assuming that the convex pattern is used, the same process is equally applied when the hole pattern is used.

Figure 46:
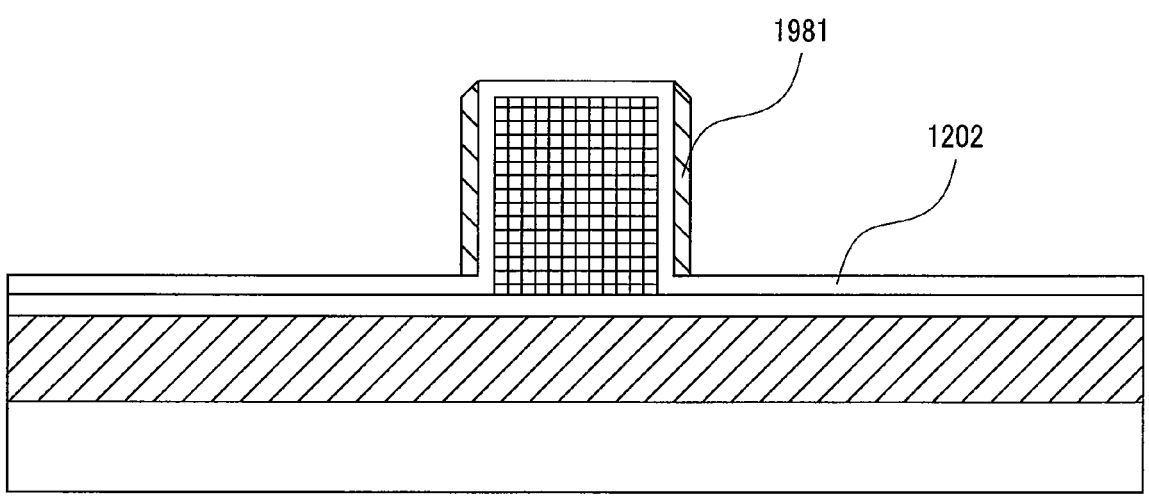

Referring to FIG. 46, an amorphous silicon 1202 is deposited to a thickness of 10 nm and heated to be crystallized. Because crystal growth occurs in a seed layer of single crystalline silicon 1201, single crystals 1201 having crystal orientation are obtained below the side of the projected shape 1102. In this manner, fins are produced. Here, the silicon surface may be thermally oxidized to adjust the film thickness of the fin to a predetermined thickness. The silicon nitride film 1981 is deposited to a thickness of 20 nm and etched by anisotropic dry etching by the deposition thickness to form the silicon nitride film 1981 in side wall spacer shape.

In FIG. 47, the process explained above is repeated to obtain a laminate structure consisting of thin, amorphous silicon layers 1203, 1204, and 1205 and the nitride film spacers 1982 and 1983.

Figure 48:
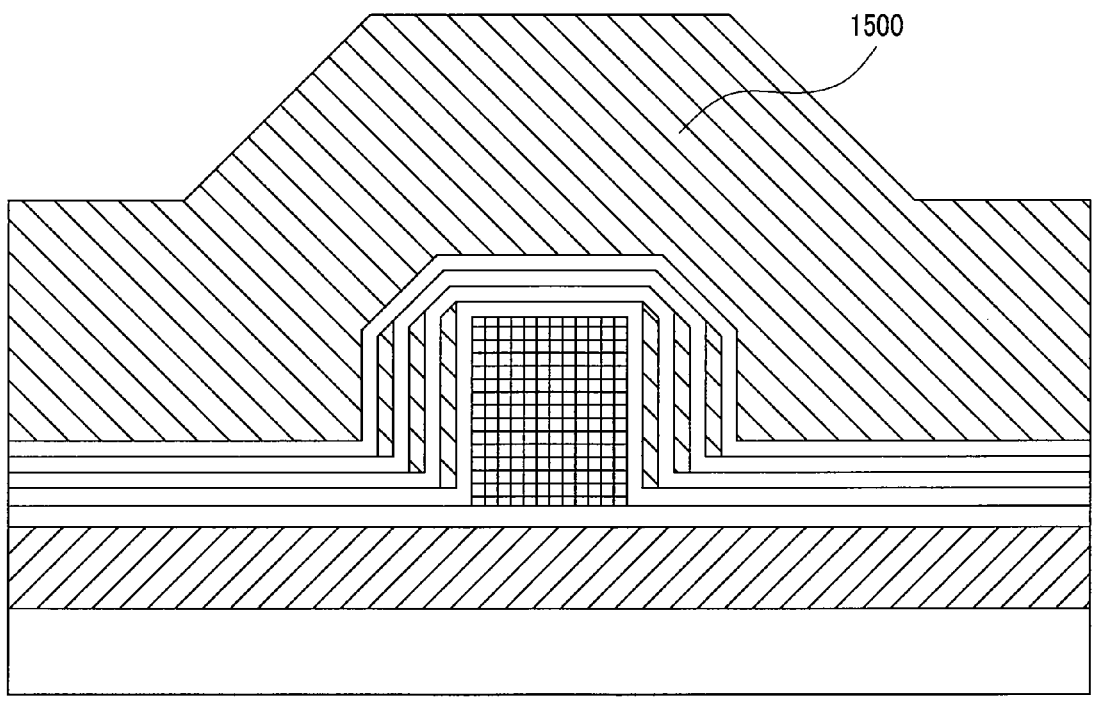

In FIG. 48, a photoresist hole pattern is formed by using the pattern 1165 shown in FIG. 43 to etch the laminate film of the silicon nitride film and the silicon thin film and expose the BOX 1900 (not shown). The silicon nitride film 1500 is then deposited to a thickness of 500 nm to cover the integrated light emitting diode.

Figure 49:
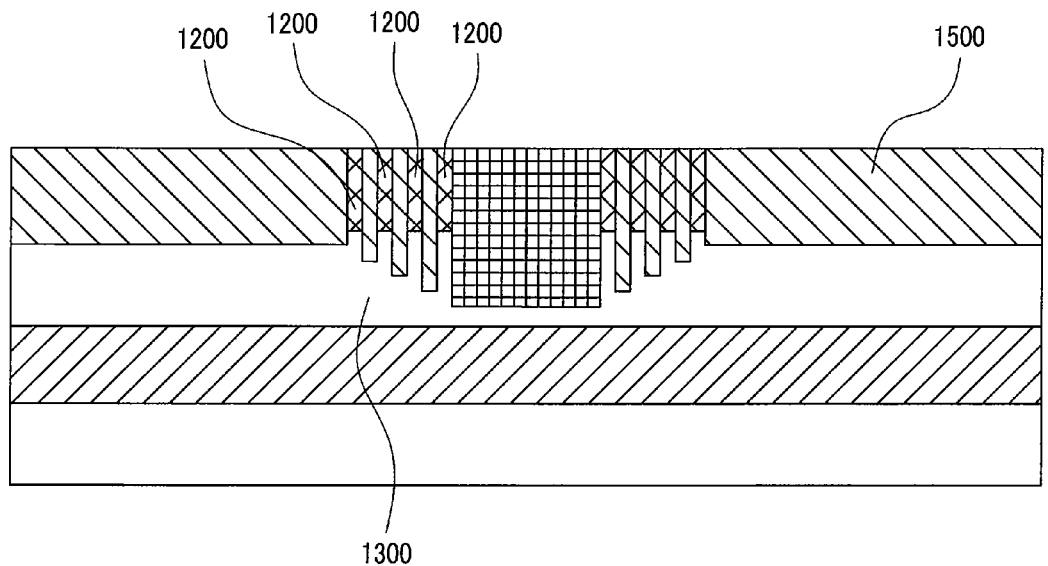

In FIG. 49, the deposited nitride film by CMP is planarized to expose a dummy 1102. By using the pattern 1150 shown in FIG. 43 as a mask, an N-type region is formed below the fin and on the plane 1300 and a P-type region 1200 is formed on the upper portion by ion implantation, so that a PN junction is formed inside the fin in the vertical direction.

Figure 50:
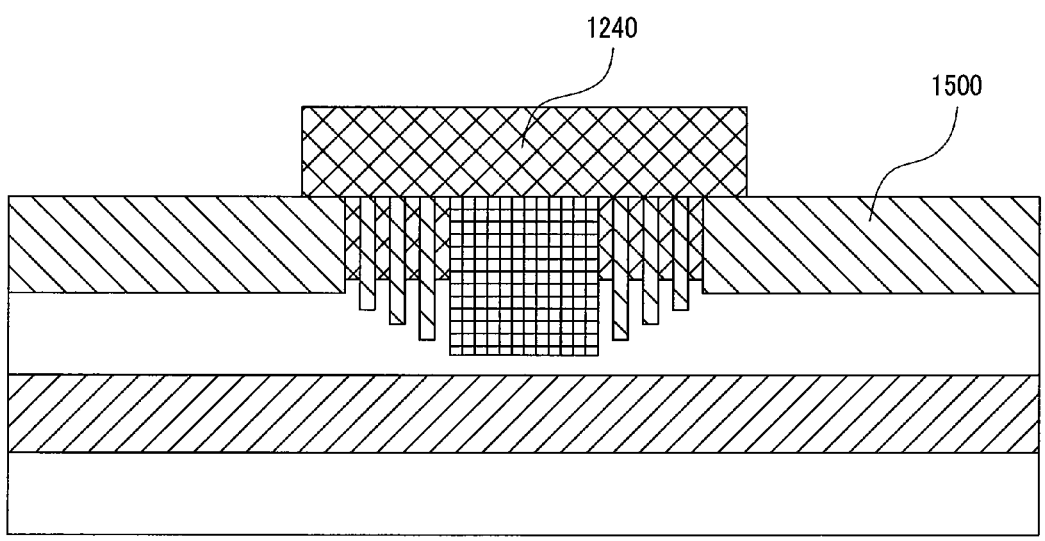

In FIG. 50, a polycrystalline silicon 1240 doped with a P-type high concentration impurity is deposited to a thickness of 50 nm and processed with the pattern 1855 shown in FIG. 43.

Figure 51:
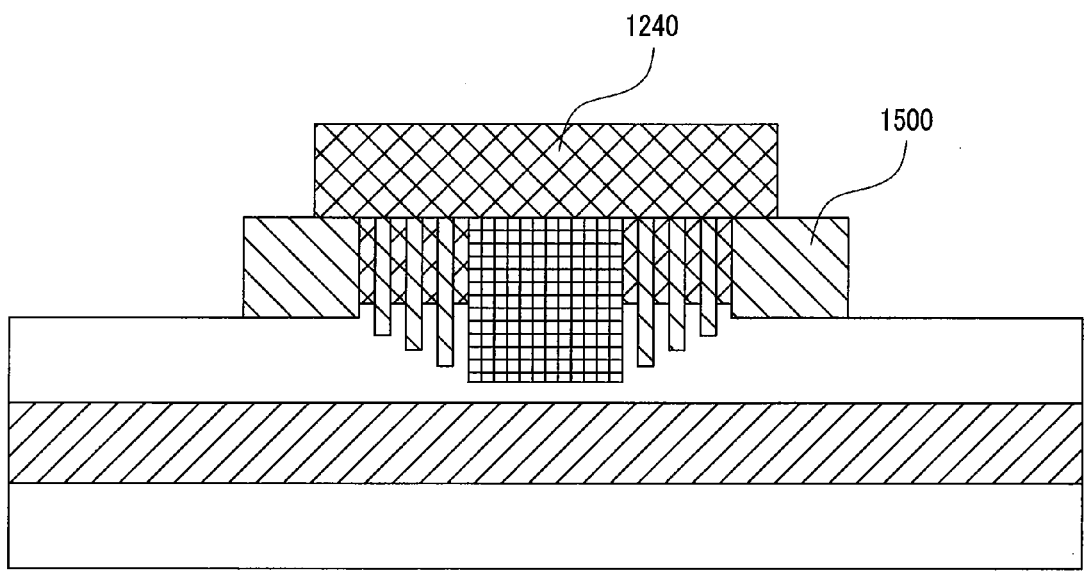

In FIG. 51, the silicon nitride film 1500 is processed by using the waveguide pattern 1550 to form a waveguide. On the other hand, if a hole pattern is used for the formation of a dummy shown in FIG. 44, the processing in use of the pattern 1165 which was explained in reference to FIG. 53 and the formation of the waveguide 1500 can be carried out at the same time. That is, a hole is formed by the pattern 1165 shown in FIG. 44 and the silicon nitride film 1500 is deposited by CMP, to obtain a silicon nitride film waveguide of the hole pattern 1165. In this manner, the formation of the silicon nitride film 1500 having been discussed in FIG. 51 may be omitted.

Figure 52:
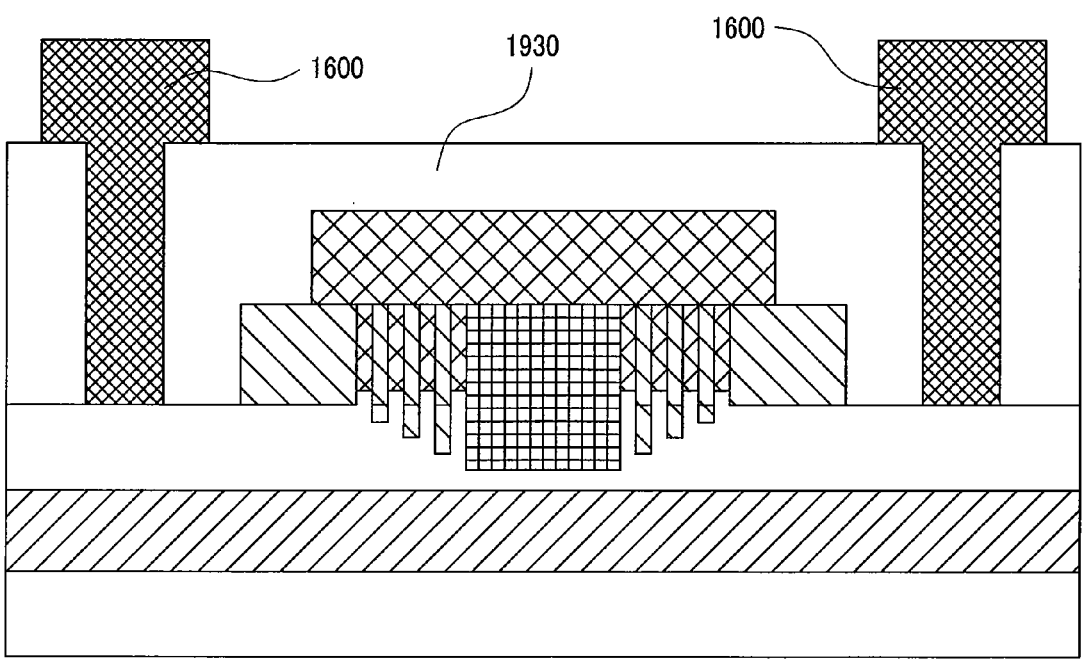

In FIG. 52, the silicon oxide film as an interlayer film is deposited and planarized, followed by performing the metal wiring on each electrode.

Even though the PN junction was formed in the vertical direction to enable high density illumination, the same spacer process can be used to form fins on the SOI substrate by etching.

Figure 53:
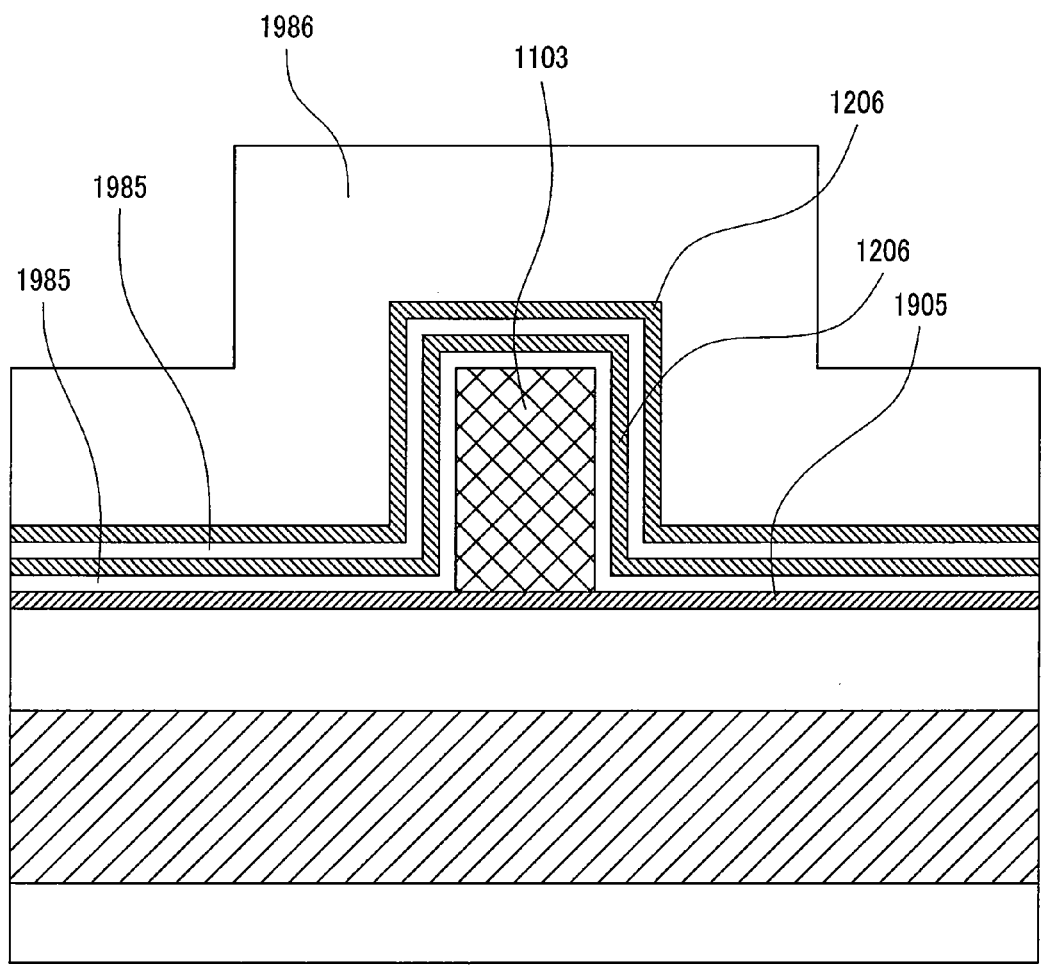

In FIG. 53, the surface of the SOI substrate 1120 is thermally oxidized to form an oxide film 1905 with a thickness of 20 nm. A dummy pattern 1103 is formed by polycrystalline silicon, and the silicon nitride film 1985 and the polycrystalline silicon 1206 are alternately deposited to produce a thick nitride film 1986.

Figure 54:
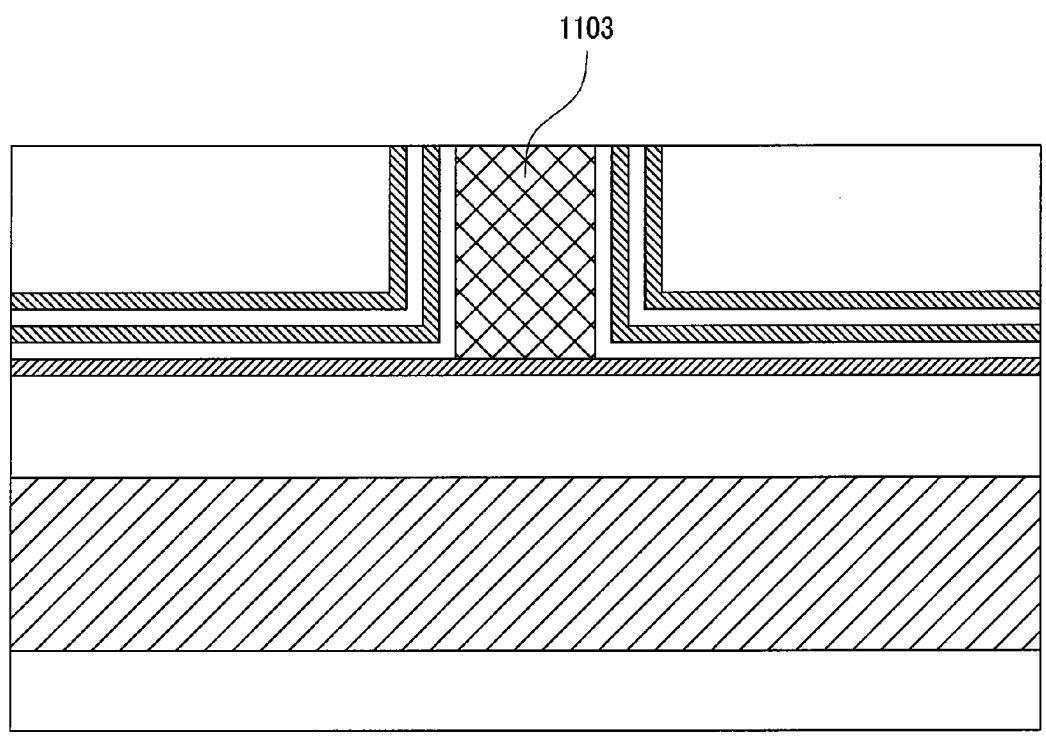

In FIG. 54, a convex region is planarized by CMP to expose an upper portion of the dummy pattern 1103.

Figure 55:
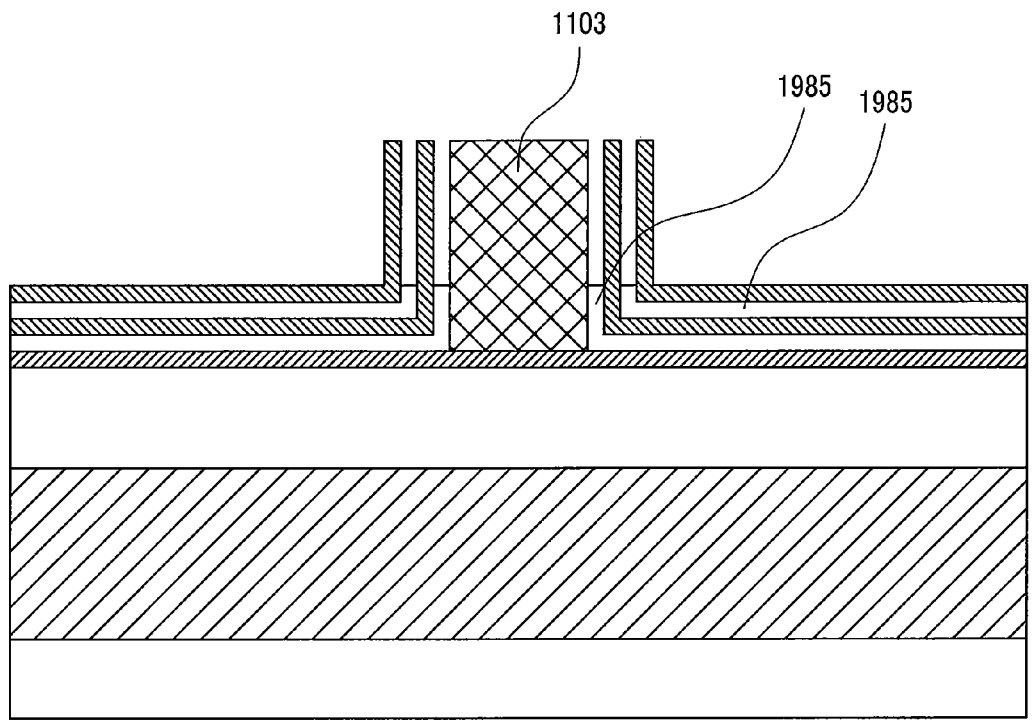

In FIG. 55, the nitride film is etched by wet etching, and a polycrystalline silicon pattern is formed.

Figure 56:
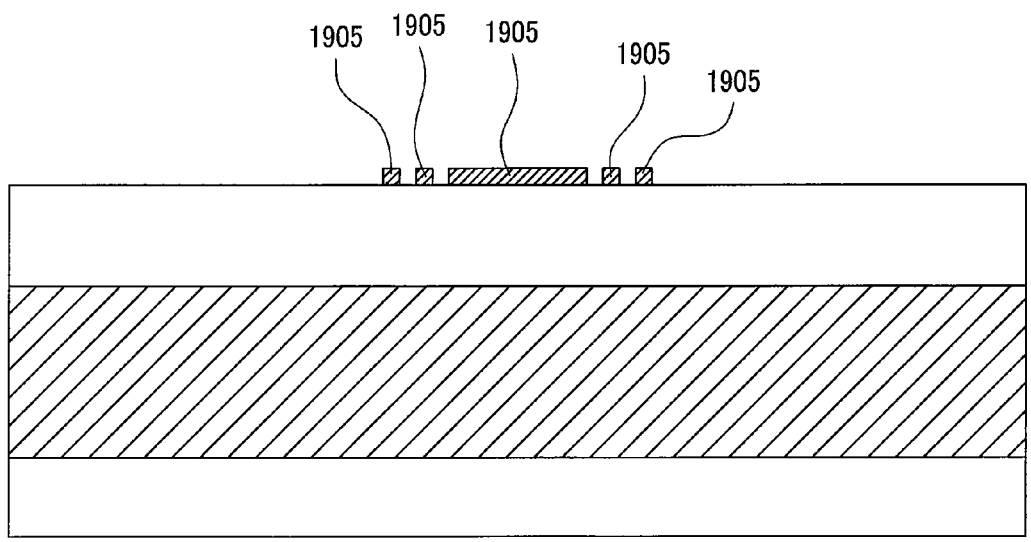

In FIG. 56, a target mask is etched anisotropically and transferred as a pattern to the oxide film 1905.

Figure 57:
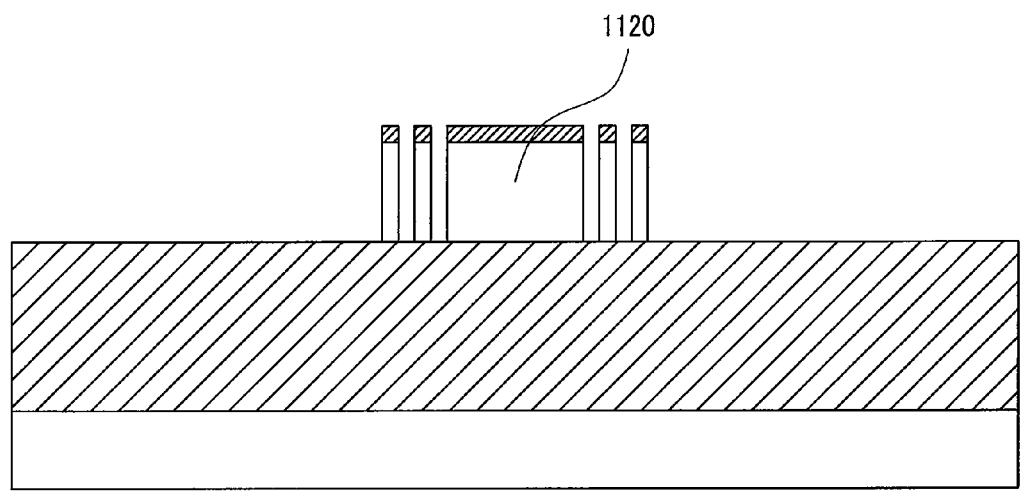

In FIG. 57, the SOI silicon layer is etched by using the oxide film pattern as a mask to obtain a fin pattern.

This fin pattern is preferably used to form a light emitting diode. In this embodiment, a minute fin pattern was obtained by the laminate film. However, as mentioned earlier in reference to FIG. 43 and others, a mask pattern may be obtained to form fins by the spacer process.

So far, fins were used primarily for forming an integrated light emitting diode, but the integrated light emitting diode can also be obtained by laminating the silicon thin film in parallel to the substrate plane.

Figure 58:
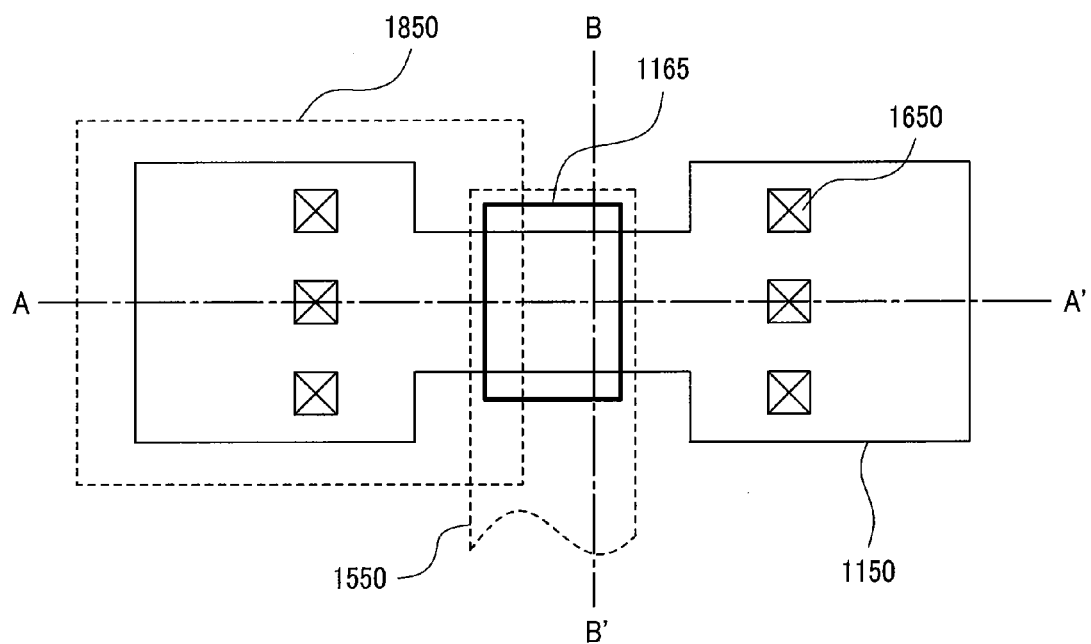
FIG. 58 is a planar layout for explaining an integrated light emitting diode according to the second embodiment of the present invention.
Figure 59:
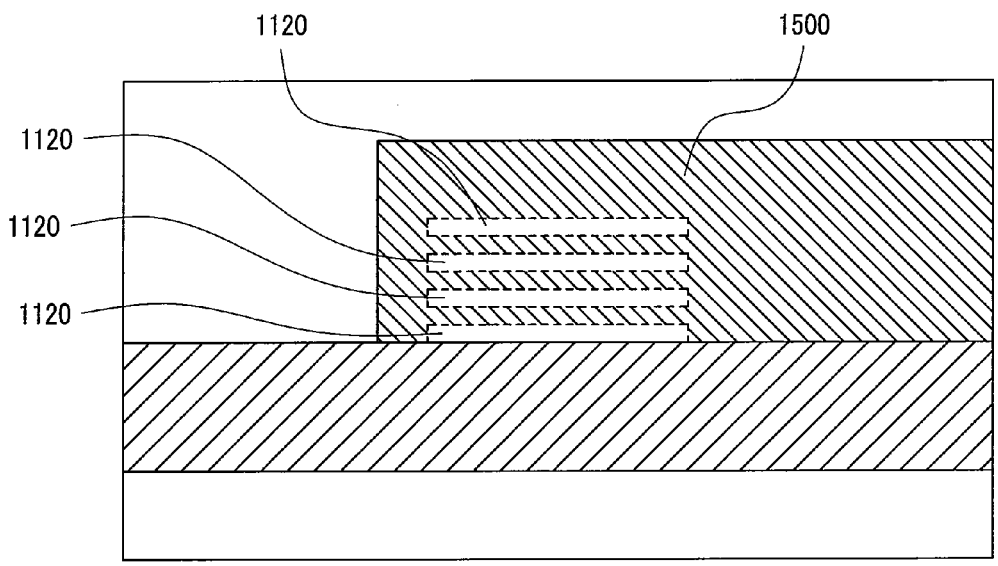
FIG. 59 is a schematic cross-sectional view for explaining an integrated light emitting diode according to the second embodiment of the present invention.

FIG. 58 shows a planar layout, and FIG. 59 is a cross-sectional view taken along line B-B' of FIG. 58. The following will explain the fabricating process, referring to FIGS. 60 through 65 which are A-A' cross sections of FIG. 58.

Figure 60:
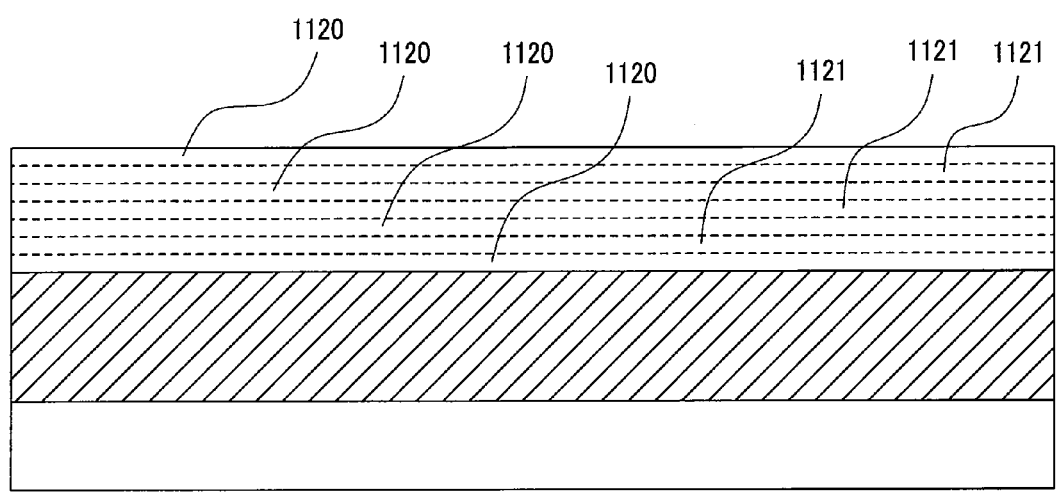
FIGS. 60 through 65 are schematic cross-sectional views for explaining the fabricating process of an integrated light emitting diode according to the second embodiment of the present invention.

In FIG. 60, a 10 nm silicon germanium film 1121 and a 10 nm silicon layer 1120 are epitaxially grown in turn on the SOI substrate 1120 by MBE technique.

Figure 61:
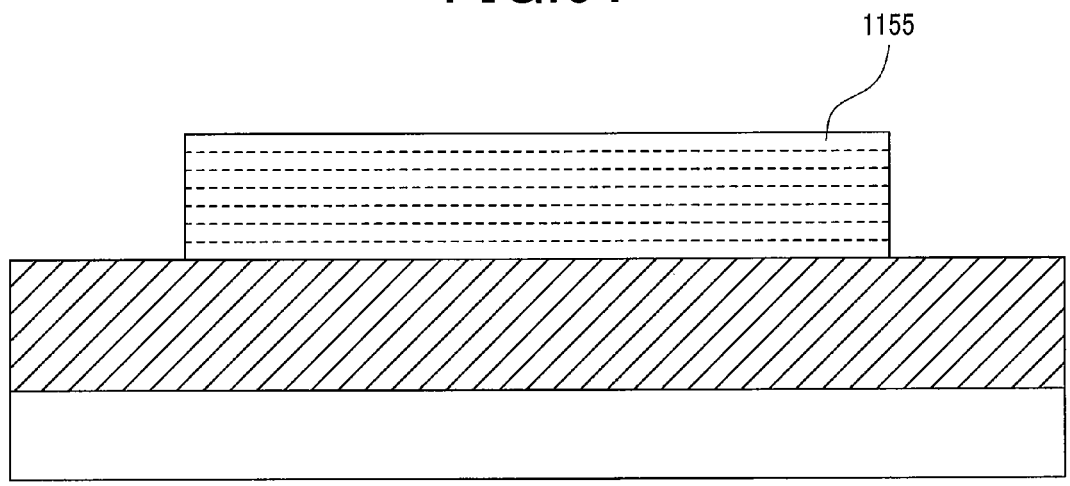

In FIG. 61, a laminate film 1155 is etched by using an active region pattern 1150 of FIG. 58.

Figure 62:
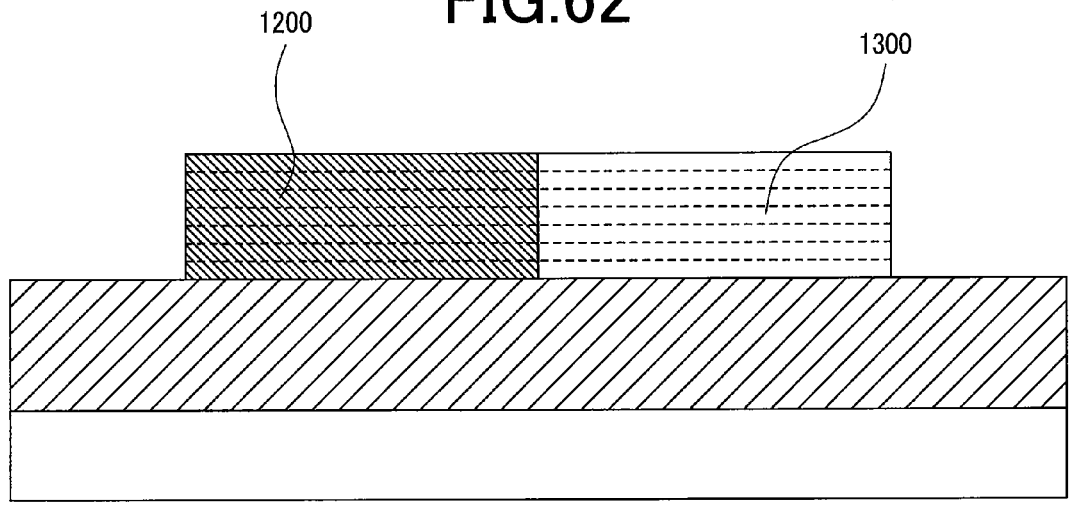

In FIG. 62, a PN junction is formed by using an ion implantation mask 1850 and its inversed pattern shown in FIG. 58.

Figure 63:
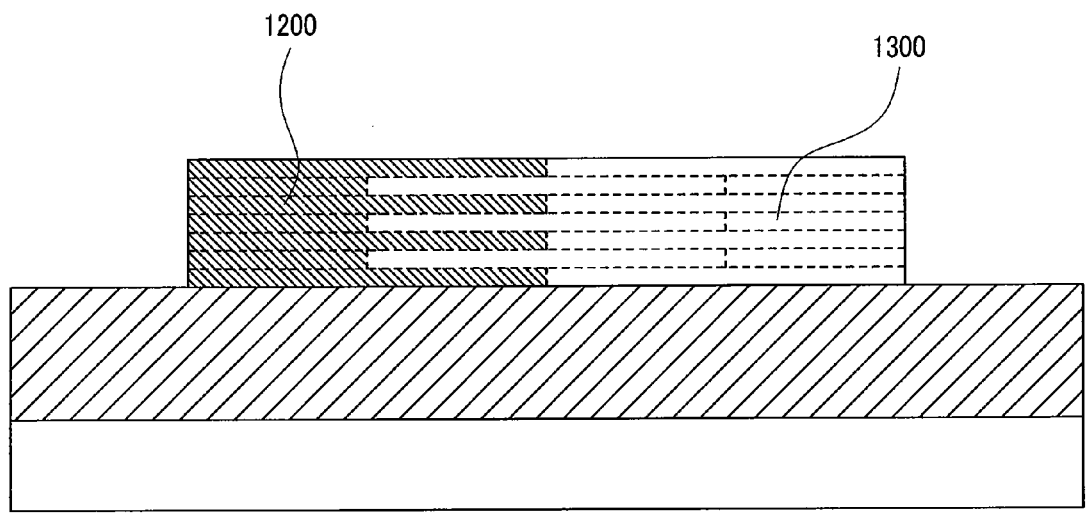

In FIG. 63, the silicon germanium crystalline layer is selectively etched by using a thin mask pattern 1165 of FIG. 58, to obtain a hollow shaped thin film structure of the silicon thin film having the PN junction.

Figure 64:
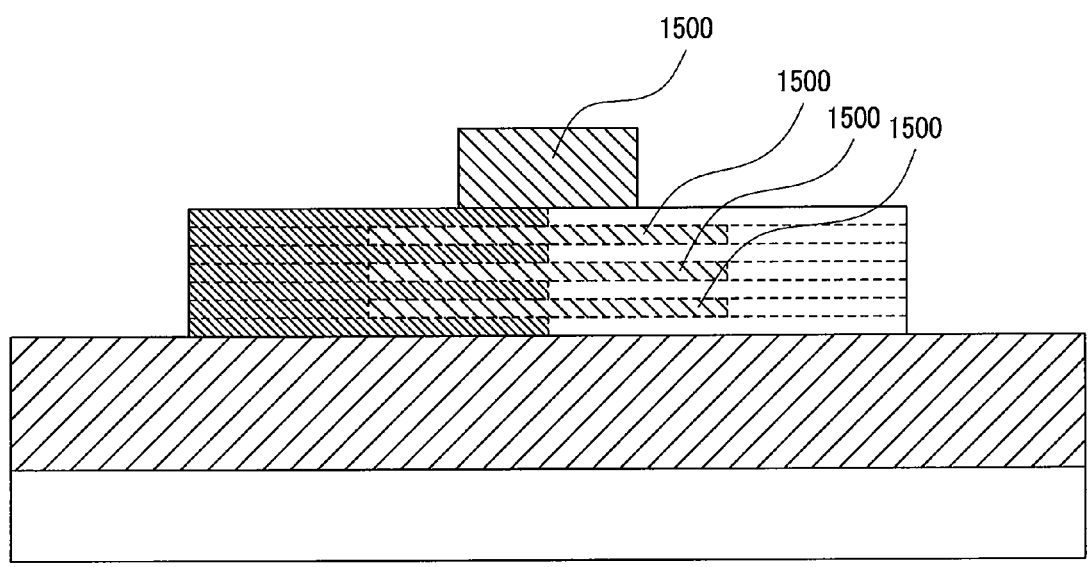

In FIG. 64, the silicon nitride film is deposited and processed by using the waveguide pattern 1550 (FIG. 58). The hollow shaped region that is formed with the silicon thin film has a buried structure by the silicon nitride film.

Figure 65:
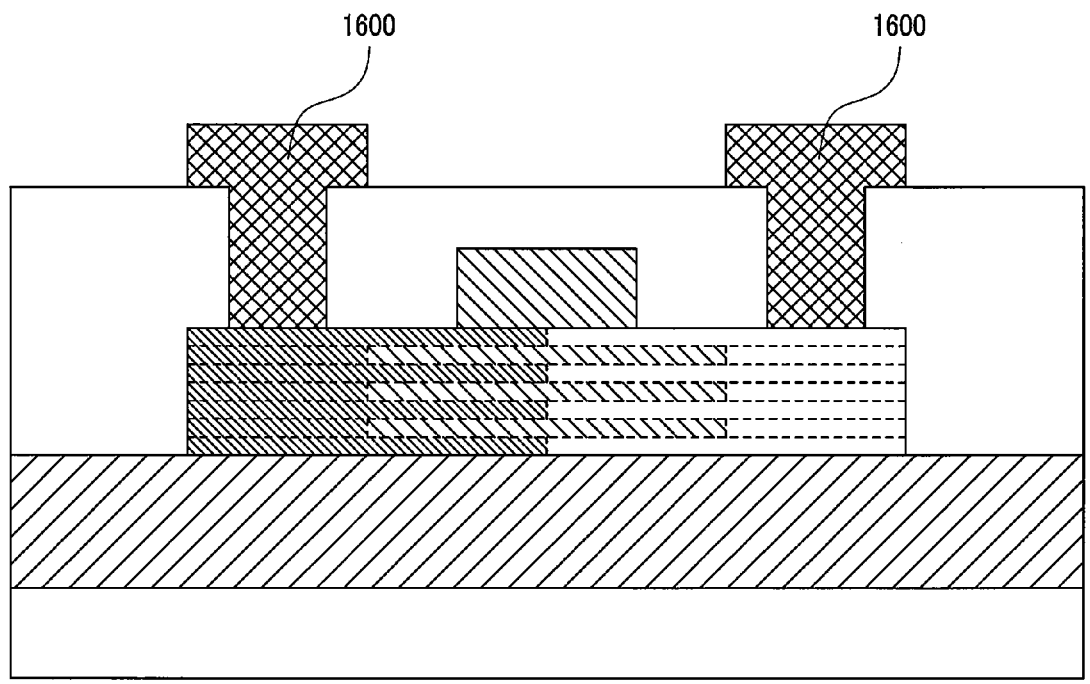

In FIG. 65, an interlayer insulation film and a metal wiring are formed to obtain an integrated light emitting diode that integrates a thin film in the vertical direction.

So far, it has been described about the integration of an integrated light emitting diode and a light receiving element on the same chip and the waveguide junction therebetween. Needless to say, it is possible to integrate a light emitting diode and a light receiving element on different chips and connect them with the same waveguide.

Figure 66:
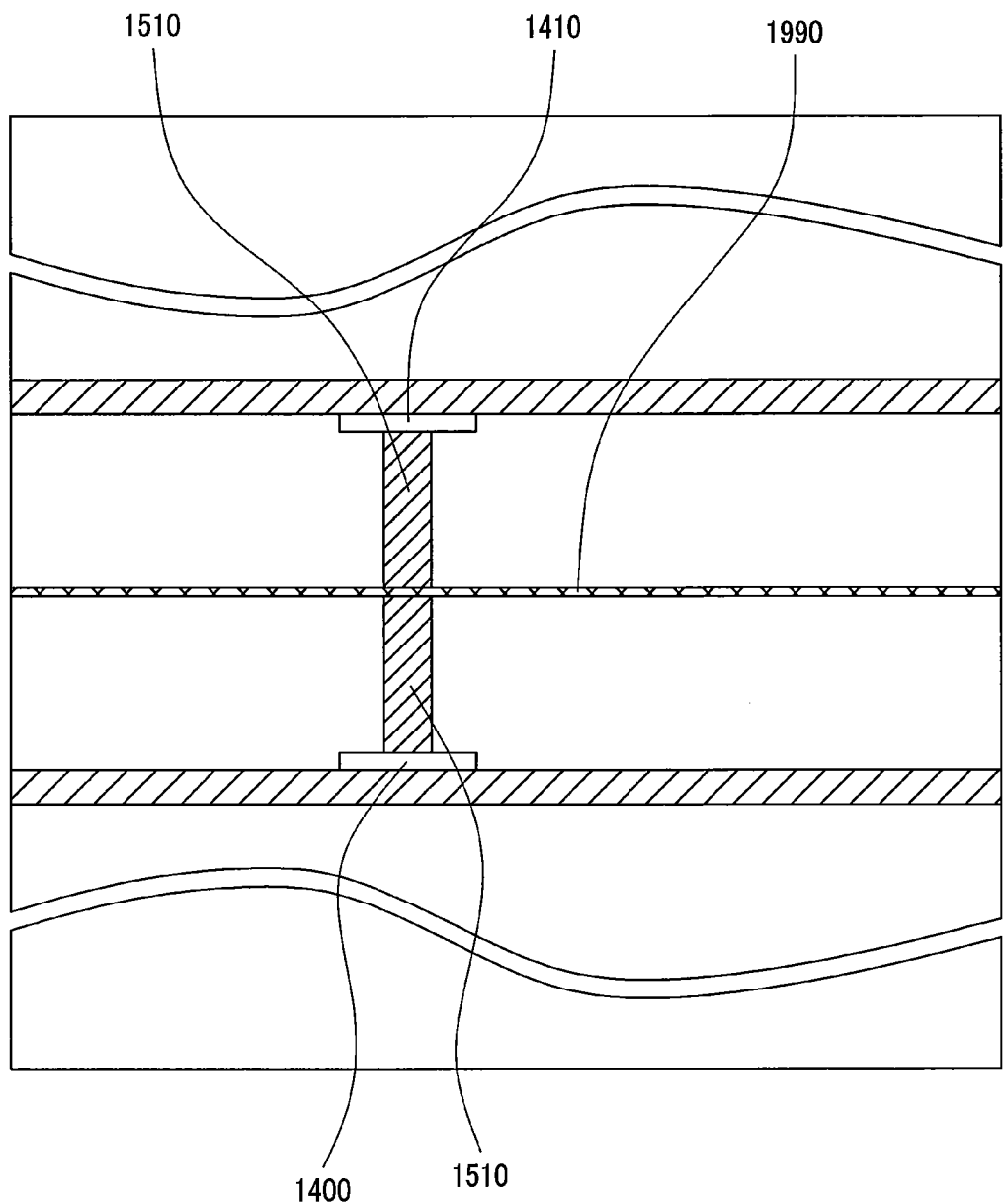
FIGS. 66 through 68 are schematic cross-sectional views for explaining an integrated structure of a light emitting device, a waveguide, and a light receiving element according to the second embodiment of the present invention.

In FIG. 66, the integrated light emitting diode 1400 and the light receiving element 1410 are formed on two wafers, respectively, and a waveguide 1510 is formed. While the waveguide 1510 being exposed, a low reflection film (AR film) 1990 is formed by laminating the silicon oxide film and the silicon nitride film, and both wafers with the AR film interposed therebetween may be joined for waveguide connection.

Figure 67:
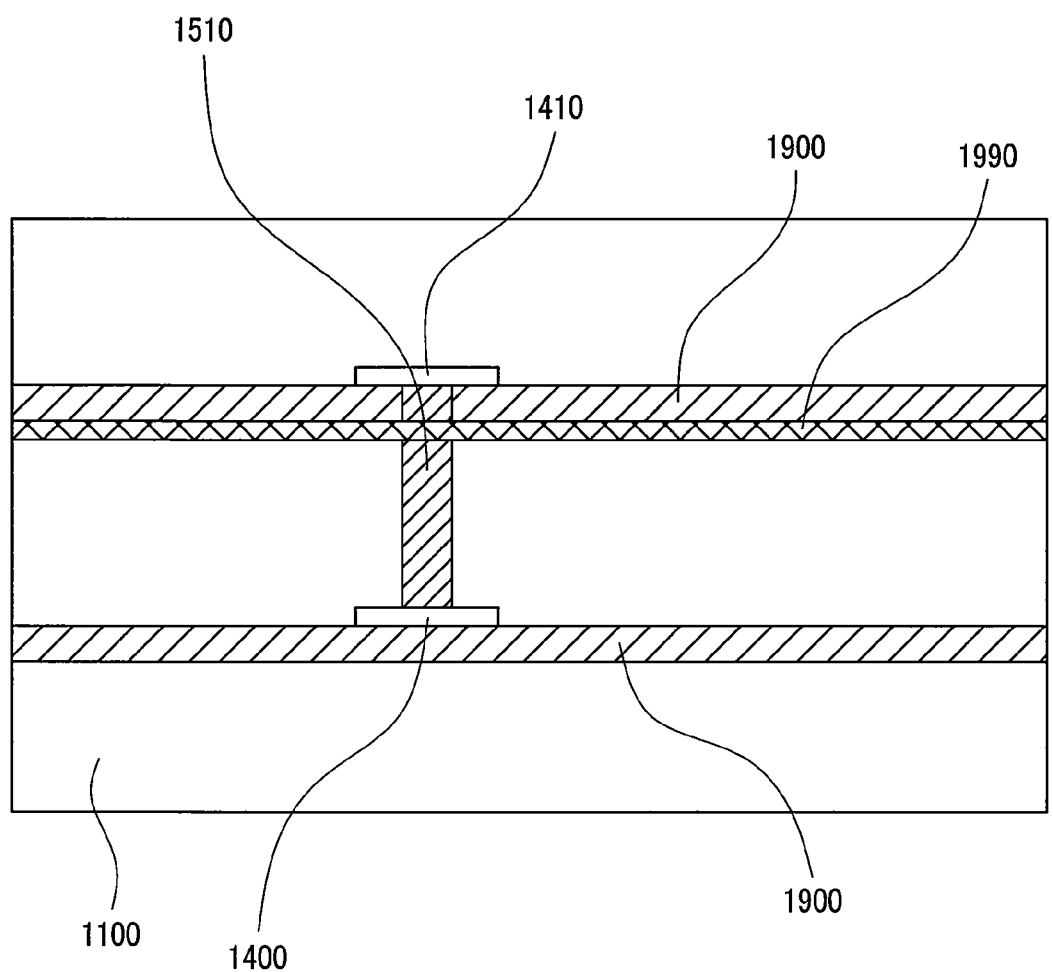
Figure 68:
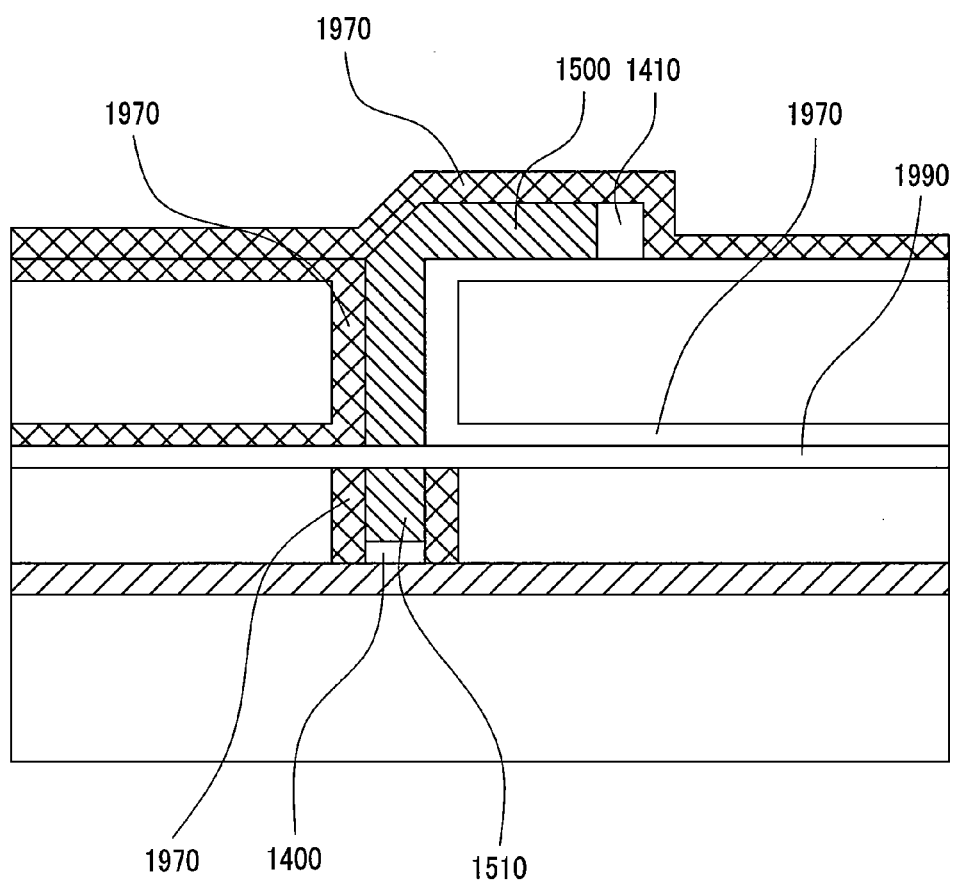

Moreover, as shown in FIG. 67, a support base plate of SOI is removed and layers are laminated to obtain a multi-layer structure. At this time, the AR film may be inserted in the junction interface.

In case of connecting a wafer laminate structure with a waveguide, the outer circumference of the waveguide 1500 is covered with the HR film 1970 and the AR film 1990 is placed at the junction. This structure makes it possible to realize high propagation efficiency of light.

Embodiment 3

Figure 69:
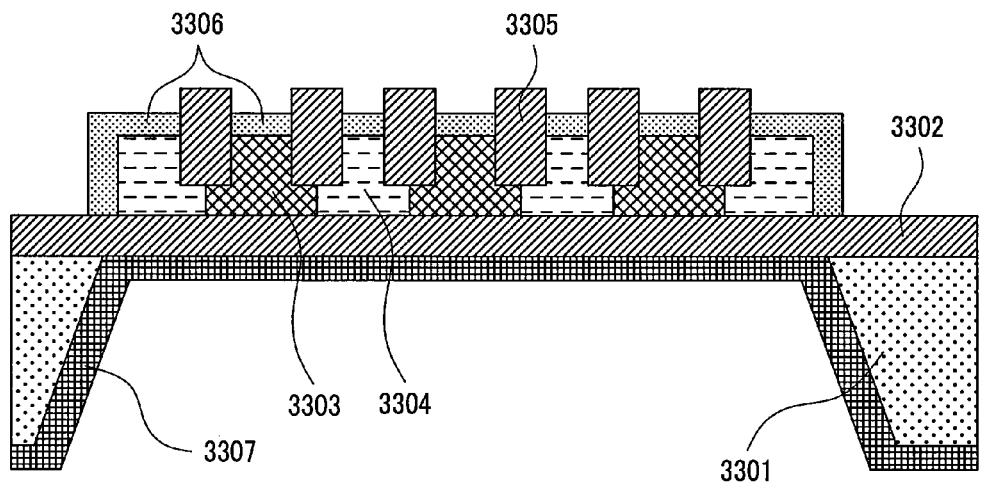
FIG. 69 is a schematic cross-sectional view for explaining the structure of an integrated light emitting diode according to the third embodiment of the present invention.

This embodiment discloses a luminous region expansion method that does not require a laminate film or plural wall-type silicon thin films disclosed in Embodiment 1 and Embodiment 2. In a light emitting diode according to this embodiment, as shown in FIG. 69, silicon semiconductor regions 3303 and 3304 of different conductive types are arranged adjacent each other on a silicon oxide film 3302 formed on the surface of the silicon substrate 3301, and a silicon oxide film 3305 is formed in the periphery of the interface of these two semiconductor regions only in such a manner that it covers a portion of the surfaces of the two semiconductor regions. Meanwhile, a silicide 3306, the compound of silicon and a metal, is formed on the surface of a semiconductor region that is not covered with the silicon oxide film 3305. In addition, a part of the silicon substrate 3301, that is, the silicon substrate in a region having the light emitting diode formed thereon, is removed to expose the silicon oxide film 3302, and a metal layer 3307 functioning as a light reflection film is deposited thereon.

Figure 70:
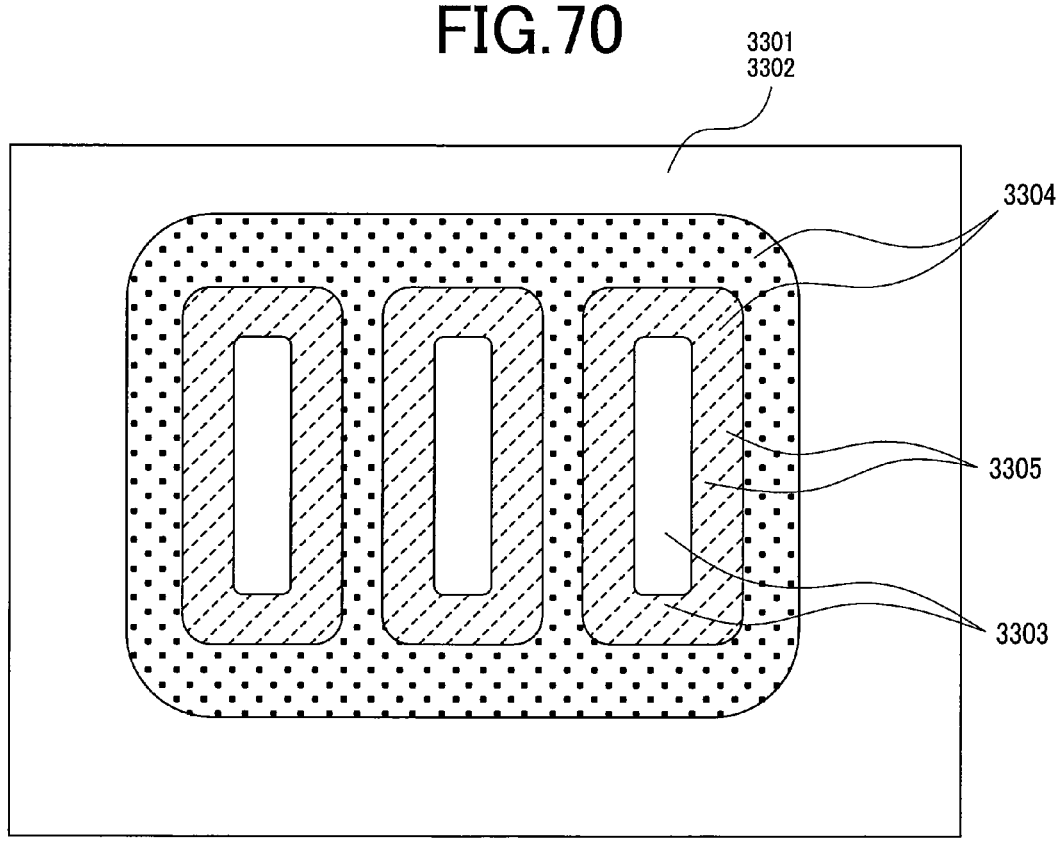
FIG. 70 is a planar layout for explaining the structure of an integrated light emitting diode according to the third embodiment of the present invention.

FIG. 70 shows a planar structure of the light emitting diode of this embodiment 3, where 3301 and 3302 denote a silicon substrate and a silicon oxide film formed thereon, respectively. What is on the top surface is the silicon oxide film 3302. In the drawing, 3304 denotes a conductive type semiconductor region on one side, and 3303 denotes a conductive type semiconductor region on the other side. Moreover, 3305 denotes a silicon oxide region formed in a manner to cover the two conductive type semiconductor regions. Therefore, the light emitting diode of this embodiment is characterized by its planar structure where the circumference of one conductive type silicon semiconductor region is covered by the other conductive type semiconductor region. The junctions in the circumference become luminous regions. Therefore, the luminous area can be expanded simply by increasing the number of junctions as much as desired. At this time, the semiconductor region whose circumference is covered may be laid out in a narrow and long shape instead of a circular shape or a rectangle shape close to a square, so that the length of the luminous PN junction can be increased relatively larger than the layout area. Another characteristic of the light emitting diode of this embodiment is that all the junctions are formed inside the semiconductor regions, and its edges never stick out of the ends of the semiconductor region. Therefore, leak current caused by the edges does not occur. Still another characteristic of the light emitting diode of this embodiment is that the surfaces of the two conductive type semiconductor regions not being covered with the silicon oxide film 3305 are covered with the silicide film. The light generated by this silicide film can easily and efficiently get out through the silicon oxide film 3305 acting like a window. Furthermore, in presence of silicide, uniform voltage can be applied and a stable operation can be realized.

Figure 71:
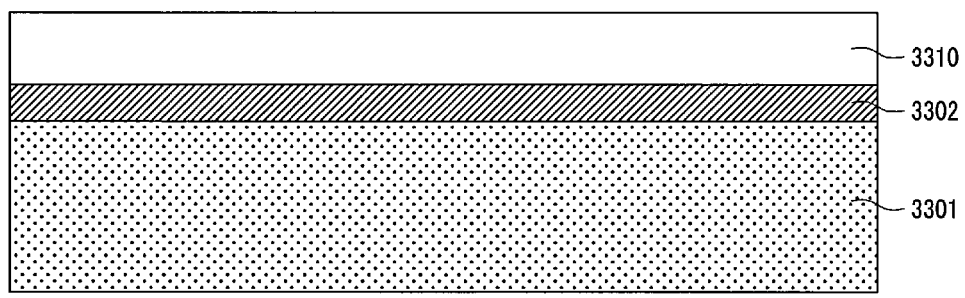
FIGS. 71 through 81 are schematic cross-sectional view for explaining the fabricating process of an integrated light emitting diode according to the third embodiment of the present invention.

Next, the fabricating method of the light emitting diode of this embodiment is explained, in reference to FIG. 71 and others. First of all, as shown in FIG. 71, a silicon oxide film 3302 is grown on a surface of the silicon substrate to a thickness of 100-200 nm by a prior art heat oxidation method or the like. Then, a single crystalline silicon film 3310 is laminated on a surface of the oxide film by using a well-known laminating technique. This is a so-called Silicon On Insulator (SOI) structure, which is a kind of silicon substrates used broadly as a part of a semiconductor product such as a high performance micro processor, etc. This embodiment also employs the SOI substrate purchased from a wafer manufacturer, provided that the SOI substrate has plane orientation 100 and is about 50 nm thick.

Figure 72:
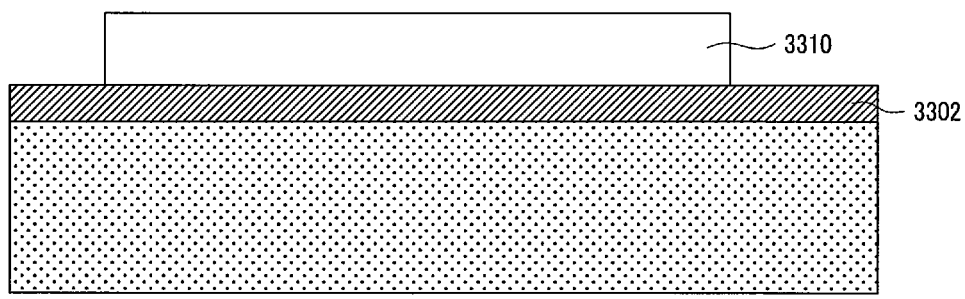
Figure 73:
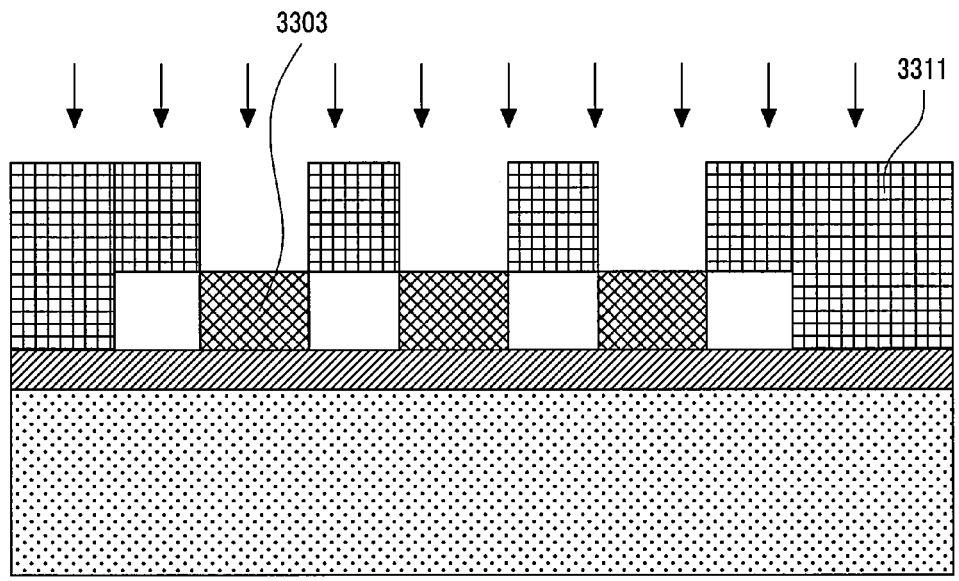
Figure 74:
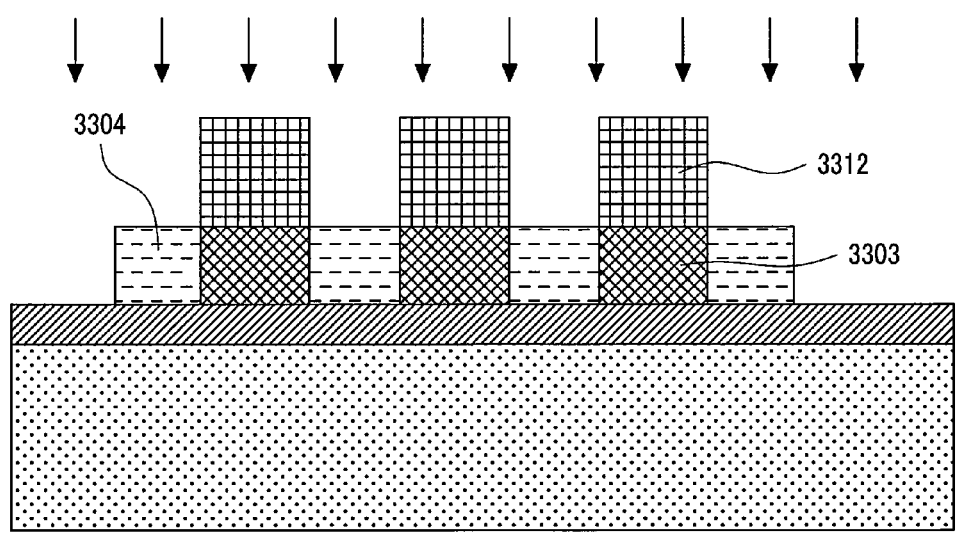

Next, the silicon thin film 3310 on the oxide film is processed in a desired shape, a convex shape for example (FIG. 72). The size of the silicon thin film 3310 varies depending on the size of a region formed therein and the size of a luminous region. In order to form two different conductive type semiconductor regions in the silicon thin film, a photoresist pattern 3311 to function as an ion implantation mask is first formed by lithography as depicted in FIG. 73, and only an impurity implanted region is perforated. In this embodiment, arsenic or phosphor is implanted with a dose of $10^{14}$-$10^{15}$/cm$^2$ through this opening or hole.

Next, in FIG. 73, a photoresist pattern used as an ion implantation mask is removed by cleansing. Thereafter, a photoresist pattern 3312 is formed by lithography to cover an already implanted impurity region. Then, boron ions are implanted with a dose of $10^{14}$-$10^{15}$/cm$^2$ by using the photoresist pattern as a mask.

Figure 75:
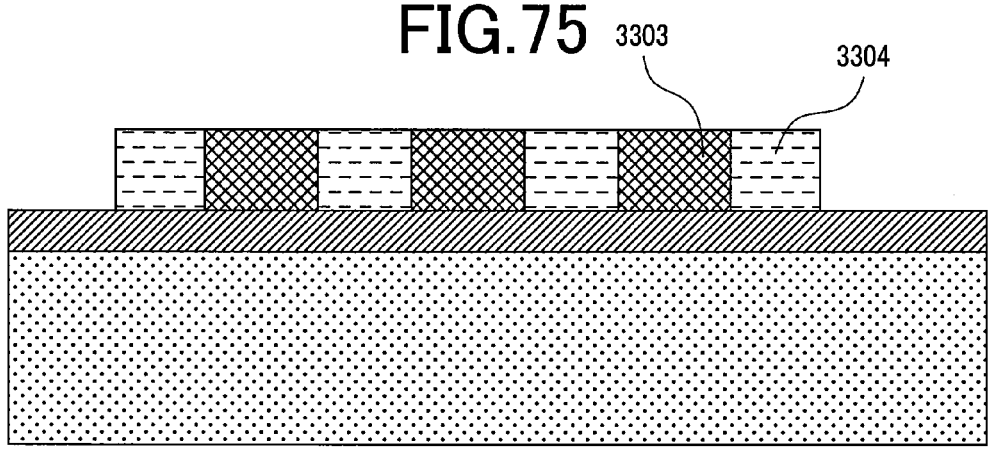

Thereafter, as shown in FIG. 75, the photoresist pattern is removed by cleansing and heated to activate impurities. Through this series of processes, an N-type semiconductor region 3303 with plenty of electrons and a P-type semiconductor region 3304 with plenty of holes are formed. The heating treatment was performed at 900° C. In addition, it is also possible to overlap the N-type and P-type semiconductor regions or interpose a so-called i-region with no impurities between the N-type and the P-type semiconductor region, by adjusting an aperture or a shielding portion on the photoresist mask during ion implantation.

Figure 76:
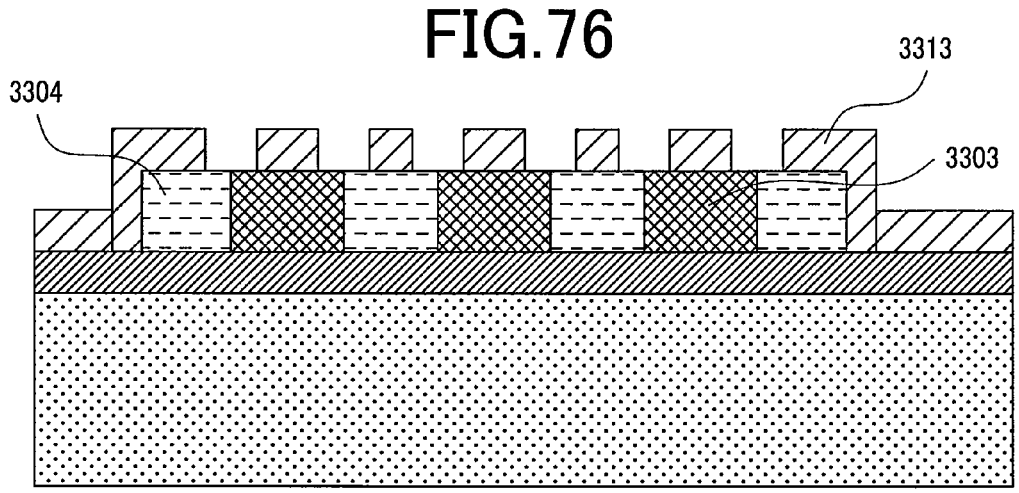

Next, as shown in FIG. 76, a silicon nitride film 3313 for covering a surface of the substrate is processed by lithography and dry etching to expose the surface of the silicon thin film in the periphery of the interface between the N-type semiconductor region 3303 and the P-type semiconductor region 3304.

Figure 77:
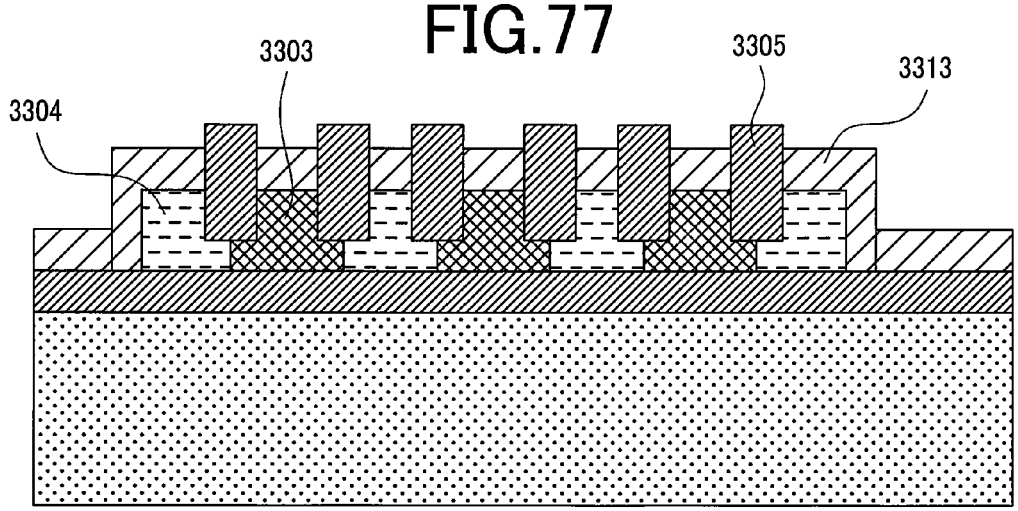

Next, as shown in FIG. 77, the entire substrate is placed under a high-temperature oxidation atmosphere, so that a silicon oxide film 3305 may selectively grow only on a portion of the surface of the N-type and the P-type semiconductor region not being covered with the silicon nitride film 3313. This technique is called a selective oxidation of silicon and has already been used by many. The oxidation atmosphere contains hot steam of 1000° C. This hot steam oxidation atmosphere, unlike the oxygen atmosphere, helps a relatively thick oxide film to grow within a short amount of time. The grown oxide film is about 80 nm thick, so a silicon region (this includes an interface between the N-type and the P-type) of about 10 nm in thickness is formed on the partially oxidized silicon thin film.

Figure 78:
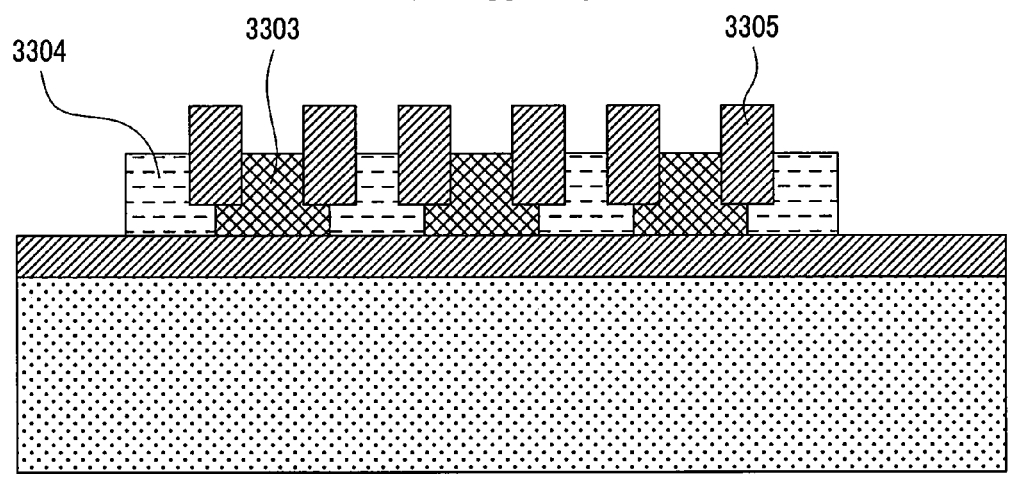

The silicon nitride film 3313 that became a selected oxidation mask during the process shown in FIG. 77 is selectively removed. To this end, the substrate is impregnated in a hot phosphoric acid solution. It turned out, as shown in FIG. 78, a semiconductor region is exposed while leaving the grown oxide film.

Figure 79:
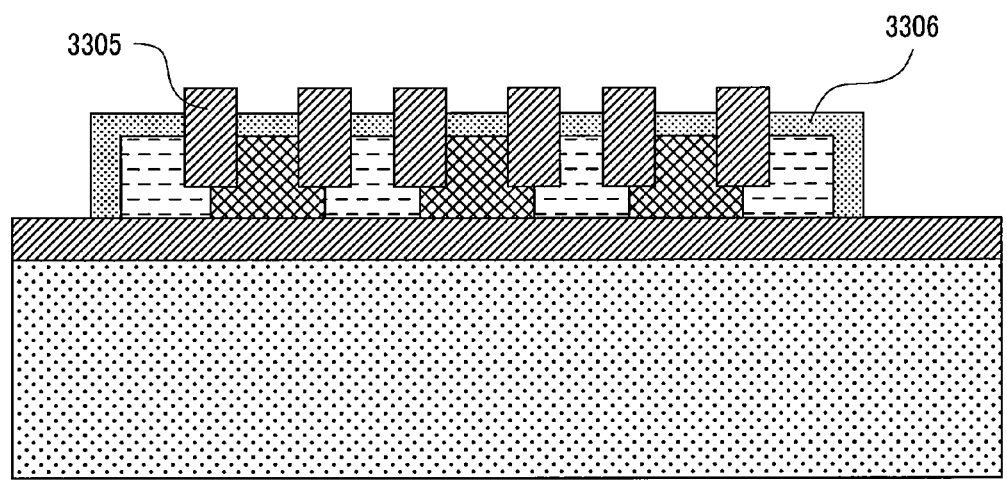

Next, a metal such as titan, cobalt, nickel and so on is deposited on the entire surface to a thickness of several tens of nanometers and heated at 450° C. under nitrogen atmosphere to remove, by using a hydrogen peroxide containing solution, nonreacted metals that are deposited on the oxide film 3305. On the other hand, the metal deposited on the silicon thin film causes a chemical reaction under heating and is silicided, so it is not to be removed by a solution. In this manner, a silicide-free structure is formed on the oxide film 3305, as shown in FIG. 79. One thing to be careful here is that because silicide has a high resistance, an additional heating operation at 700° C. needs to be performed to lower the resistance of silicide. This technique is already customarily used in the silicon semiconductor process.

Figure 80:
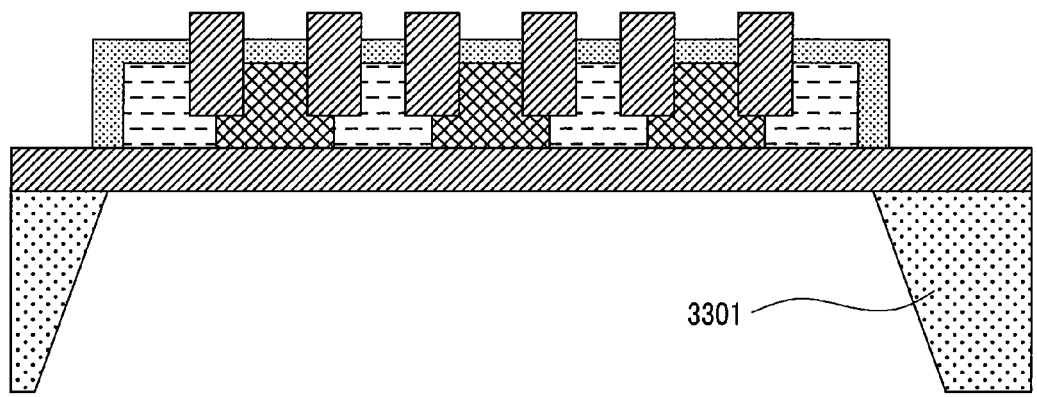
Figure 81:
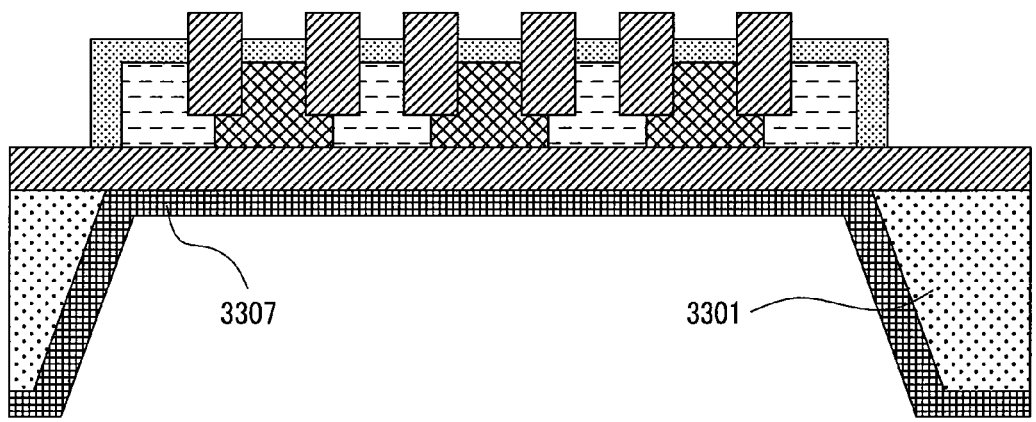
Figure 82:
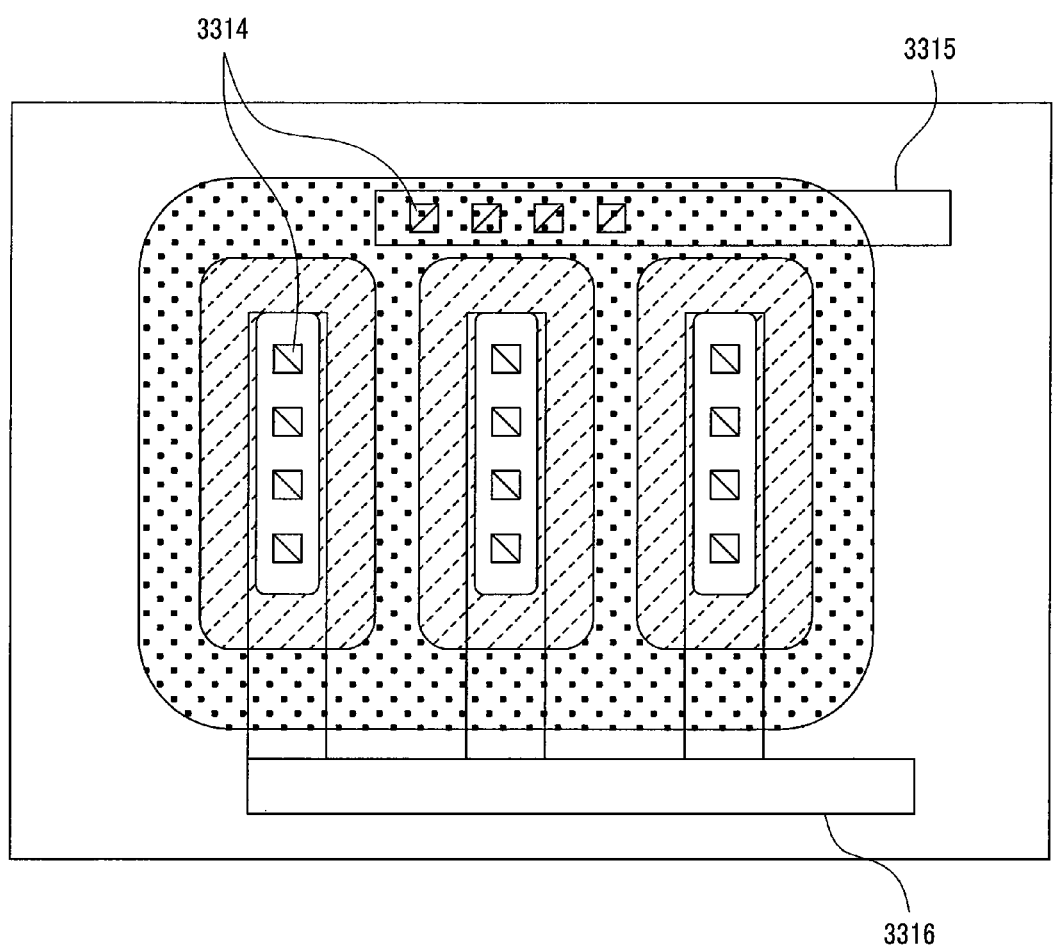
FIG. 82 is a planar layout for explaining the structure of an integrated light emitting diode according to the third embodiment of the present invention.

Next, as shown in FIG. 80, only a portion of the silicon substrate (a region having the light emitting diode) is selectively removed. Finally, as shown in FIG. 81, a metal layer used as a light reflection plate is formed by deposition to complete the fabrication of a light emitting diode. Even though only the fabricating method of a light emitting diode has been explained in this embodiment, it is actually incorporated with the fabricating method of a peripheral semiconductor device or the process for electrically and optically connecting such a semiconductor device with a light emitting diode. Because of this, the metal layer functioning as a reflection plate is adhered to a back surface of the substrate customarily at the end of the process. In case of including a wiring process, a wiring via which current flows into the two semiconductor regions in the light emitting region and a contact hole are formed, as shown in FIG. 82.

Embodiment 4

Figure 83:
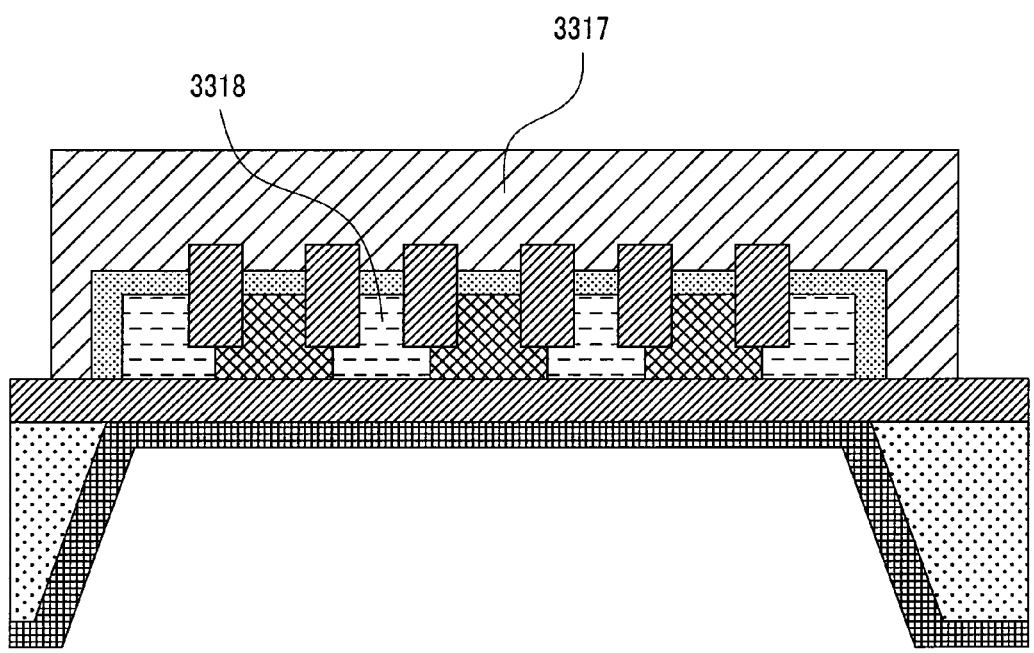
FIG. 83 is a schematic cross-sectional view for explaining an integrated light emitting diode and a waveguide according to the fourth embodiment of the present invention.
Figure 84:
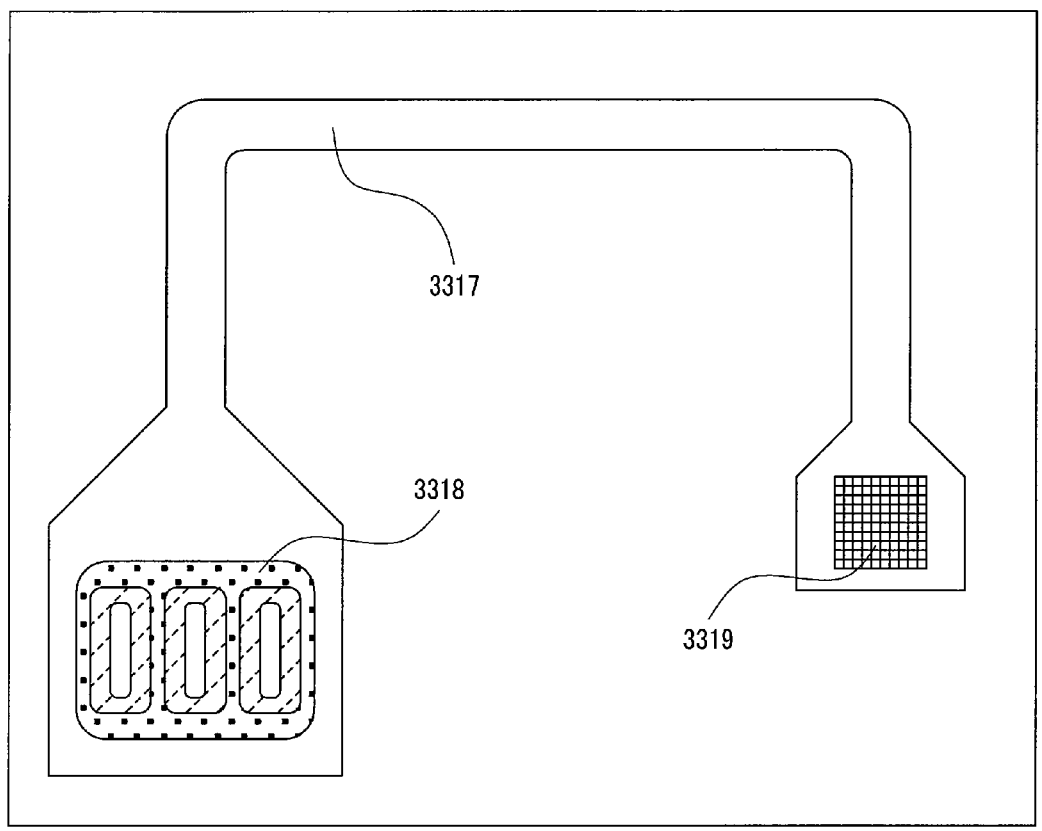
FIG. 84 is a planar layout for explaining an integrated light emitting diode and a waveguide according to the fourth embodiment of the present invention.
Figure 85:
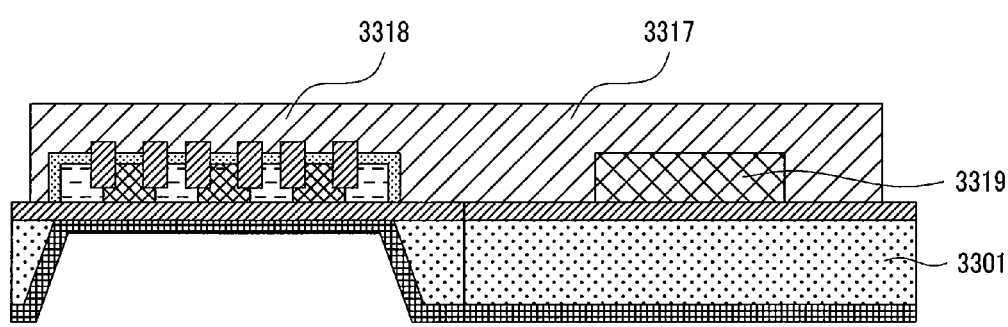
FIG. 85 is a schematic cross-sectional view for explaining an integrated light emitting diode, a waveguide, and a light receiving element according to the fourth embodiment of the present invention.

In this embodiment, a waveguide for guiding light emitted by the light emitting diode to the light receiving element is mounted. Light emitted by the light emitting diode shows the highest luminescence intensity around 1000 nm wavelength, which is because light emission has occurred as a result of recrystallization due to the band gap of ultra-thin silicon. To trap the light in the waveguide, the light emitting diode 3318 is fully covered with a silicon nitride film 3317 and the silicon nitride film 3317 is arranged in a waveguide pattern on the substrate, similarly to the state shown in FIG. 84, and a light receiving element 3319 is arranged at the end thereof. The circumference of the waveguide made out of the silicon nitride film 3317 is covered with a silicon oxide film (this is omitted in FIG. 83 for simplicity) having a smaller refractive index than that the silicon nitride film, and light from the light emitting diode does not leak to the outside the nitride film. Meanwhile, a conventional silicon device is used for the light receiving element. FIG. 85 is a cross-sectional view of a chip comprising a group of elements that consists of a light emitting diode 3318, a light receiving element 3319, and a silicon nitride film 3317 being integrated together. A typical light receiving element made out of silicon is used for the light receiving element 3319. Similar to the light emitting diode, the light receiving element is prepared in use of a single crystalline silicon thin film formed over the oxide film on the surface of the substrate 3301 and formed concurrently with others by the prior art silicon semiconductor process.

Embodiment 5

Figure 86:
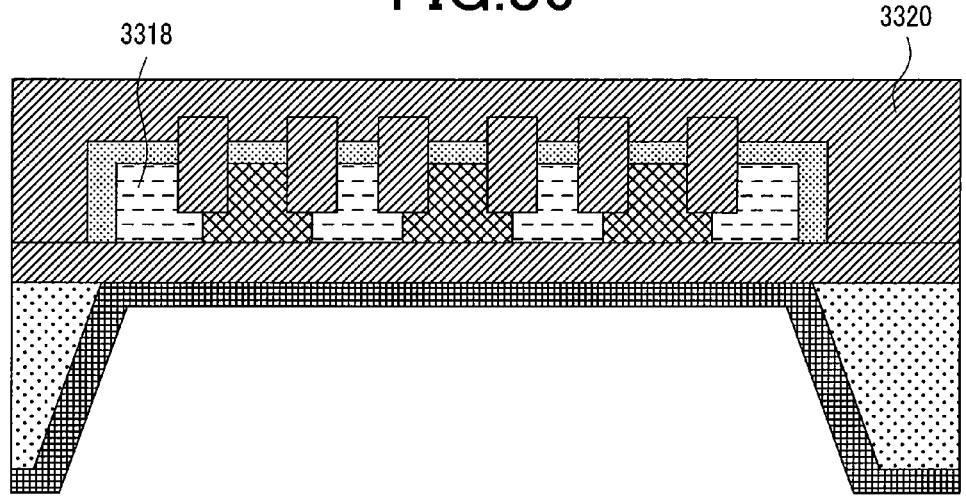
FIGS. 86 through 93 are schematic cross-sectional views for explaining an integrated light emitting diode and a waveguide according to the fifth embodiment of the present invention.
Figure 87:
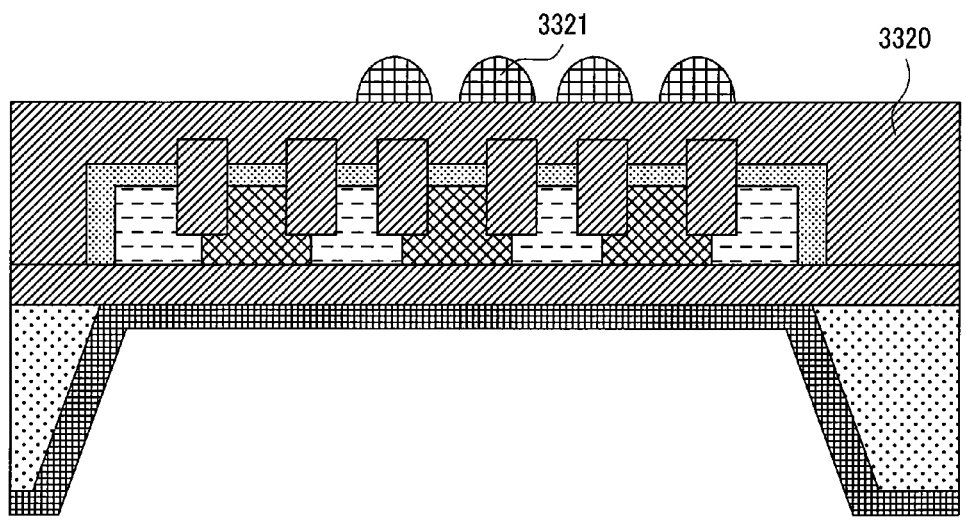

This embodiment is related to a waveguide for efficiently propagating light. First of all, as shown in FIG. 86, a silicon oxide film 3320 is deposited as an interlayer insulation film in a manner that it covers the entire light emitting diode 3318 and then planarized by the prior art CMP. Next, as shown in FIG. 87, a waveguide 3321 is arranged right above the periphery of two conductive interfaces (a luminous region). As in Embodiment 4, the waveguide is made out of a silicon nitride film and traps light therein. Therefore, the nitride film waveguide 3321 is inevitably covered with a silicon oxide film for example having a small dielectric constant. In the interest of brevity, this is not going to be explained in further detail.

Here, the cross section of the waveguide is almost semicircular. Moreover, the end portion of the waveguide where the light emitting diode and the light receiving element is arranged has a shape of a quarter of a sphere. Therefore, light from the light emitting diode is reflected from the end at high rate to propagate the waveguide. As the other end portion of the waveguide has also a shape of a quarter of a sphere, the light having propagated the waveguide is now reflected from the end of the waveguide and directed nearly perpendicularly to the light receiving element. Further details on the effects of a waveguide configuration of this shape are provided in U.S. Pat. No. 6,868,214B1.

In order to fabricate such a waveguide, a method that is highly compatible with the prior art silicon semiconductor process was employed. A waveguide made out of silicon nitride film will be discussed first, followed by a waveguide made out of silicon oxide film.

Figure 88:
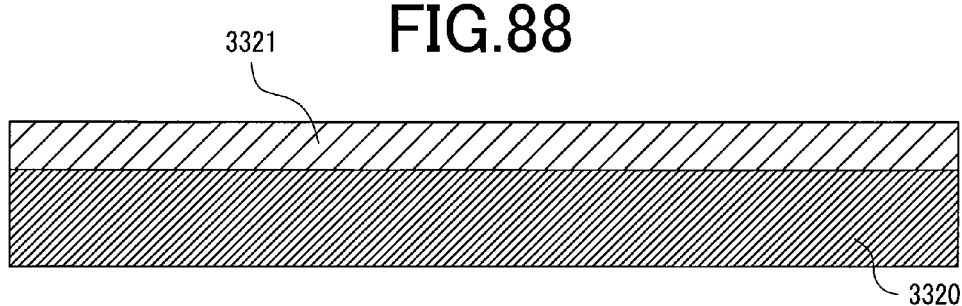
Figure 89:
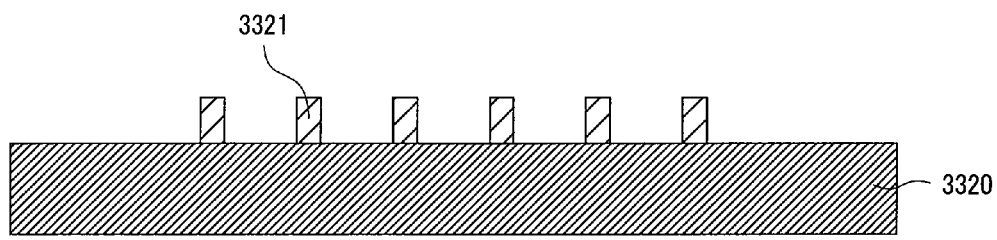

For simplicity in description, a cross section without a luminous region is going to be used as an example. As shown in FIG. 88, a silicon nitride film 3321 is deposited on a surface of the interlayer insulation film 3320. Next, as shown in FIG. 89, the nitride film is processed in a rectangular shape by lithography or dry etching of the prior art. Since the silicon nitride film and the silicon oxide film functioning as an interlayer insulation film are dry etched at different speeds, the processing of the nitride film may be interrupted with the oxide film.

Figure 90:
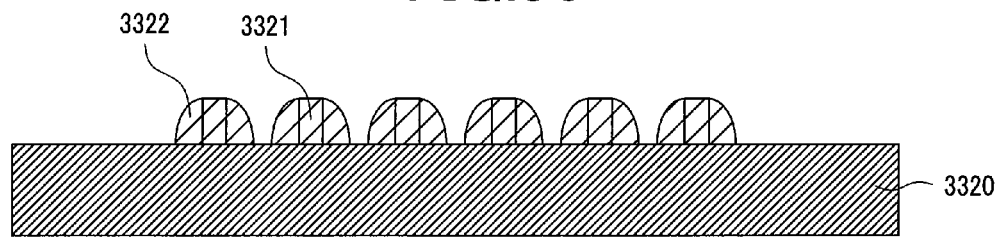

Next, the silicon nitride film is deposited by CVD so that a film of even thickness can be deposited over the surface of the rectangular silicon nitride film as well as the surface of the interlayer insulation film. When prior-art anisotropic dry etching is carried out on the deposited nitride film, as depicted in FIG. 90, a side wall film 3322 with a circumference drawing an arc only on the side walls of the rectangular silicon nitride film 3321 is formed. In the formation of this side wall film, although it is difficult to make the cross section of the waveguide have a perfect hemisphere shape, the anisotropic dry etching method being frequently used in the silicon semiconductor process and the silicon nitride film may be utilized to form side wall films as desired. This approach is actually known to be highly compatible with a silicon semiconductor. The side wall film formation is preferably repeated several times to get a more hemispherical shaped cross section. Another method is to make a waveguide out of glass having a relatively low melting point.

Figure 91:
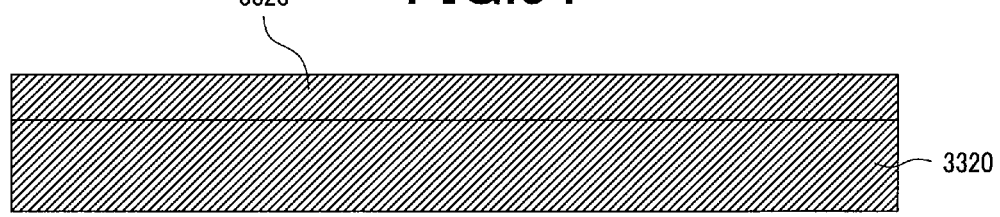
Figure 92:
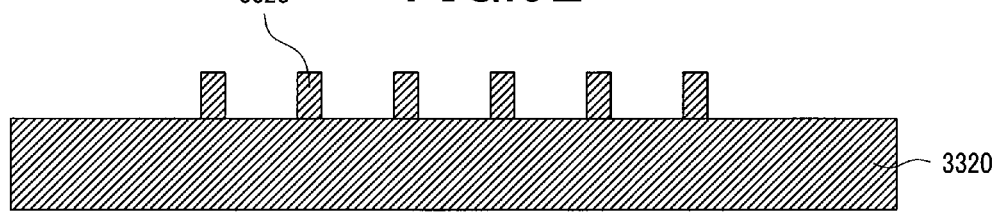
Figure 93:
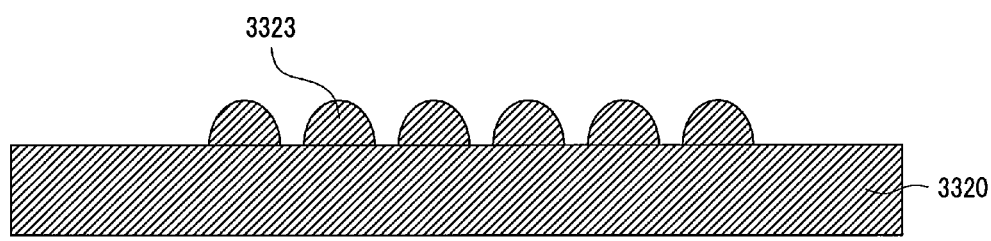

However, to fulfill a role as a waveguide, the waveguide has to be made of a material that has a greater refractive index than the silicon oxide film functioning as an interlayer insulation film and that is capable of sustaining heat treatment (about 500° C.) in the following wiring process. As such, glass 3323 is applied to the surface of the interlayer insulation film 3320 as shown in FIG. 91 and processed with the rectangular waveguide pattern as shown in FIG. 92, by dry etching of the prior art. And, this is heated at about 600° C. and fluidified to form a waveguide having a hemisphere cross section as illustrated in FIG. 93.

Embodiment 6

Figure 94:
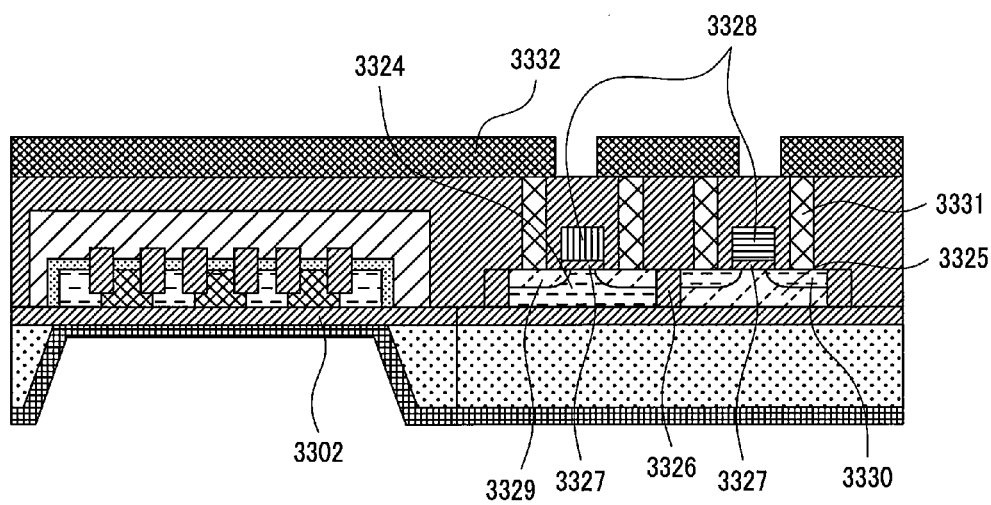
FIGS. 94 and 95 are schematic cross-sectional views for explaining an integrated structure of an integrated light emitting diode, a waveguide and CMOS according to the sixth embodiment of the present invention.

A light emitting diode of this embodiment is easily fabricated by using a silicon thin film, so it can be mixed with a semiconductor element having a silicon substrate, e.g., Metal Oxide Semiconductor Field Effect Transistor (MOSFET), etc. FIG. 94 illustrates a case that both of a light emitting diode and a semiconductor element (a switching element configured with CMOS: nMOSFET and pMOSFET) are formed on a single crystalline silicon thin film on a silicon oxide film 3302 over a substrate. That is, it is the MOSFET with the SOI structure. In the drawing, 3324 denotes a first conductor type silicon thin film, 3325 denotes a second conductor type silicon thin film, 3326 denotes an element isolation oxide film that is a silicon oxide for performing electrical insulation-separation of two MOSFETs, 3327 denotes a gate oxide film of MOSFET, 3328 denotes a gate electrode of MOSFET, 3329 denotes a second conductive type semiconductor region, 3330 denotes a first conductive type semiconductor region, 3331 denotes a buried metal called a plug for electric connection between a wiring and a semiconductor element, and 3332 denotes a wiring metal. These semiconductor elements can be fabricated concurrently with a light emitting diode by applying the typical fabricating process of silicon semiconductor elements.

Figure 95:
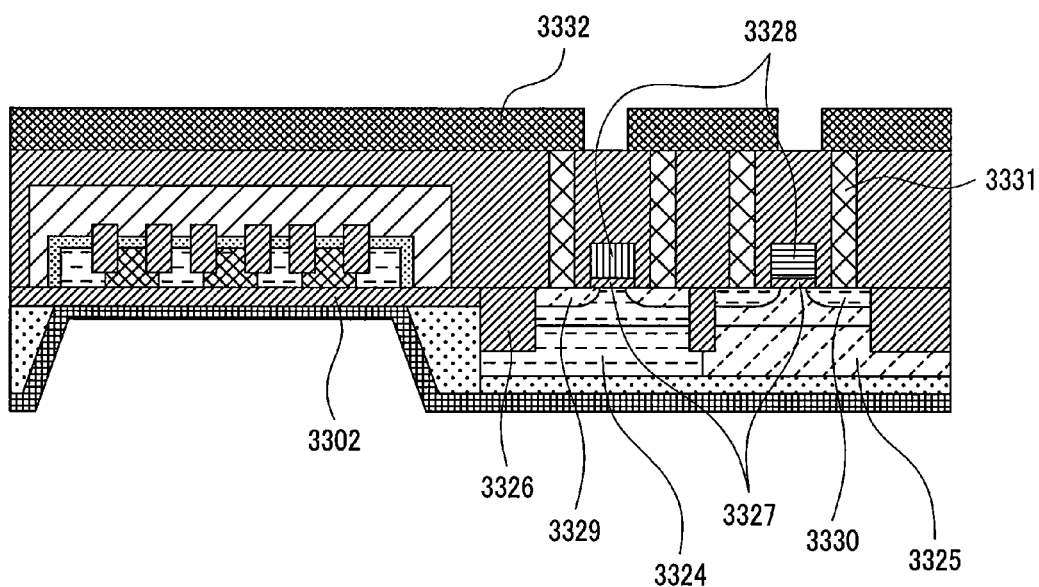

FIG. 95 depicts a MOSFET formed over a silicon substrate. A single crystalline silicon film formed on an oxide film 3302 over the substrate and the oxide film 3302 are removed to expose the surface of the silicon substrate. In the example shown in FIG. 95, this silicon substrate is employed to form a MOSFET. However, because the oxide film 3302 has a thickness of 100-200 nm, a stepped difference due to an oxide film is produced between the silicon thin film used for a light emitting diode and the substrate for MOSFET applications. Therefore, according to this embodiment, a silicon was selectively epitaxially grown on the exposed silicon surface and a single crystalline silicon layer having a thickness of 100-200 nm was grown. In consequence, the stepped difference was substantially reduced and the light emitting diode and the semiconductor device could be fabricated at the same time.

Embodiment 7

Figure 96:
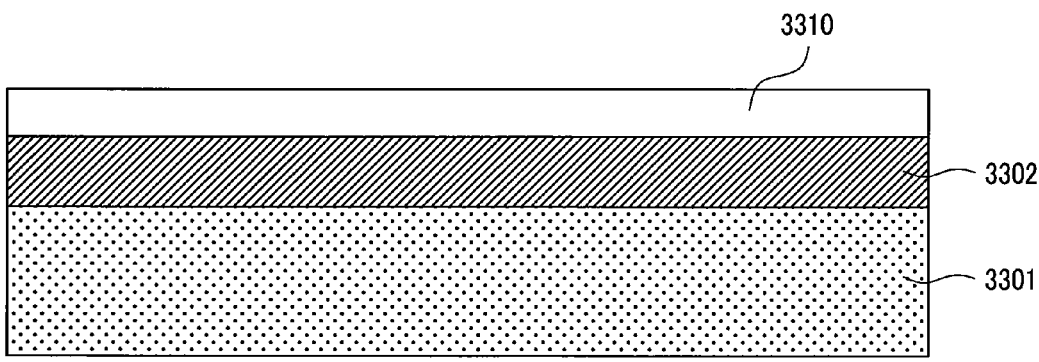
FIGS. 96 through 111 are schematic cross-sectional views for explaining the fabricating method of an integrated structure of an integrated light emitting diode, a waveguide and CMOS according to the seventh embodiment of the present invention.

FIG. 96 and subsequent drawings describe a method for integrating a light emitting diode with an electric device such as MOSFET at the same time. The example shown in FIG. 96 used a SOI substrate having a single crystalline silicon film 3310 formed over a silicon oxide film 3302. However, there is not much difference in the fabricating process even when silicon substrates without a BOX 3302 in one portion may be used instead as shown in FIG. 95.

Figure 97:
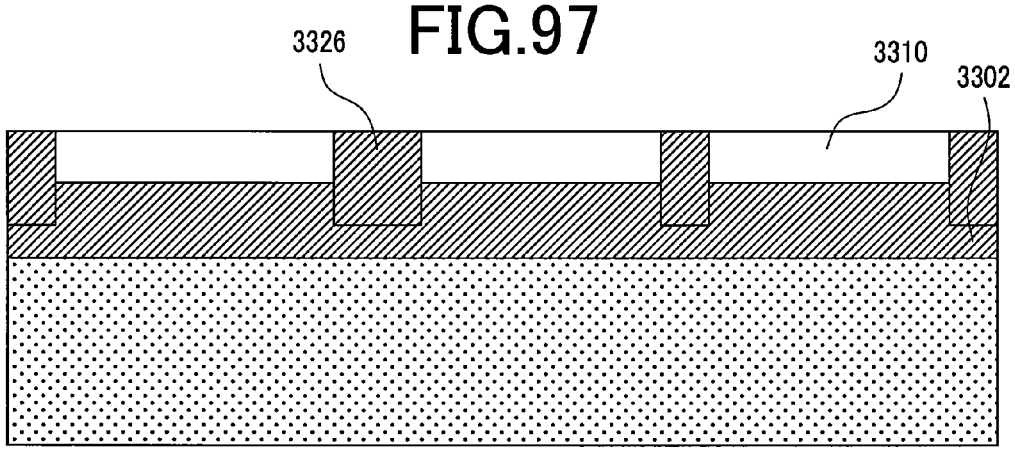

At first, as shown in FIG. 97, an element isolation oxide film 3326 is formed for electrical insulation-separation of elements. For this process, any of the prior art silicon microscopic processing techniques such as silicon hole processing, silicon oxidation, silicon oxide burial, polishing, etc., can be employed. FIG. 97 illustrates a case that a luminous region forming area (the single crystalline silicon region on the left side), a first conductive type MOSFET forming area (the single crystalline silicon region at the center), and a second conductive type MOSFET forming area (the single crystalline silicon region on the right side) are formed.

Figure 98:
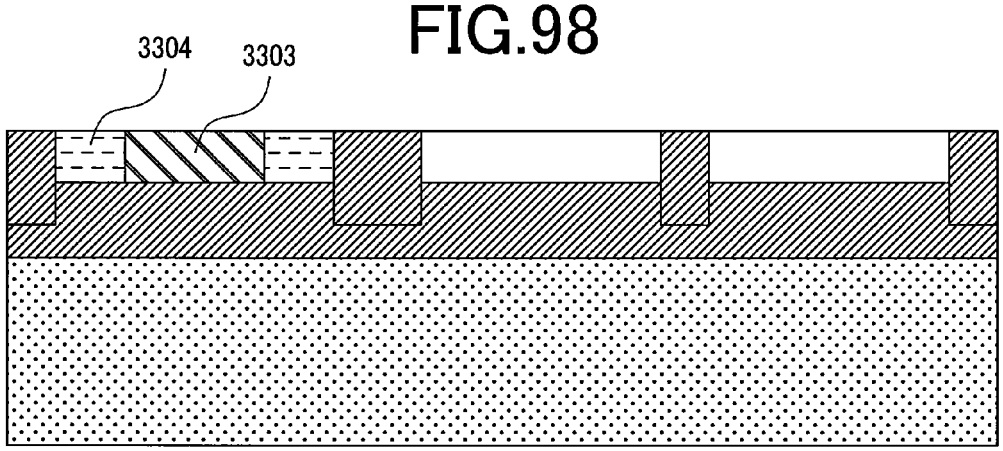

First, a light emitting diode is fabricated. As shown in FIG. 98, a first conductive type region 3304 is formed by ion implantation of the prior art, and a second conductive type region 3303 is formed inside the first conductive type region by ion implantation as well. To be more specific, arsenic ions were implanted in the first conductive type region 3304 with a dose of $10^{15}/cm^2$, and boron ions were implanted in the second conductive type region 3303 with a dose of about $10^{15}/cm^2$.

Figure 99:
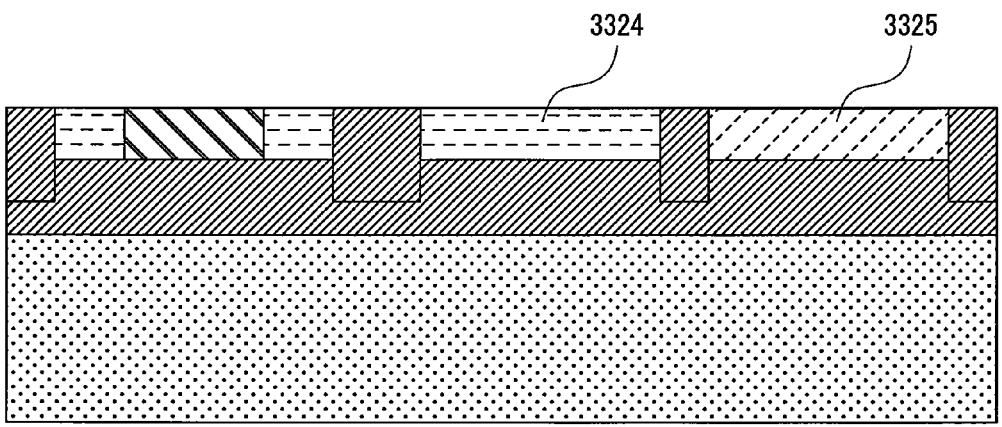

Next, as shown in FIG. 99, a region 3324 used as a base plate for the first conductive type MOSFET is prepared by ion implantation, and a region 3325 used as a base plate for the second conductive type MOSFET is also prepared by ion implantation. To be more specific, phosphor ions were implanted in the base plate area 3324 for the first conductive type MOSFET with a dose of about $10^{13}/cm^2$, and boron ions were implanted in the base plate area 3325 for the second conductive type MOSFET with a dose of about $10^{13}/cm^2$.

Figure 100:
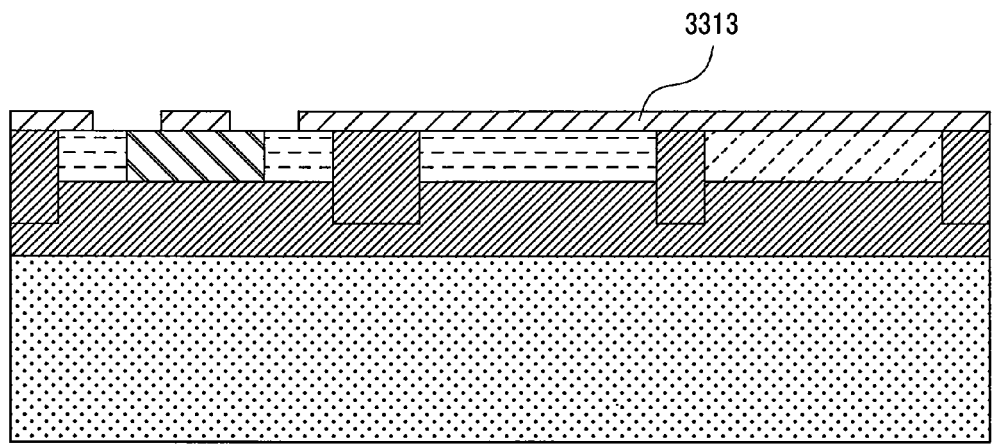
Figure 101:
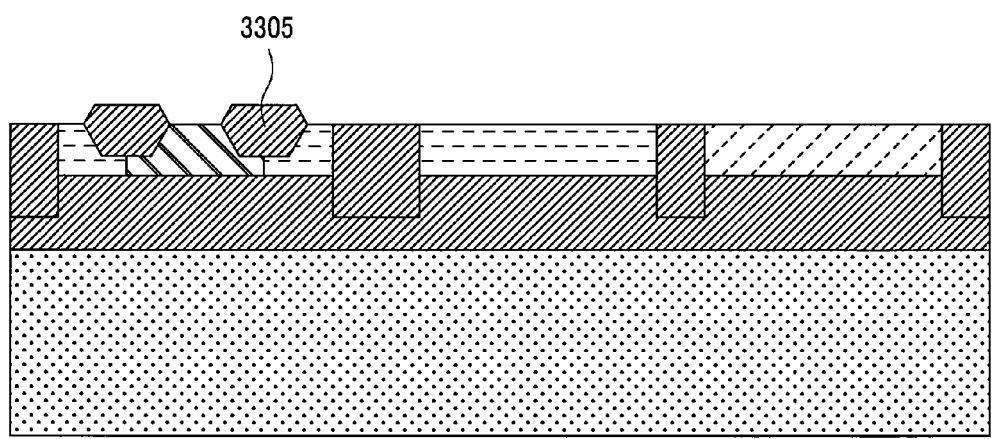
Figure 106:
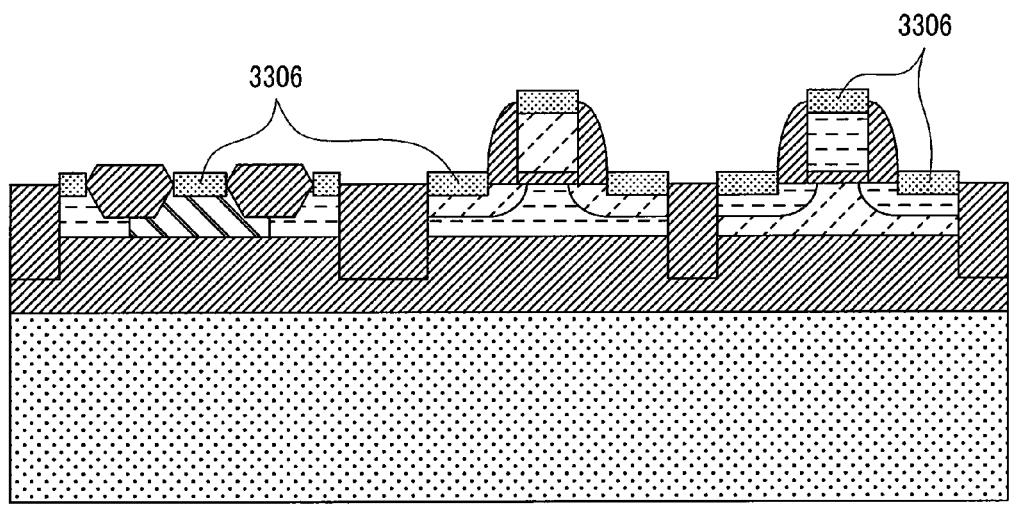

Next, as shown in FIG. 106, silicon oxidation is carried out to reduce the thickness of a silicon film in the proximity of the interface between the first and the third conductive type luminous areas. At this time, only an oxidized area deposits an apertured silicon nitride film 3313 (FIG. 100). It is placed in an oxidation kiln containing hot moisture of about 1000° C. to oxidize the silicon thin film by about 40 nm only. Then, an oxide film with a thickness of about 80 nm grows and a single crystalline silicon region with a thickness of about 10 nm remains (FIG. 101).

Figure 102:
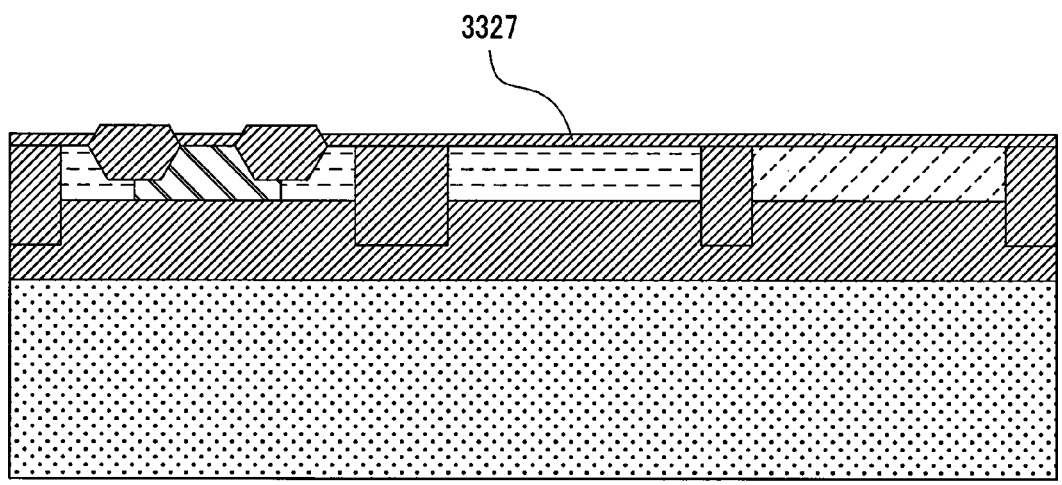

Thereafter, fabrication of MOSFET proceeds. As shown in FIG. 102, a gate oxide film 3327 of MOSFET is grown by silicon oxidation technique of the prior art. Here, the film thickness was set to about 2 nm.

Figure 103:
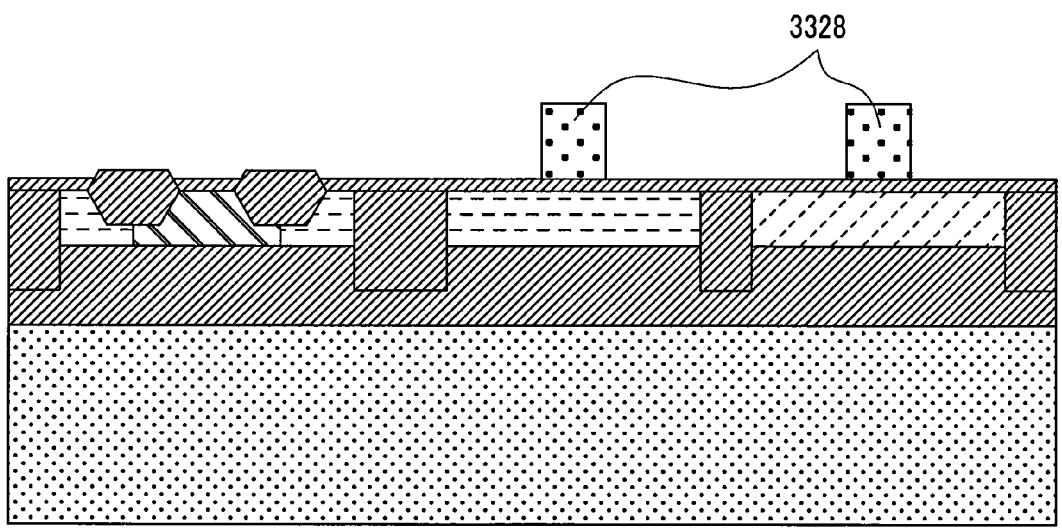

Next, polycrystalline silicon is first deposited to a thickness of about 250 nm on the entire surface of the substrate to form the gate electrode of MOSFET. It is processed in the MOSFET's gate electrode shape 3328 as shown in FIG. 103. The processed size is about 90 nm. At this time, it is important that the processing of the gate electrode stops on a thin gate oxide film (i.e., 2 nm).

Figure 104:
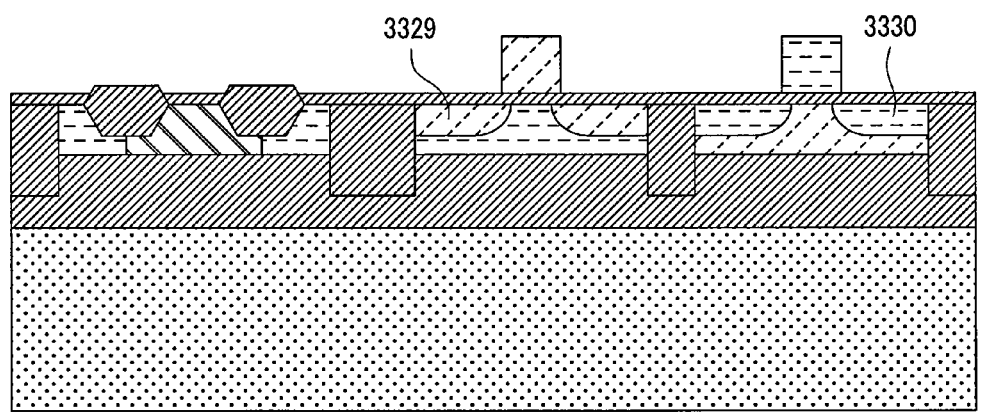

In order to form a diffusion layer functioning as a source drain of MOSFET, impurities of a different conductive type from the substrate are implanted by using each gate electrode 3328 as a mask. In case of the MOSFET at the center of FIG. 104, because the substrate contains phosphor, boron ions are implanted in the diffusion layer in a dose of about $10^{15}/cm^2$. On the other hand, in the case of the MOSFET at the right, because the substrate includes boron, phosphor or arsenic is implanted in the diffusion layer in a dose of about $10^{15}/cm^2$. Each impurity is implanted in the gate electrode, and low resistivity and work function of the gate electrode are determined thereby.

Figure 105:
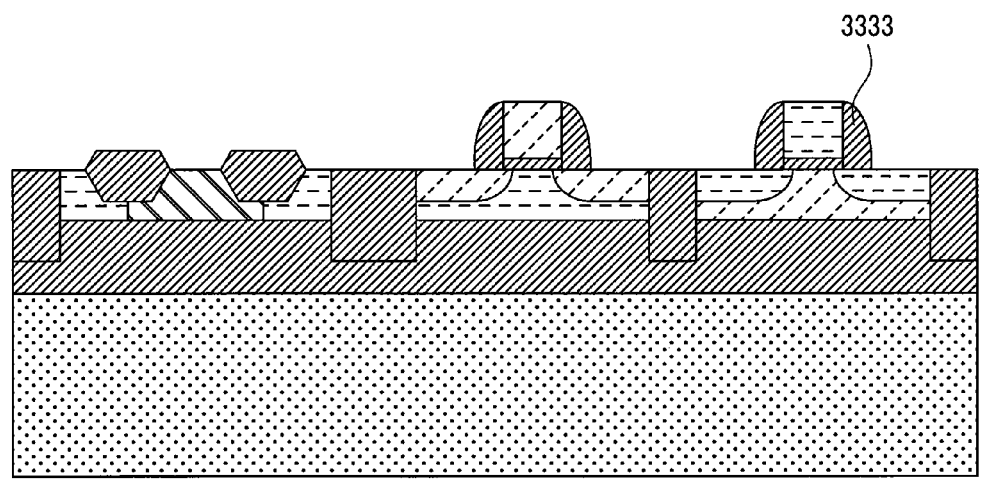

Next, a side wall insulation film is formed only on the side walls of the gate electrode as shown in FIG. 105, as a step prior to silicidation of areas in the diffusion layer, gate electrode and light emitting diode, which the areas are not covered by an oxide film. To this end, a silicon oxide film or a silicon nitride film is first deposited on the entire surface of the substrate by CVD of the prior art. When anisotropic dry etching is carried out, a side wall insulation film 3333 remains only on the side walls of the rectangular gate electrode as shown in FIG. 105.

An exposed silicon surface during the formation of the side wall insulation film is washed, and a 20-30 nm thick metal selected from titan, cobalt, nickel, etc., is deposited thereon. And, a heat treatment at around 450° C. is carried out to cause a reaction between silicon and the metal, thereby producing a metal silicate (silicide) 3306. The silicide is formed only on the exposed silicon surface, and not formed on the side walls of the gate electrode coated with the side wall insulation film 3333, or on the silicon oxide covering a luminous region in a light emitting diode. Therefore, these areas remain in metal state. Because these nonreacted metals are removed by using a hydrogen peroxide containing solution, silicide is eventually formed only on an interface with silicon as shown in FIG. 106. However, because silicide is high in resistance in this case, an additional heating treatment at about 750° C. needs to be performed to lower the resistance of silicide. Accordingly, the resistance of the gate electrode and the resistance of the diffusion layer are lowered, while the MOSFET and the light emitting diode is driven at low voltage.

Figure 107:
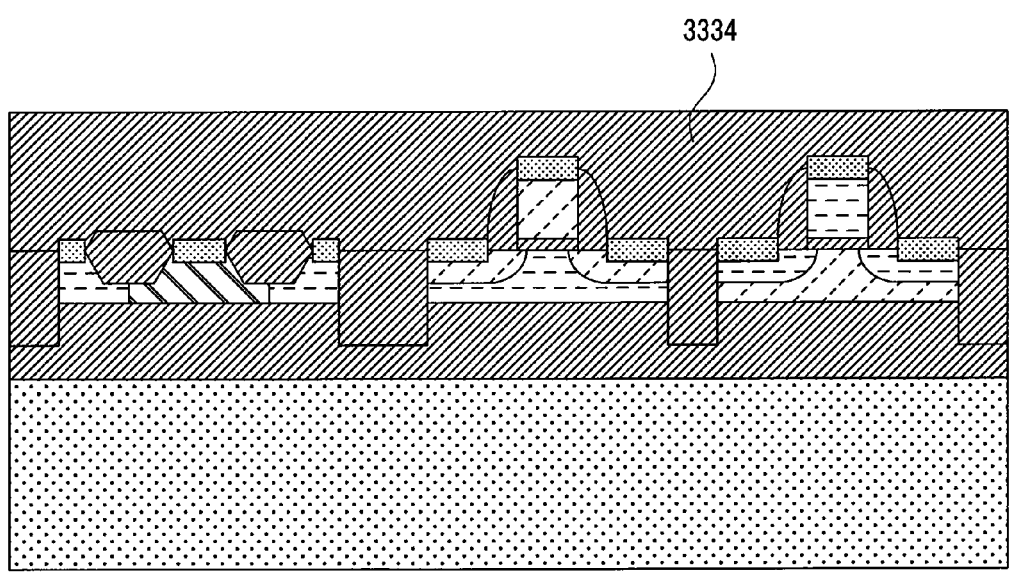

Next, as shown in FIG. 107, an interlayer insulation film 3334 is deposited in a manner that it covers the light emitting diode and the MOSFET. The interlayer insulation film 3334 is then polished and planarized.

Figure 108:
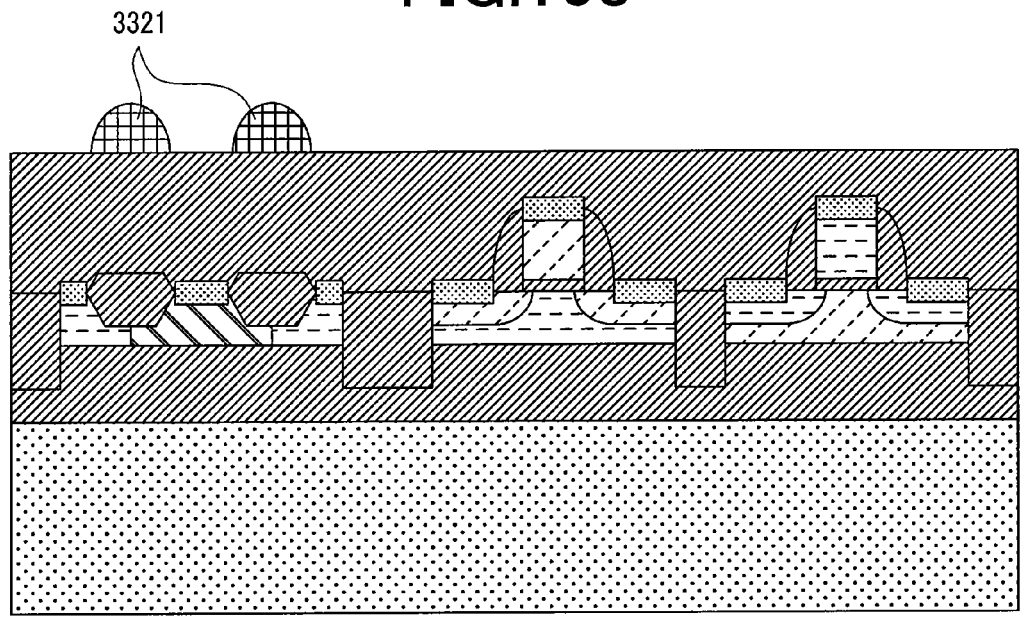
Figure 109:
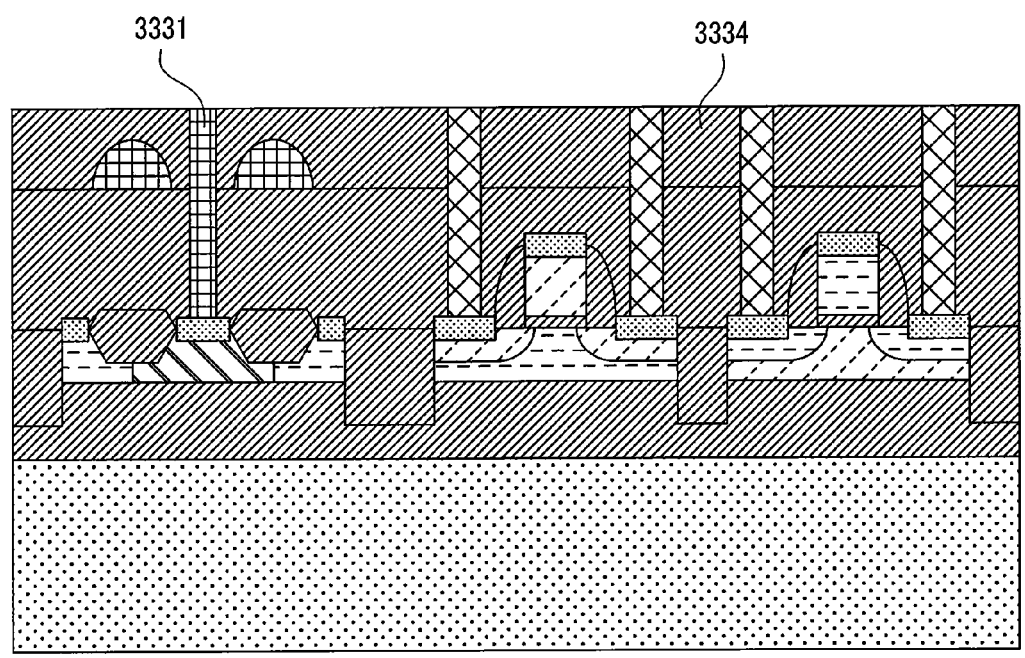

Next, as shown in FIG. 108, an optical waveguide 3321 is fabricated at an upper portion of a luminous region, as explained before. And, the waveguide is covered with an insulation film having a refractive index smaller than the waveguide, and is planarized. After that, as shown in FIG. 109, a wiring, a diffusion layer or a gate electrode of MOSFET, and a metal plug for connecting the silicon region of the limit emitting diode are sequentially formed. The metal plug is formed by perforating a contact hole in the interlayer film, filling the contact hole with metals, and scraping by polishing the metal film adhered onto the surface of the interlayer insulation film.

Figure 110:
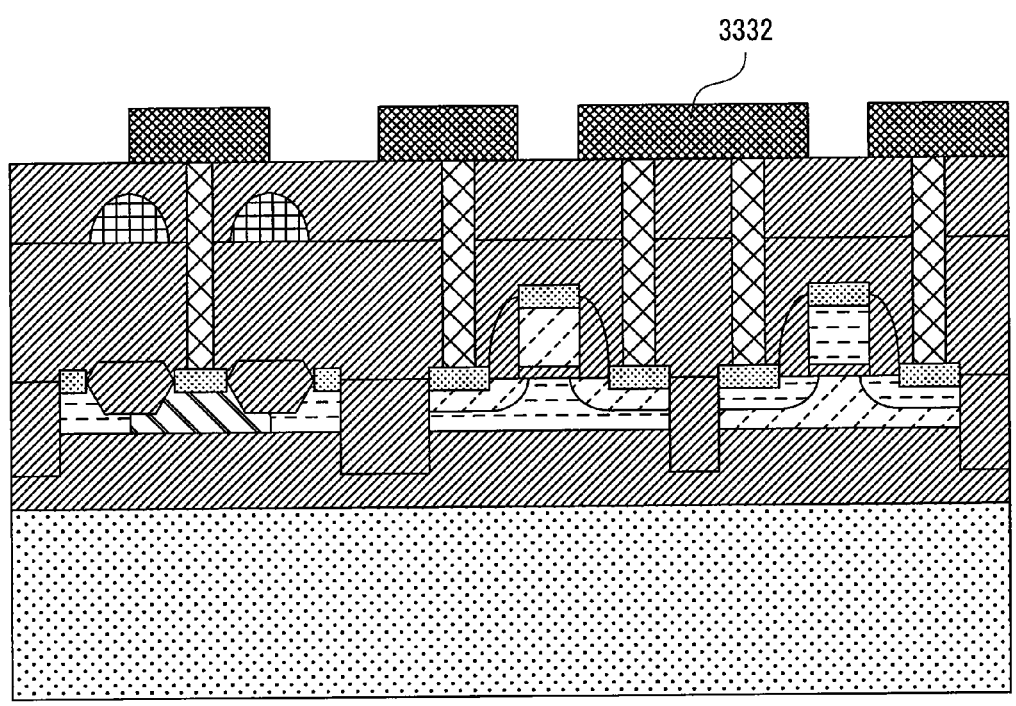
Figure 111:
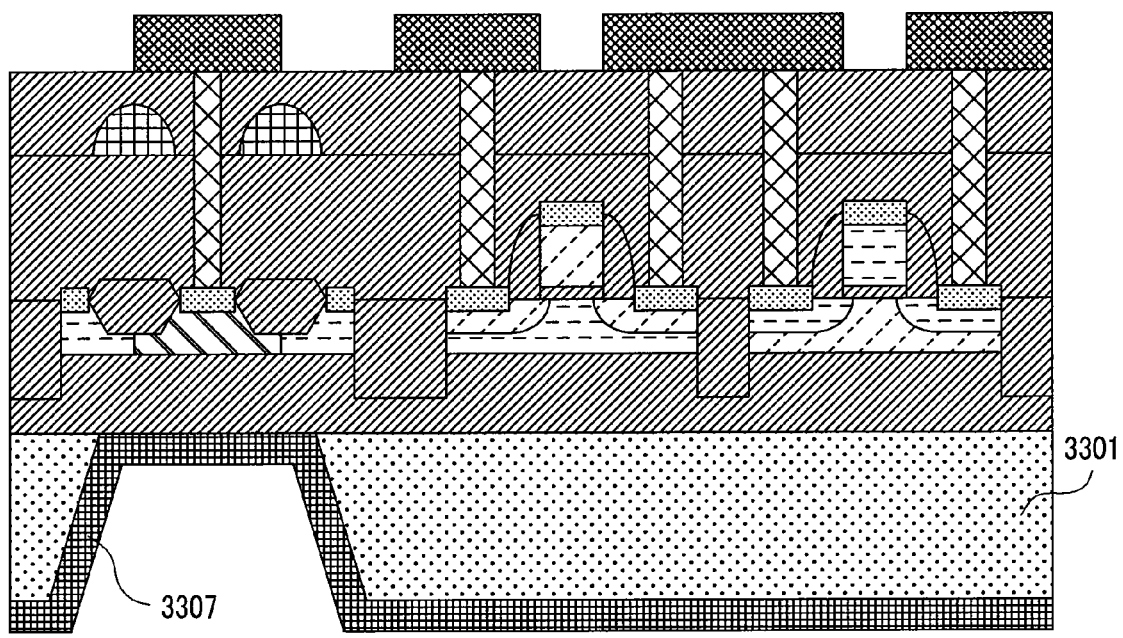

Finally, as shown in FIG. 110, the wiring is performed in use of aluminum for example, and an aperture (or opening) is formed into a support base substrate of the light emitting section as shown in FIG. 111. Next, a metal layer functioning as a light reflection plate is formed to complete the fabrication of an opto-electronic integrated circuit (OEIC).

While the invention has been shown and described with reference to certain preferred embodiments thereof, it will be understood by those skilled in the art that various changes in form and details may be made therein without departing from the spirit and scope of the invention as defined by the appended claims.

What is claimed is:

1. A semiconductor LED, comprising:
   an insulation layer formed on a semiconductor substrate; and
   a first electrode for implanting electrons, a second electrode for implanting holes, and a light emitting section provided on the insulation layer and being placed between the first electrode and the second electrode and electrically connected to the first and the second electrodes, each electrode being formed on the insulation layer,
   wherein the first electrode, the second electrode, and the light emitting section are made of a first single crystalline material, and
   wherein the light emitting section has a first face being perpendicular to a substrate face of the semiconductor substrate and a second face opposite to the first face, and a thickness, between the first and second faces, of 10 nm or less.

2. The semiconductor LED according to claim 1, wherein the light emitting section includes a plurality of light emitting elements.

3. The semiconductor LED according to claim 1, wherein the light emitting section is composed of a thin film that is a Group IV semiconductor.

4. The semiconductor LED according to claim 1, wherein the light emitting section is composed of a thin film that is an indirect transition type semiconductor.

5. The semiconductor LED according to claim 1 further comprising:
   a light receiving element formed on the semiconductor substrate; and
   a waveguide that connects the light emitting section with the light receiving element,
   wherein the waveguide is composed of a silicon nitride film.

6. The semiconductor LED according to claim 1, wherein the light emitting section is covered by an oxide film of the first single crystalline material.

7. The semiconductor LED according to claim 2, wherein the plurality of light emitting elements are covered with a waveguide.

8. The semiconductor LED according to claim 2, wherein the plurality of light emitting elements are spaced so as to enhance light emission.

9. The semiconductor LED according to claim 3, wherein the Group IV semiconductor is silicon and has a surface with a plane orientation (100) or a plane equivalent thereto.

10. The semiconductor LED according to claim 5, wherein the waveguide composed of the silicon nitride film is formed on an upper portion of an interface area between a first semiconductor region and a second semiconductor region, the waveguide having a nearly semicircular cross section and having a nearly hemispherical shape at an end of the waveguide near the light emitting section and the light receiving element.

11. The semiconductor LED according to claim 7, wherein the waveguide is formed of a silicon nitride film.

12. The semiconductor LED according to claim 8, wherein the plurality of light emitting elements are spaced from each other on an interval of a half wavelength of an emitted light wavelength of the light emitting elements.

13. The semiconductor LED according to claim 11, wherein the waveguide is covered with a material having a refractive index relatively lower than that of a material composing the waveguide.

* * * * *